(12) United States Patent
Dutta et al.

(10) Patent No.: US 6,613,162 B1
(45) Date of Patent: Sep. 2, 2003

(54) MULTICOMPONENT HOMOGENEOUS ALLOYS AND METHOD FOR MAKING SAME

(75) Inventors: Partha S. Dutta, Troy, NY (US); Thomas R. Miller, Schenectady, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/696,626

(22) Filed: Oct. 25, 2000

Related U.S. Application Data

(60) Provisional application No. 60/161,422, filed on Oct. 25, 1999.

(51) Int. Cl.⁷ .................................................. C30B 29/40
(52) U.S. Cl. ........................ 148/512; 148/562; 117/81; 117/82; 117/953; 117/954
(58) Field of Search .................................. 148/512, 537, 148/562; 117/81, 82, 83, 953–958

(56) References Cited

U.S. PATENT DOCUMENTS

| | | | |
|---|---|---|---|
| 3,982,261 A | * | 9/1976 | Antypas ........................ 372/44 |
| 4,532,001 A | * | 7/1985 | Benchimol et al. ........... 117/63 |
| 4,728,388 A | * | 3/1988 | Fillot et al. .................... 117/42 |
| 4,775,639 A | * | 10/1988 | Yoshida ........................ 438/94 |
| 5,047,112 A | | 9/1991 | Ciszek |
| 5,064,780 A | * | 11/1991 | Grijol et al. ................... 117/56 |
| 5,399,503 A | * | 3/1995 | Saito et al. ................... 438/479 |
| 6,273,969 B1 | * | 8/2001 | Dutta et al. .................. 148/404 |

OTHER PUBLICATIONS

Redlich et al., "Algebriac Representation of Thermodynamic Properties and the Classification of Solutions," *Ind. Eng. Chem.*, 40:345–348 (1948).

Panish et al., "Ga–Al–As:Phase, Thermodynamic and Optical Properties," *J. Phys. Chem. Solids*, 30:129–137 (1969).

Stringfellow et al., "Calculation of III–V Ternary Phase Diagrams: IN–Ga–As and In–As–Sb," *J. Phys. Chem. Solids*, 30:1779–1791 (1969).

Stringfellow, "Calculation of Ternary and Quaternary III–V Phase Diagrams," *J. Cryst. Growth*, 27:21–34 (1974).

(List continued on next page.)

*Primary Examiner*—George Wyszomierski
(74) *Attorney, Agent, or Firm*—Braman & Rogalskyj, LLP

(57) ABSTRACT

The present application discloses a method for preparing a homogeneous ternary or quaternary alloy from a quaternary melt. The method includes providing a family of phase diagrams for the quaternary melt which shows (i) composition/temperature data, (ii) tie lines connecting equilibrium liquid and solid compositions, and (iii) isotherms representing boundaries of a miscibility gap. Based on the family of phase diagrams, a quaternary melt composition and an alloy growth temperature is selected. A quaternary melt having the selected quaternary melt composition is provided and a ternary or quaternary alloy is grown from the quaternary melt at the selected alloy growth temperature. A method for making homogeneous ternary or quaternary alloy from a ternary or quaternary melt is also disclosed, as are homogeneous quaternary single-crystal alloys which are substantially free from crystal defects and which have the formula $A_xB_{1-x}C_yD_{1-y}$, x and y being the same or different and in the range of 0.001 to 0.999.

7 Claims, 91 Drawing Sheets

OTHER PUBLICATIONS

Nakajima et al., "The Pseudoquaternary Phase Diagram of the Ga–In–As–Sb System," *J. Cryst. Growth*, 41:87–92 (1977).

Bachmann et al., "Melt and Solution Growth of Bulk Single Crystals of Quarternary III–V Alloys," *Progress in Crystal Growth and Characterization*, 2(3):171–206 (1979).

Stringfellow, "Miscibility Gaps in Quaternary III/V Alloys," *J. Cryst. Growth*, 58:194–202 (1982).

Bonner et al., "Bulk Single Crystal Ga(1–x)InxAs: LEC Growth and Characterization," *Inst. Phys. Conf. Ser. No. 96: Chapter 5*, pp. 337–342 (1989).

Ostrogorsky, Numerical Simulation of Single Crystal Grown by Submerged Heater Method, *J. Cryst. Growth*, 104:233–238 (1990).

Nakajima et al., "Constant Temperature Growth of Uniform– Composition InxGa1–xAs Bulk Crystals by Supplying GaAs," *Inst. Phys. Conf. Ser. No. 120: Chapter 2*, pp. 67–71 (1992).

Kusunoki et al., "Constant Temperature LEC Growth of Uniform– Composition InGaAs Bulk Crystals Through Continuous Supply of GaAs," *Inst. Phys. Conf. Ser. No. 129: Chapter 2*, pp. 37–42 (1993).

Ansara et al., "A Binary Database for III–V Compound Semiconductors," *Calphad*, 18(2):177–222 (1994).

Tanaka et al., "The Solute–Feeding Czochralski Method for Homogeneous GaInSb Bulk Alloy Pulling," *J. Cryst. Growth*, 135:269–272 (1994).

Jianrong et al., "An Assessment of Phase Diagram and Thermodynamic Properties of the Gallium–Indium–Antimony System," *Calphad*, 18(2):165–175 (1994).

Ashley et al., "The Growth of Ternary Substrates of Indium Gallium Antimonide by the Double Crucible Czochralski Technique," *Inst. Phys. Conf. Ser. No. 144: Section 4*, pp. 209–213 (1995).

Suzuki et al., "Multicomponent Zone Melting Growth of Ternary InGaAs Bulk Crystal," *Journal of Electronic Materials*, 25(3):357–361 (1996).

Dutta et al., "The Physics and Technologyof Gallium Antimonide: An Emerging Optoelectronic Material," *J. Appl. Phys.* 81(9):5821–5870 (1997).

Nakajima et al., "Bridgman Growth of Compositionally Graded InxGa1–aAs (x=0.05–0.30) Single Crystals For Use As Seeds for In0.25Ga0.75As Crystal Growth," *J. Cryst. Growth*, 173:42–50 (1997).

Tao et al., "Segregation Reduction in Vertical Bridgman Crystal Growth of CdZnTe," *J. Cryst. Growth*, 181:301–303 (1997).

Dutta et al., "Suppression of Cracks in InxGa1–xSb Crystals Through Forced Convection in the Melt," *J. Cryst. Growth*, 194:1–7 (1998).

Tanaka et al., "Control of GaInSb Alloy Composition Grown From Ternary Solution," *J. Cryst. Growth*, 186:305–308 (1998).

Charache et al., "InGaAsSb Thermophotovoltaic Diode: Physics Evaluation" *J. Appl. Phys.*, 85(4):2247–2252 (1999).

Dutta et al., "Melt Growth of Quasi–Binary (GaSb)1–x(InAs)x Crystals," *J. Cryst. Growth*, 198/199:384–389 (1999).

Miotkowski et al., "Lattice Parameters and Optical Characterization of Cd1–xMgxSe Alloys Grown by Vertical Gradient Freezing Technique" *J. Cryst. Growth*, 203:51–60 (1999).

Nishijima et al., "InGaAs Single Crystal Using a GaAs Seed Grown With the Vertical Gradient Freeze Technique," *J. Cryst. Growth*, 197:769–776 (1999).

Hashio et al., "Directional Solidification of InxGa1–xAs," *J. Cryst. Growth*, 210:471–477 (2000).

Kodama et al., "Single Crystalline Bulk Growth of In0.3Ga0.7As on GaAs Seed Using the Multi–Component Zone Melting Method," *J. Cryst. Growth*, 208:165–170 (2000).

Nishijima et al., "InGaAs Single Crystal With a Uniform Composition in the Growth Direction Grown on an InGaAs Seed Using the Multicomponent Zone Growth Method," *J. Cryst. Growth*, 208:171–178 (2000).

Tanaka et al., "Multi–Step Pulling of GaInSb Bulk Crystal From Ternary Solution," *J. Cryst. Growth*, 209:625–629 (2000).

* cited by examiner

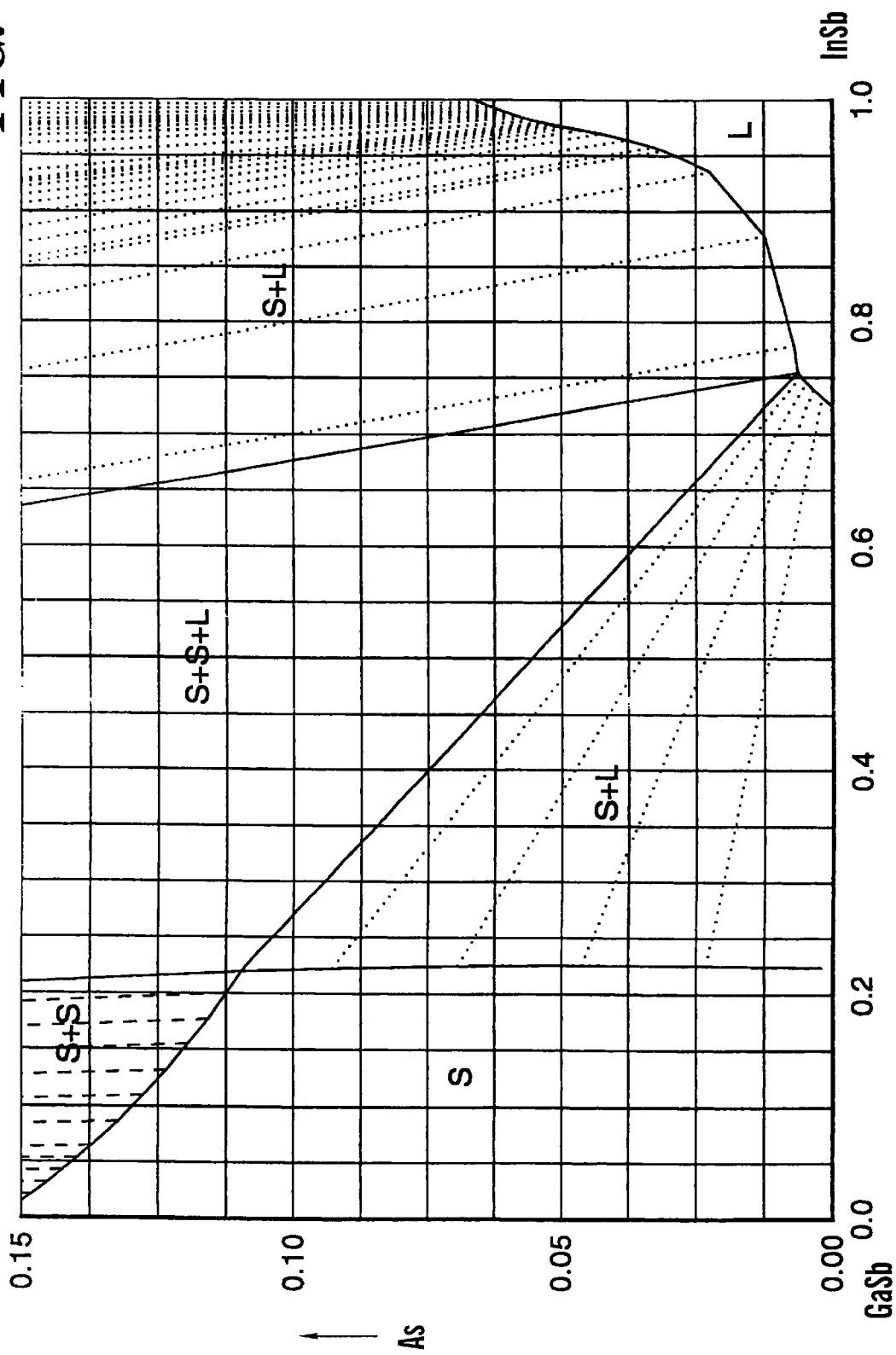

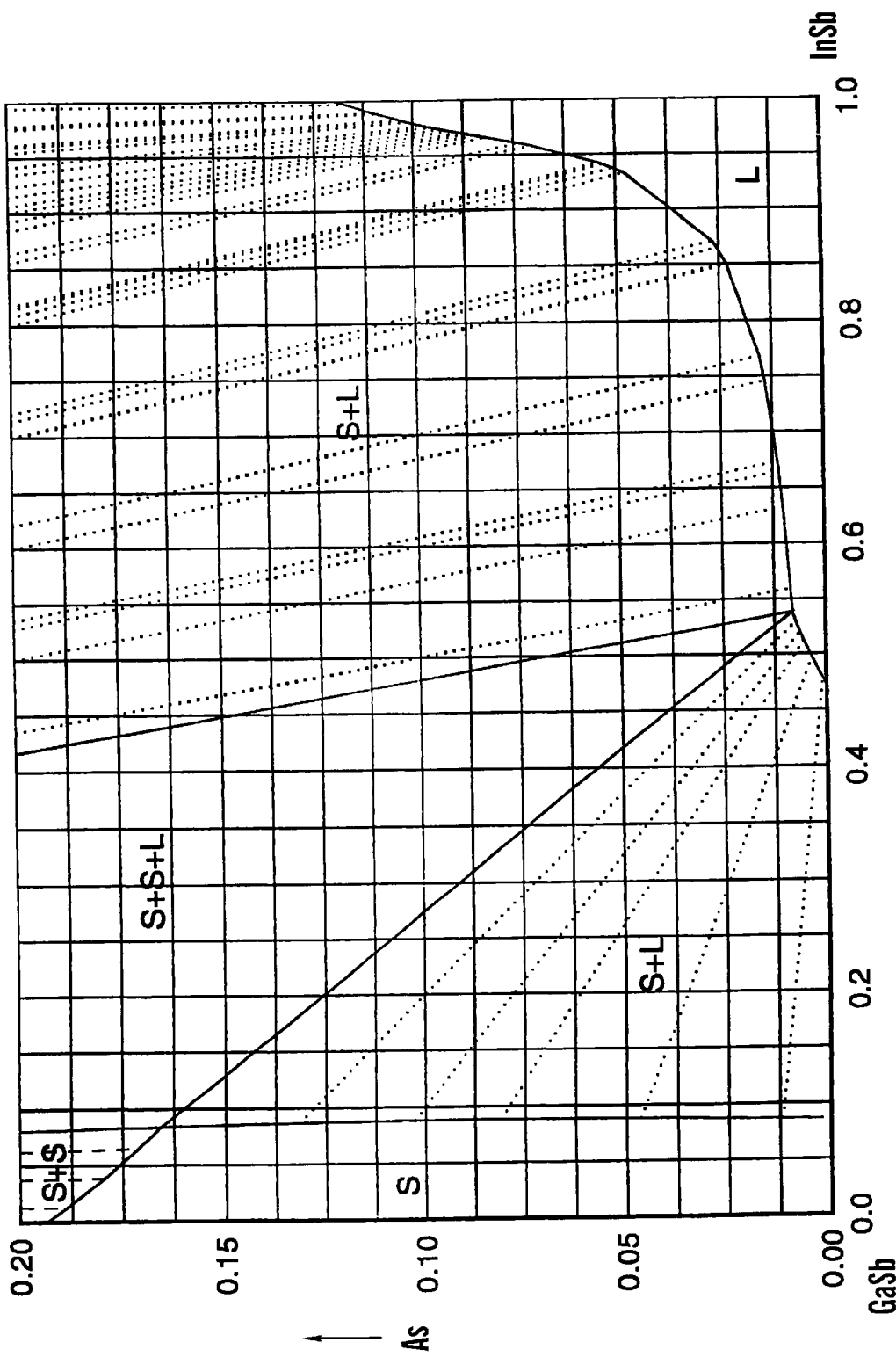

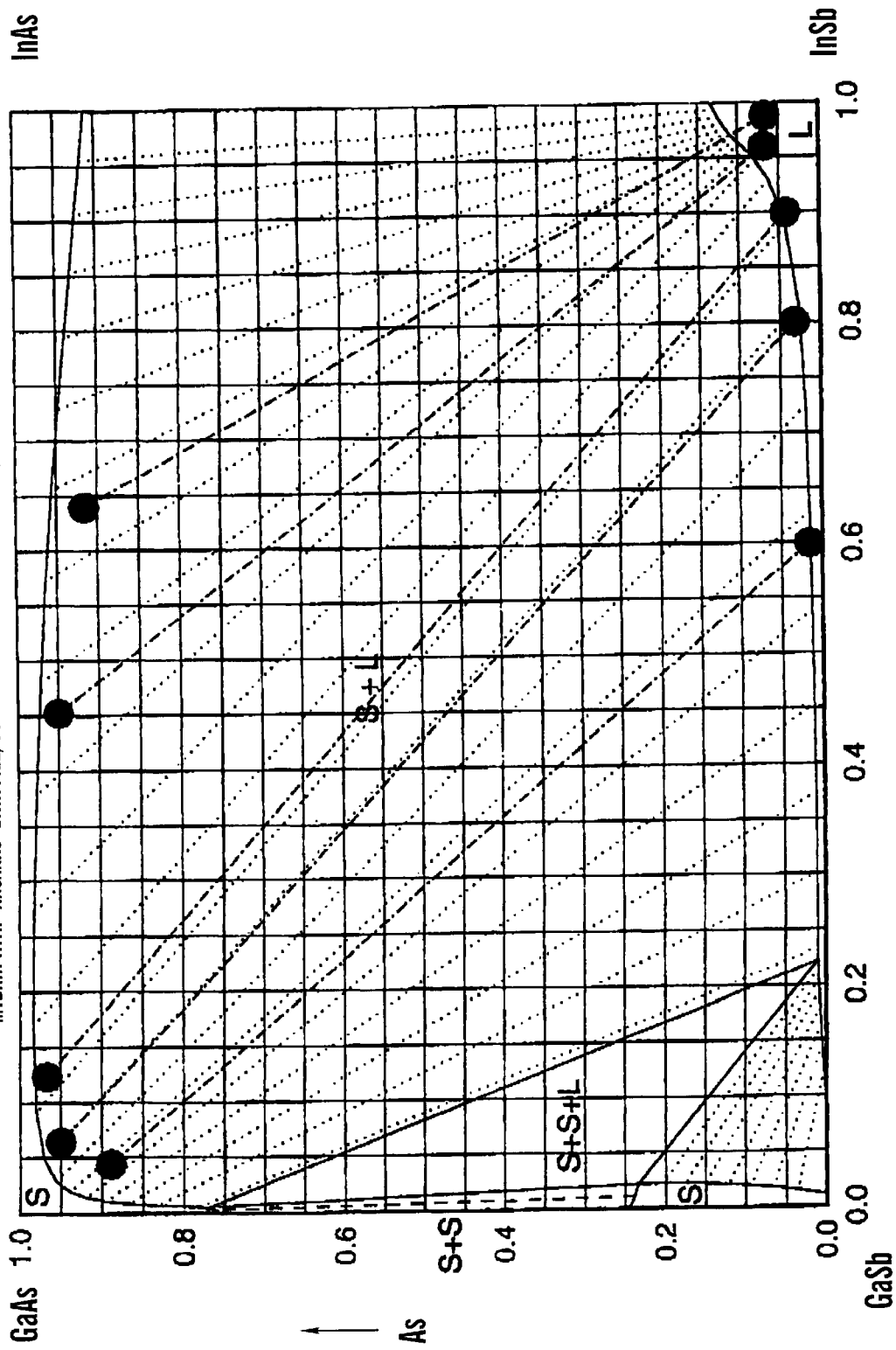

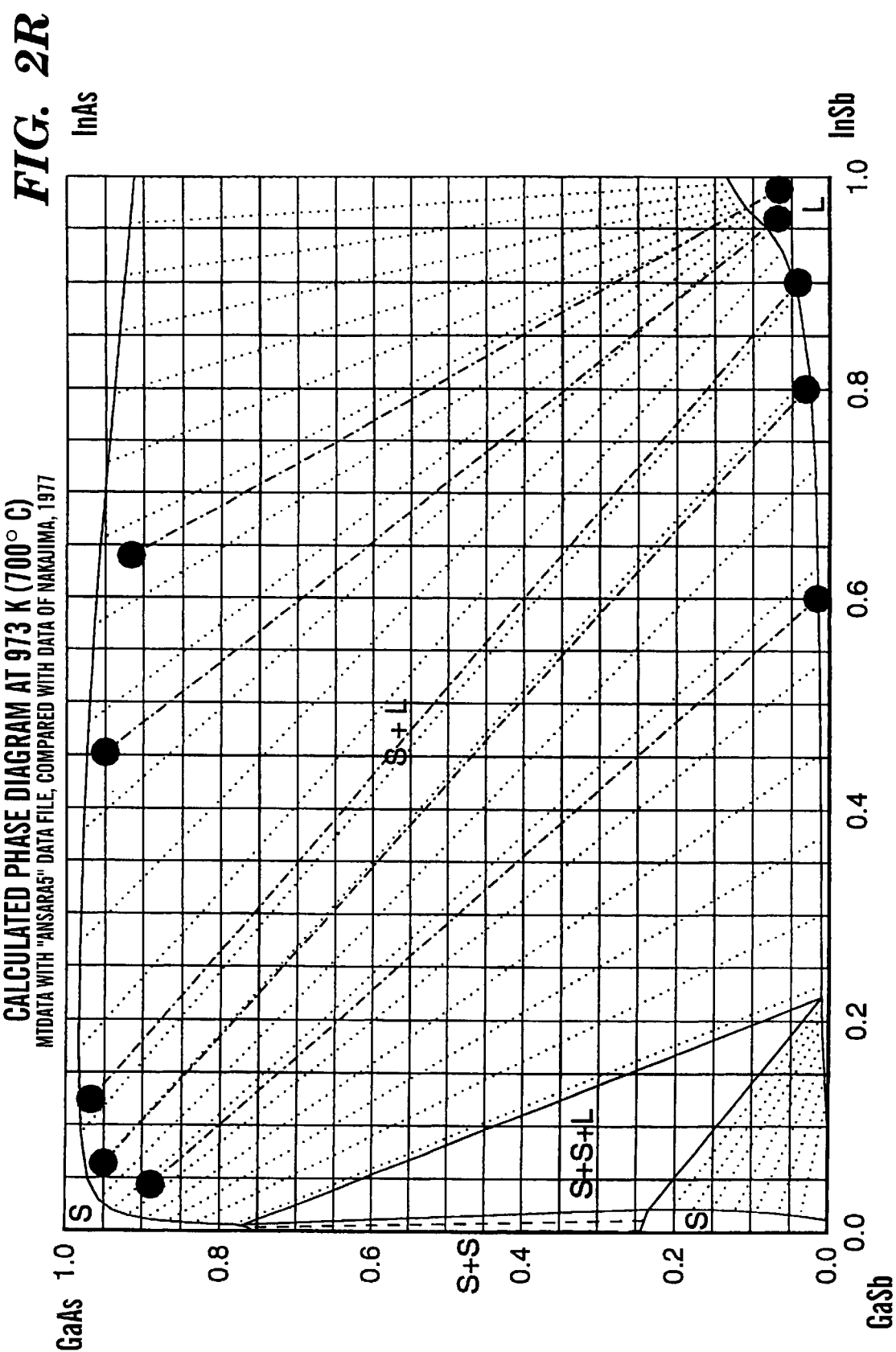

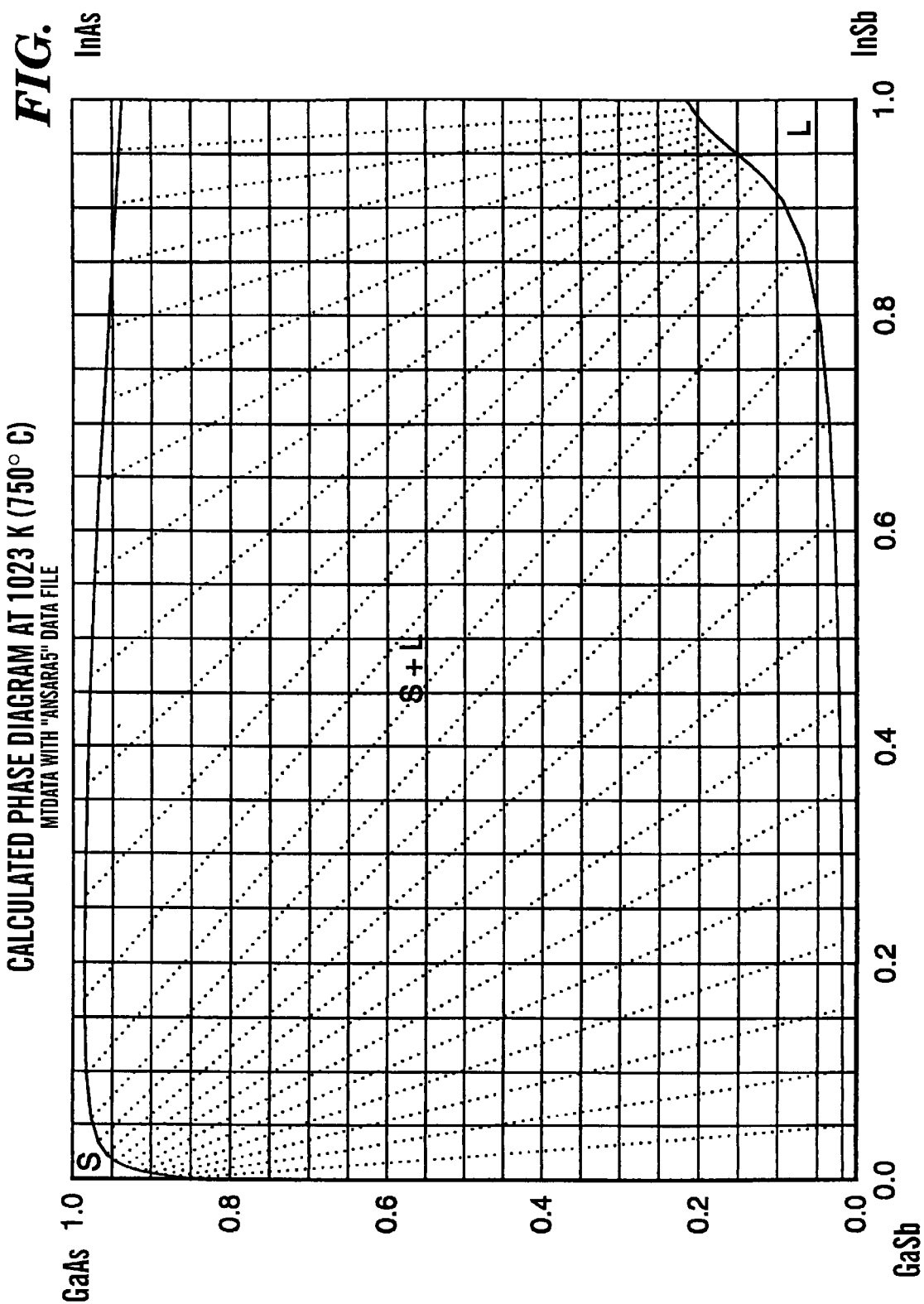

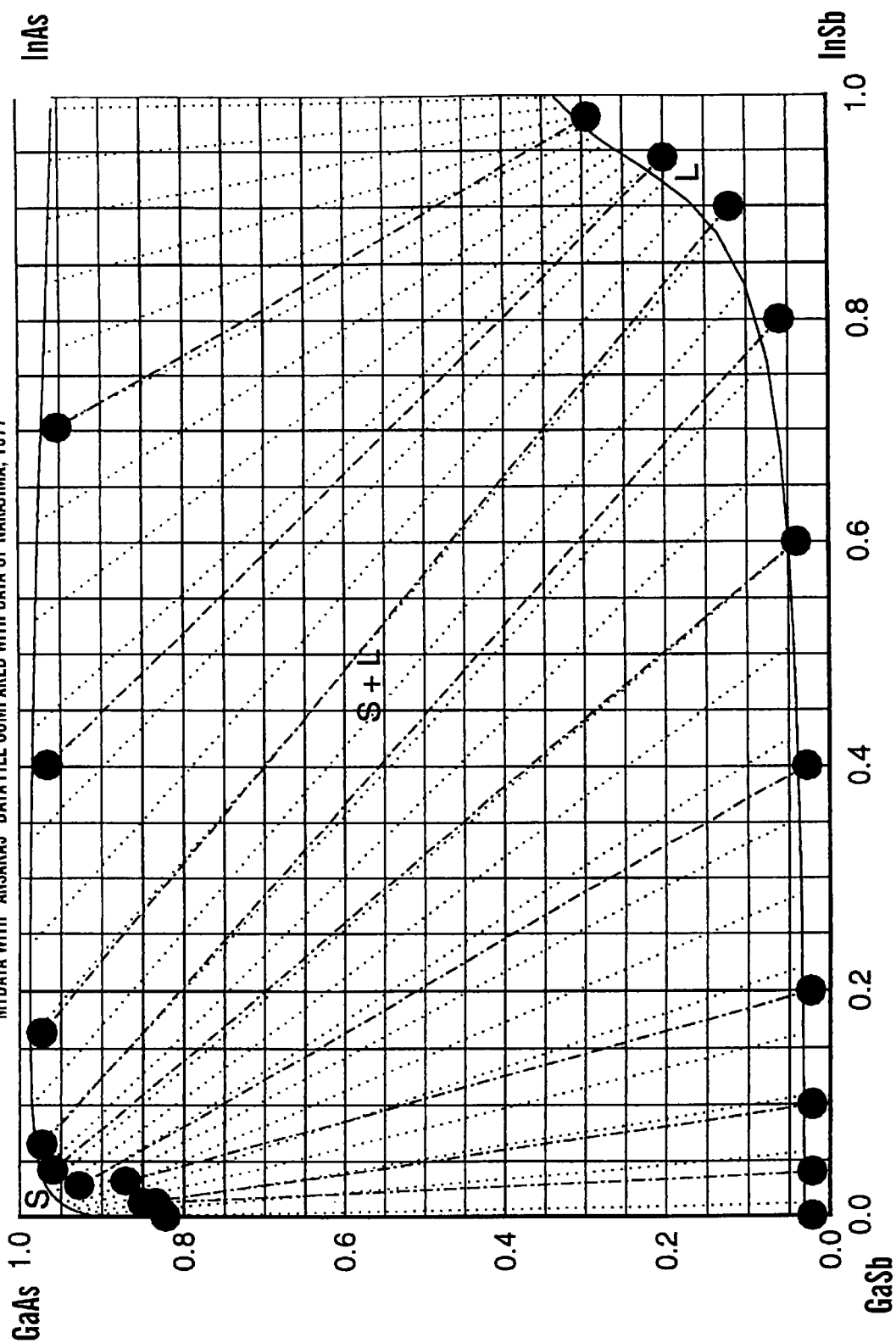

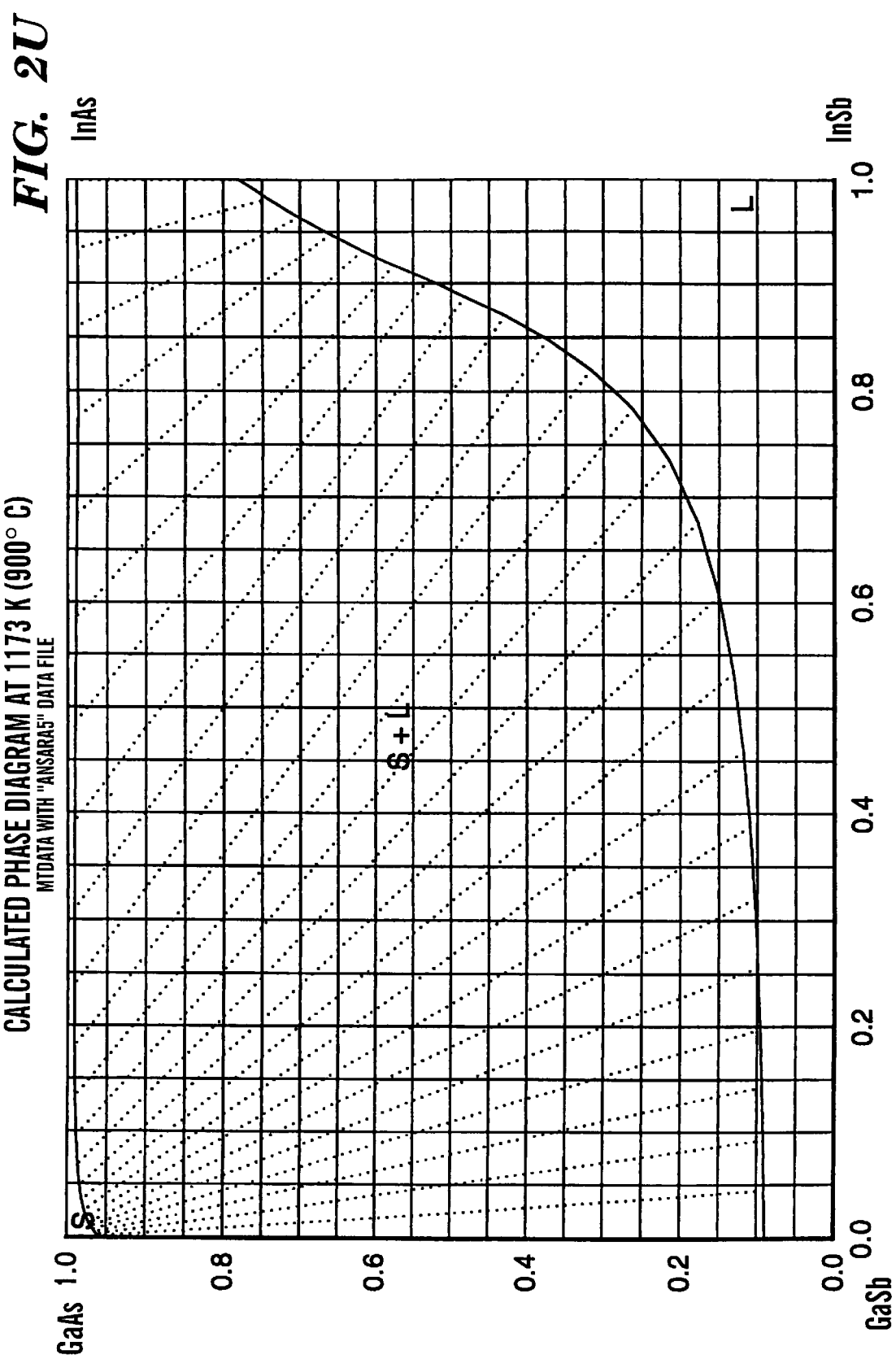

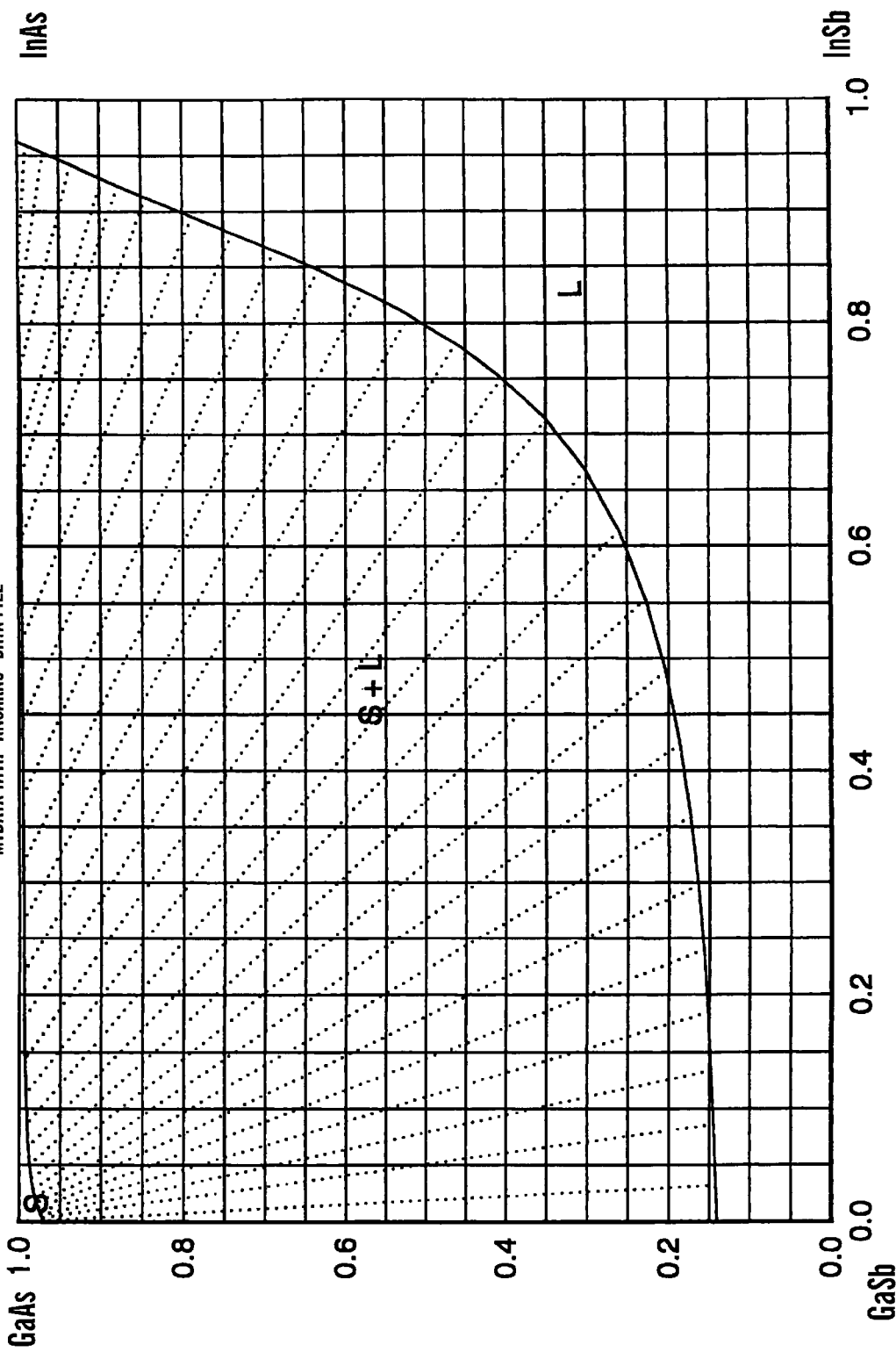

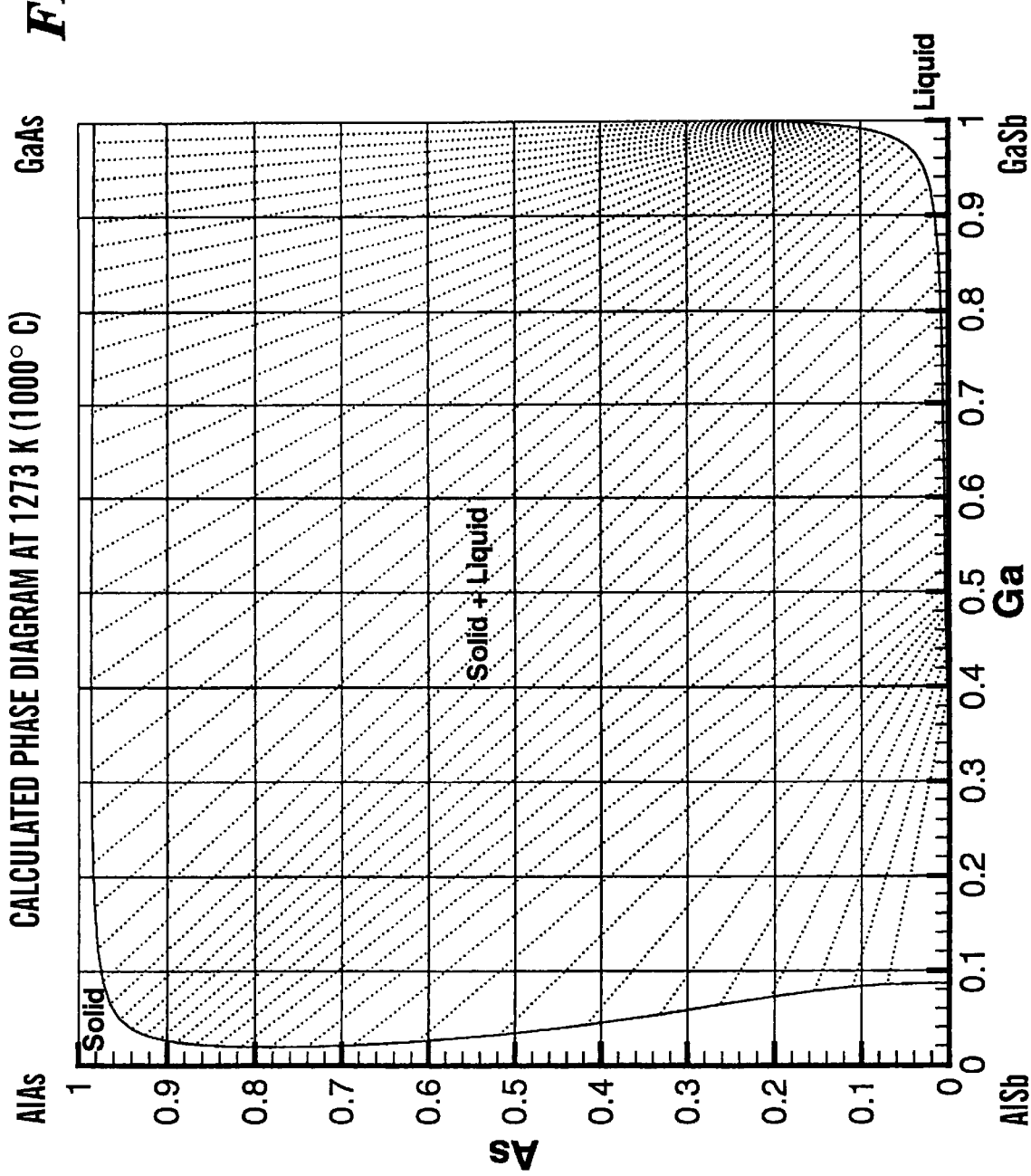

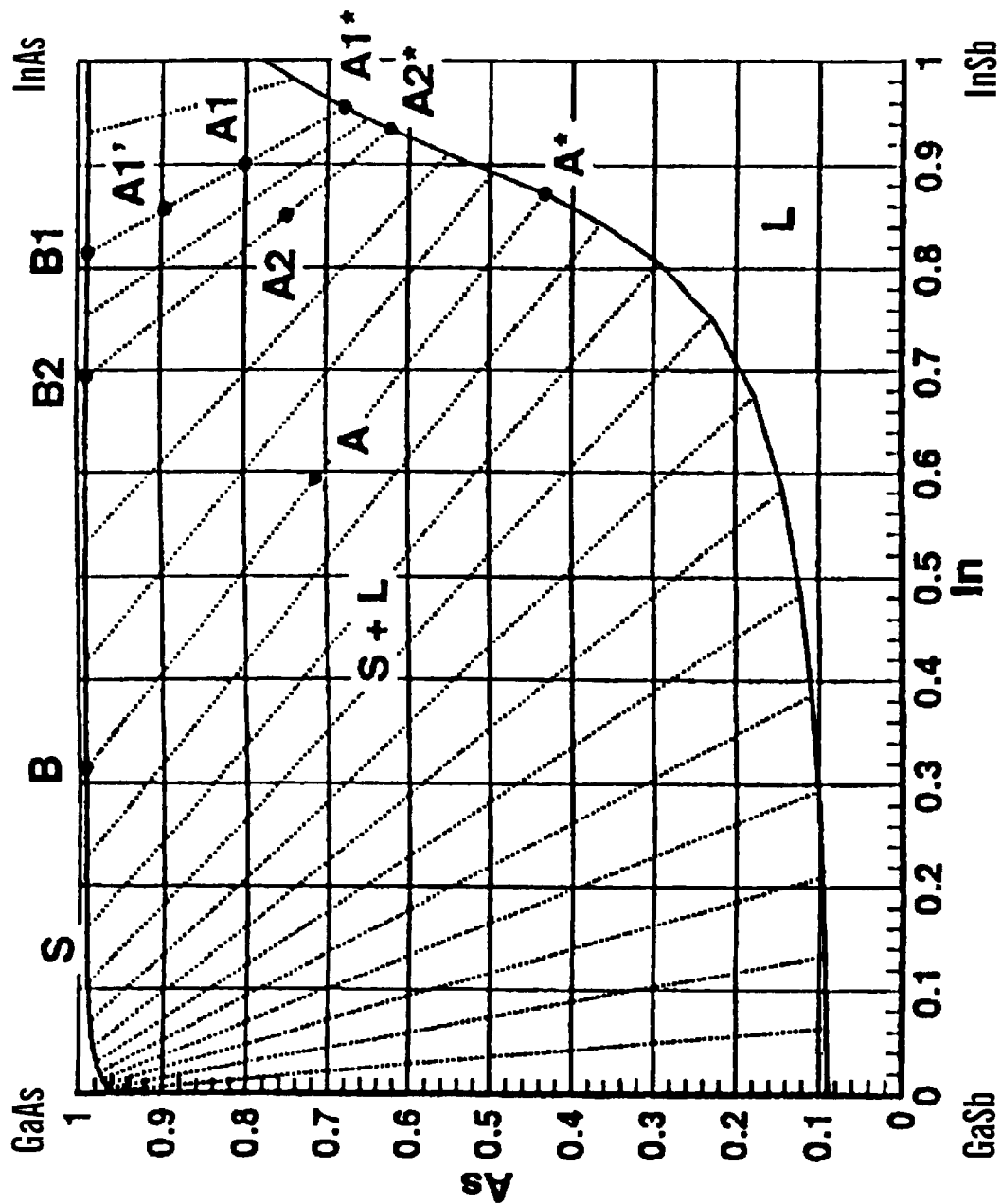

"BENT CLIP"

"POROUS BASKET"

"CANDY STICK"

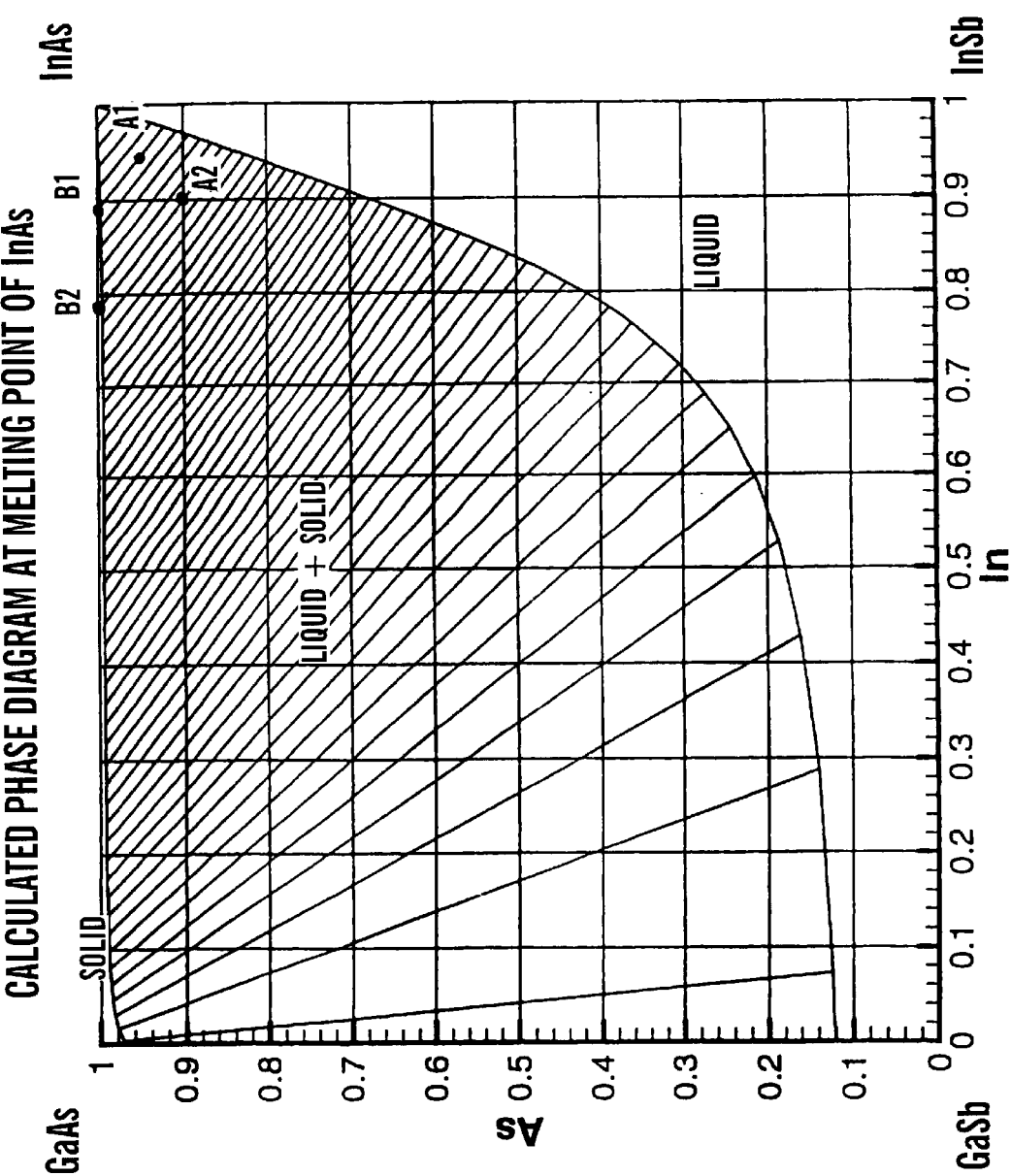

MULTICOMPONENT HOMOGENEOUS ALLOYS AND METHOD FOR MAKING SAME

The present invention claims the benefit of U.S. Provisional Patent Application Serial No. 60/161,422, filed Oct. 25, 1999, which is hereby incorporated by reference.

The present invention was made with the support of the Department of Energy Grant No. DE-AC12-76SN3052. The Federal Government may have certain rights in this invention.

FIELD OF THE INVENTION

The subject invention relates, generally, to alloys and, more particularly, to ternary and quaternary homogeneous alloys and to methods for making such alloys.

BACKGROUND OF THE INVENTION

III–V and II–VI compound semiconductors with variable band gaps ($E_g$) and lattice constants are needed for numerous electronic and optoelectronic applications, including: light emitting diodes, laser diodes, photodetectors, solar and photovoltaic cells, high speed switches, and the like. Directional solidification from the melt is by far the fastest, cheapest, most reliable, and, therefore, the preferred method for producing large scale, device grade, single crystal substrates. Unfortunately, only binary compounds (like GaAs, GaSb, and InP) have been successfully produced in large quantities from melts having discrete energy band gaps and lattice constants. In principle, the band gap and the lattice constant can be tuned in ternary, quaternary, or higher order systems by adjusting the composition of the substitutional cations and anions. However, in practice melt-grown ternary and higher order compounds are compositionally inhomogeneous (see, e.g., Bachmann et al., "Melt and Solution Growth of Bulk Single Crystals of Quaternary III–V Alloys", *Progress in Crystal Growth and Characterization*, 2(3):171–206 (1979) ("Bachmann")) and exhibit high density of defects, such as cracks, inclusions, precipitates, dendrites, and dislocations. These defects are due to several reasons, including: large lattice mismatch between the constituent binaries, wide separation between the liquidus and solidus curves in the pseudo-binary phase diagrams, differences in thermal expansion coefficients of the binary compounds, and miscibility gaps. Attempts to grow uniform crystals via external solute feeding of the depleted components, for example, by the method described U.S. Pat. No. 5,047,112 to Ciszek, have not been successful, especially for concentrated alloy compositions, primarily due to large temperature differences between the solidus and liquidus curves. Likewise, attempts to employ methods used to produce uniformly doped binary materials, such as those described in Ostrogorsky, "Numerical Simulation of Single Crystal Grown by Submerged Heater Method," *J. Crystal Growth*, 104:233–238 (1990) and U.S. Pat. No. 5,047,113 to Ostrogorsky to grow ternary or quaternary alloys have proved unsuccessful. Moreover, post growth treatments, like zone leveling or prolonged annealing of the solidified ingot, have not been effective in eliminating these extended defects see, e.g., Bachmann). Enhanced mixing in the melt near the solid-liquid interface during crystal growth helps in reducing cracks, but the axial segregation still persists (see, Dutta et al., "Suppression of Cracks in $In_xGa_{1-x}Sb$ Crystals through Forced Convection in the Melt", *Journal of Crystal Growth*, 194:1–7 (1998) ("Dutta").

Ternary and quaternary semiconductor materials are currently produced in the form of thin layers by non-equilibrium growth techniques (from diluted solutions and vapor phase) on binary substrates using buffer layers to relieve misfit related stresses at the epilayer-substrate interface. One disadvantage of epitaxial technology is its high cost. In addition, the buffer layer technology is not optimized for all systems, and, often devices exhibit large leakage currents due to poor interfacial regions.

From extensive experimental work, it has become clear that a high quality substrate is needed to obtain high-performance reliable devices. Substrates with tunable band gap and lattice constants would open up numerous possibilities of interesting band gap engineering in homo- and hetero-epitaxial devices and would significantly simplify the fabrication cycle. Hence, the overall cost of the final device would be reduced significantly. In addition, substrates with tunable band gap and lattice constants would facilitate the production of device structures and designs that have not been possible heretofore. The present invention is directed to meeting this need.

SUMMARY OF THE INVENTION

The present invention relates to a method for preparing a homogeneous ternary or quaternary alloy from a quaternary melt. The method includes providing a family of phase diagrams for the quaternary melt which shows (i) composition/temperature data, (ii) tie lines connecting equilibrium liquid and solid compositions, and (iii) isotherms representing boundaries of a miscibility gap. Based on the family of phase diagrams, a quaternary melt composition and an alloy growth temperature is selected. A quaternary melt having the selected quaternary melt composition is provided, and a ternary or quaternary alloy is grown from the quaternary melt at the selected alloy growth temperature.

The present invention also relates to another method for preparing a homogeneous ternary or quaternary alloy from a ternary or quaternary melt. The method includes providing ternary or quaternary melt having a ternary or quaternary melt composition which includes at least three or four melt elements. The ternary or quaternary melt is in solution equilibrium with a solid binary material. The solid binary material has a melting temperature greater than that of the ternary or quaternary alloy's solidus temperature, and the solid binary material includes two of the at least three or four melt elements. The method further includes heating the ternary or quaternary melt to the ternary or quaternary alloy's solidus temperature, and agitating the ternary or quaternary melt mechanically under conditions effective to maintain a solution equilibrium between the solid binary material and the ternary or quaternary melt. The ternary or quaternary melt is directionally cooled to grow the ternary or quaternary alloy. As a result, the ternary or quaternary melt becomes depleted in the two elements of the solid binary material, and a portion of the solid binary material dissolves into the ternary or quaternary melt to replenish these depleted two elements.

The present invention also relates to a homogeneous quaternary single-crystal alloy having the formula $A_xB_{1-x}C_yD_{1-y}$, x and y being the same or different and in the range of 0.001 to 0.999. The alloy is substantially free from crystal defects.

BRIEF DESCRIPTION OF THE DRAWINGS

FIGS. 5A, 5B, 5C, and 5D are calculated phase diagrams of the Ga—In—As—Sb system at 900° C., 800° C., 700° C. and 600° C., respectively, and show a comparison of these data with experimental data of Nakajima et al., "The Pseudoquaternary Phase Diagram of the Ga—In—As—Sb System," *J. Cryst Growth*, 41:87–92 (1977), which is hereby incorporated by reference.

DETAILED DESCRIPTION OF THE INVENTION

Figure 1A:
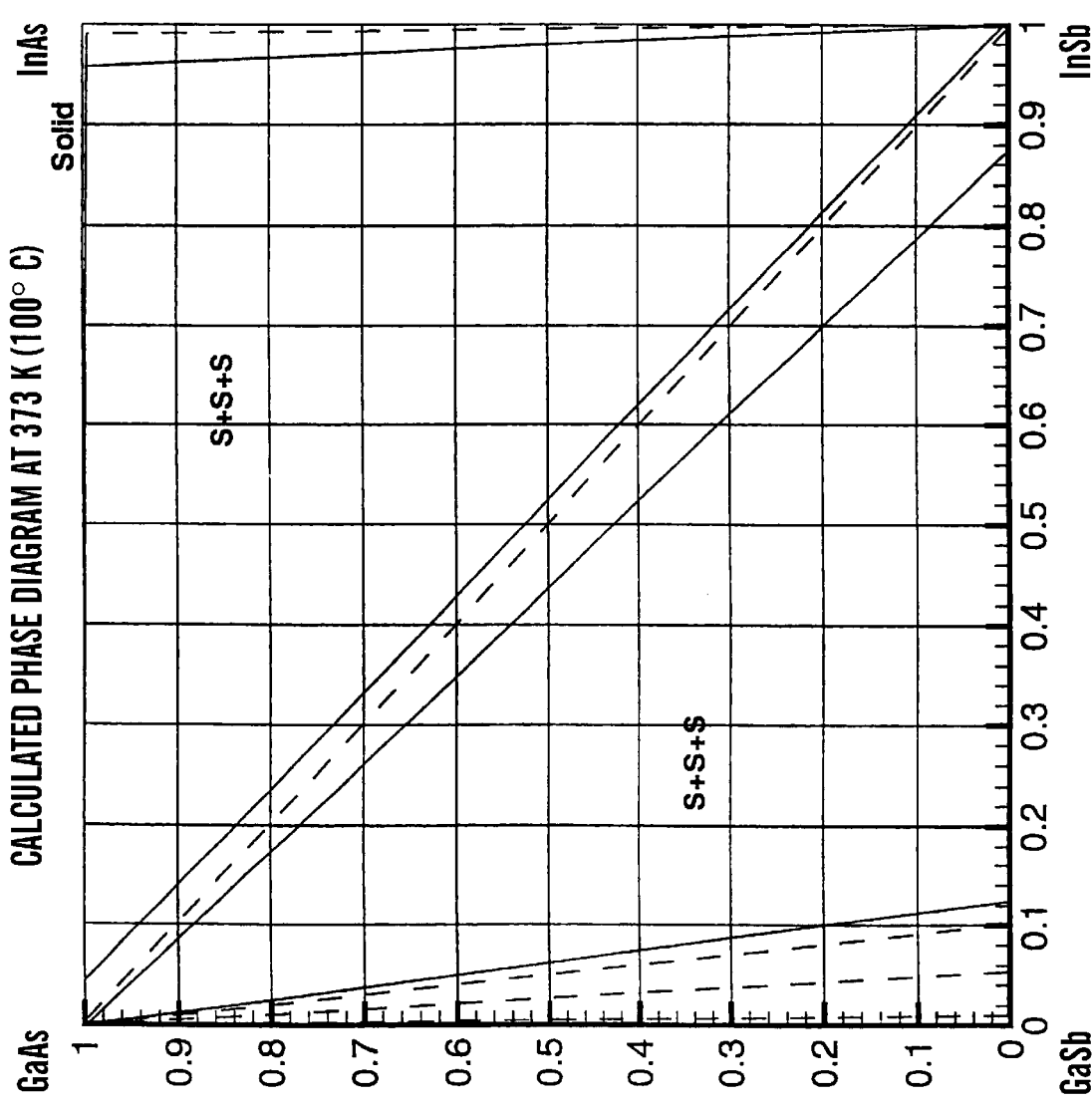
FIGS. 1A–1Z are Ga—In—As—Sb phase diagrams at various temperatures showing tie lines (dashed lines) and isotherms representing boundaries of a miscibility gap (solid line) which can be used in the practice of a method of the present invention.
Figure 1B:
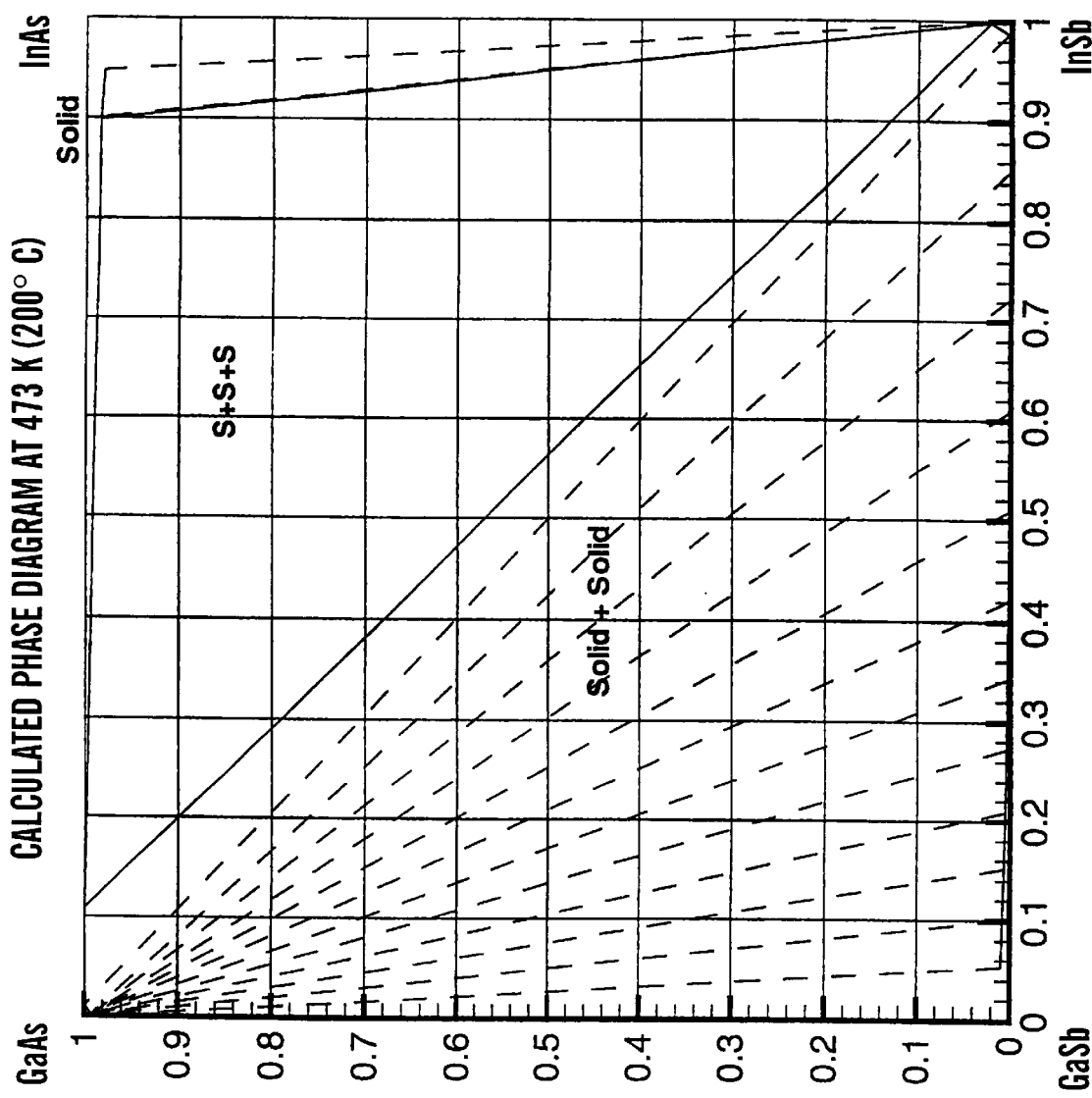
Figure 1C:
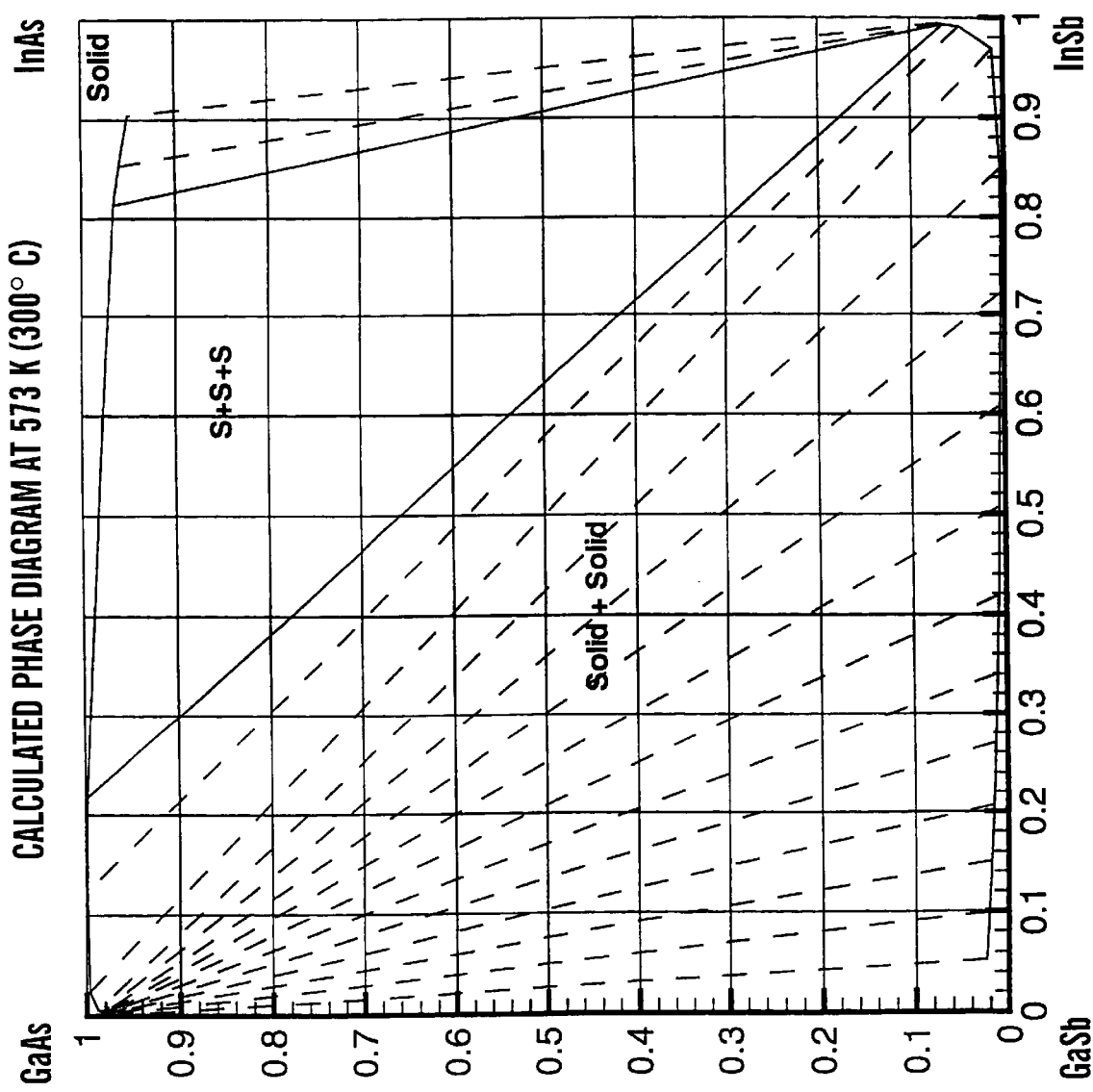
Figure 1D:
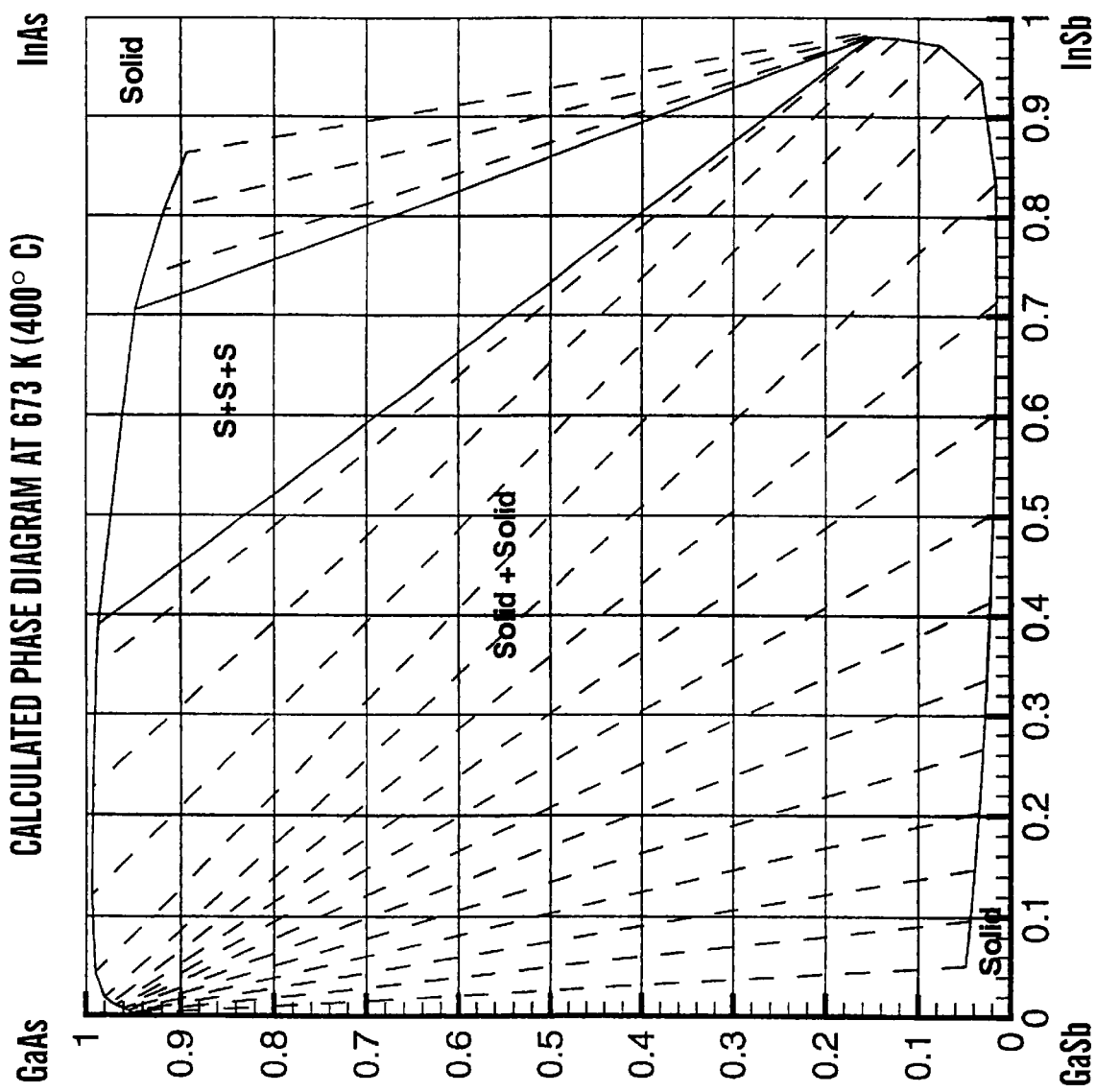
Figure 1E:
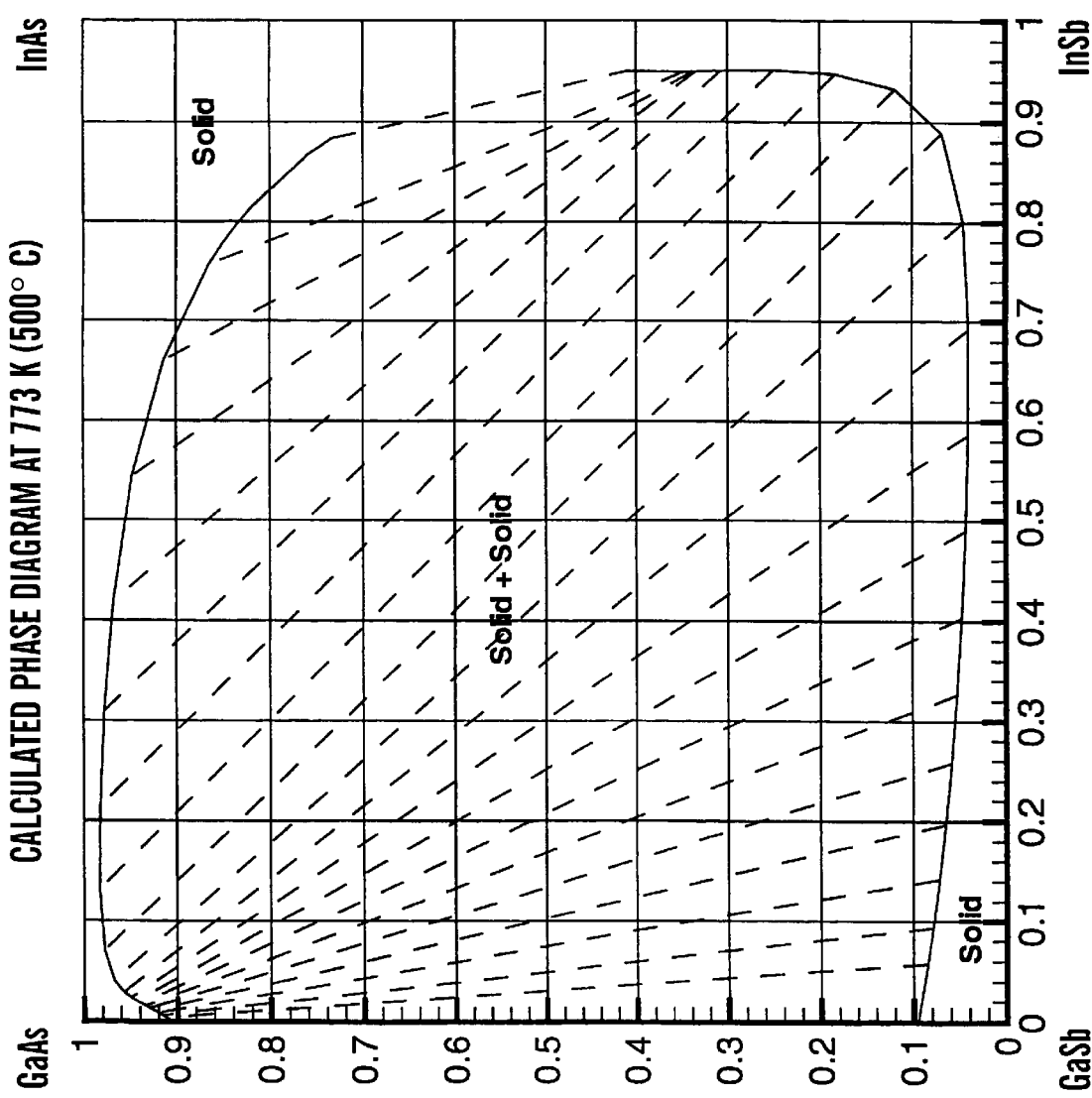
Figure 1F:
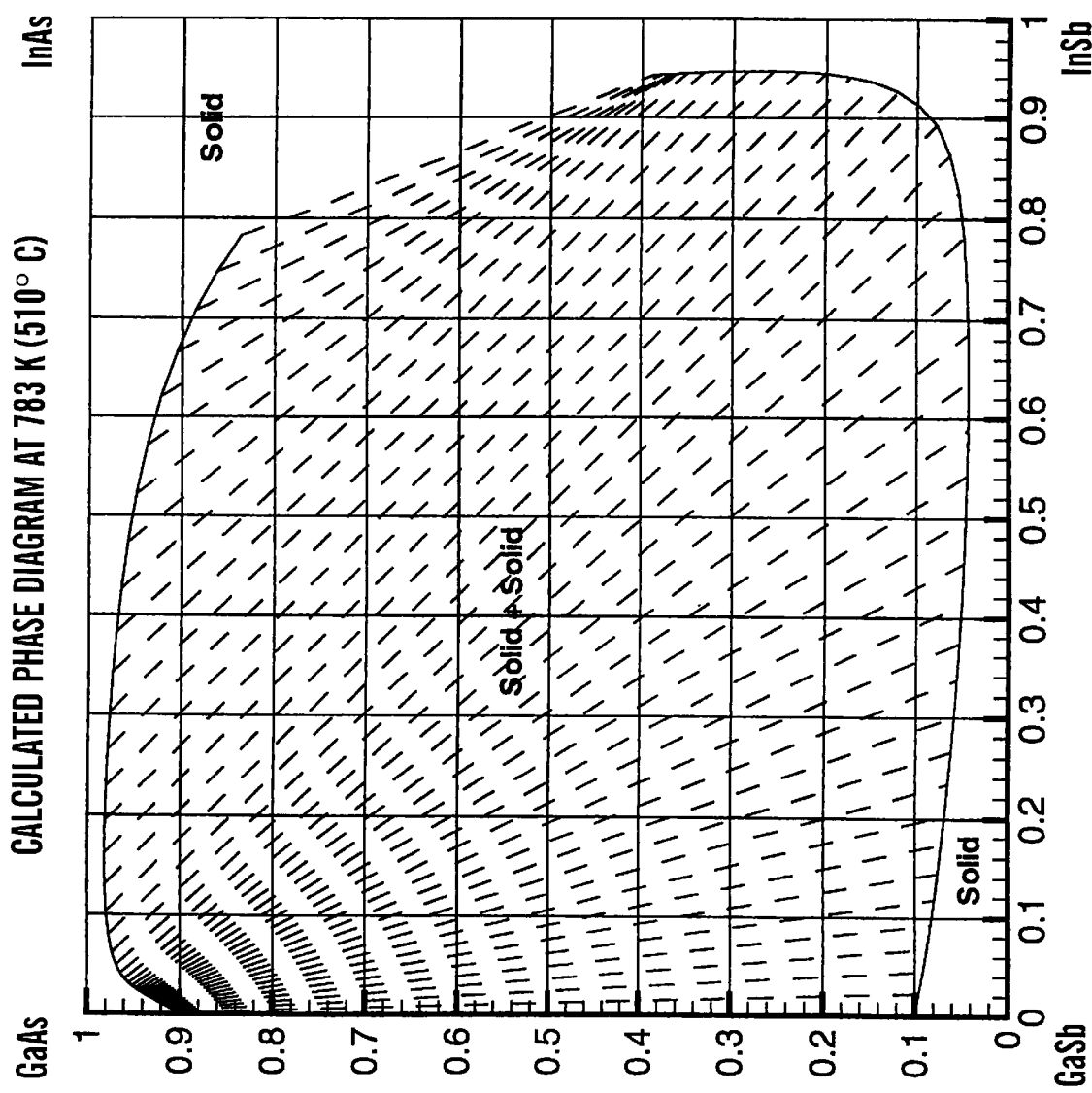
Figure 1G:
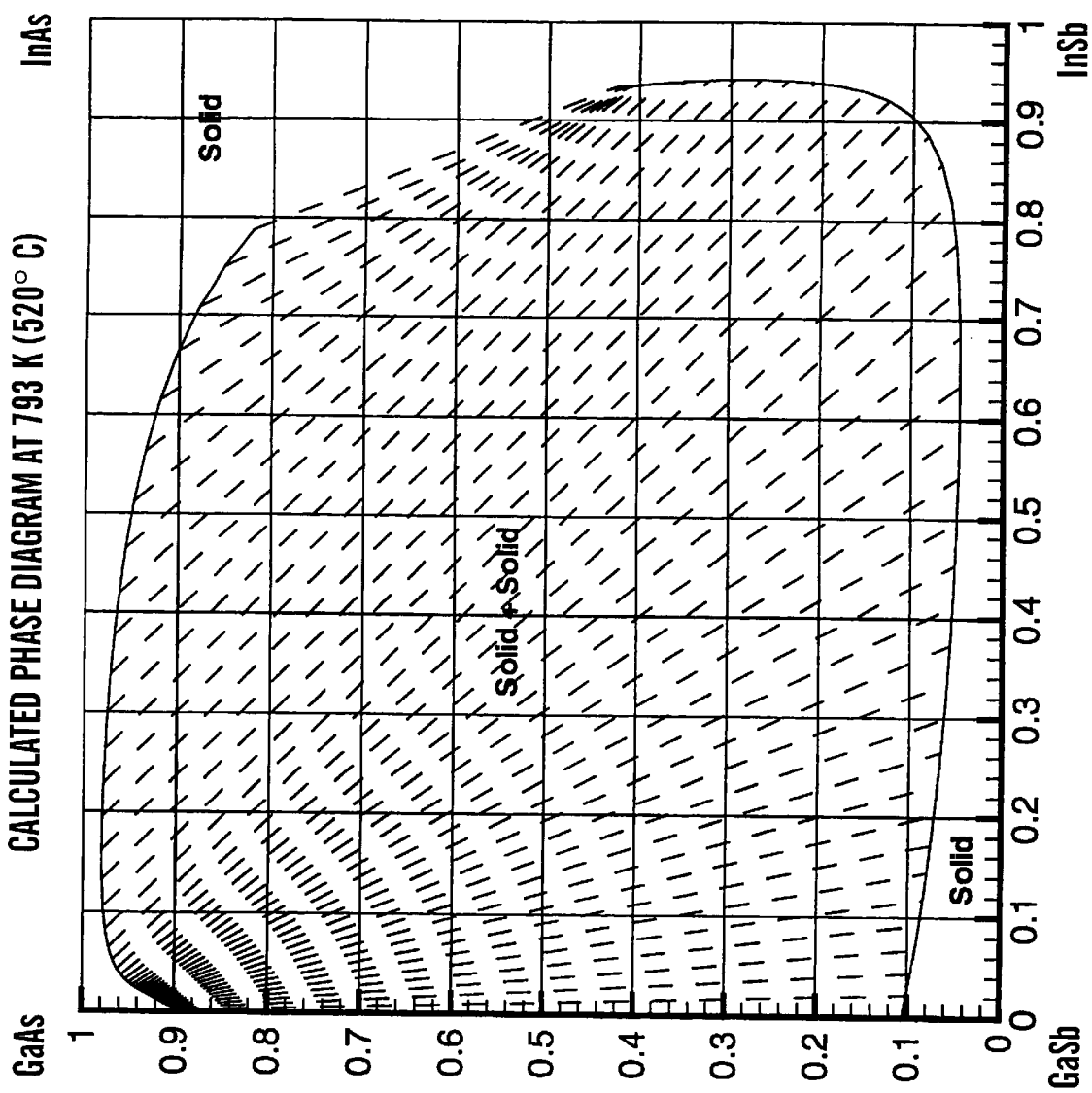
Figure 1H:
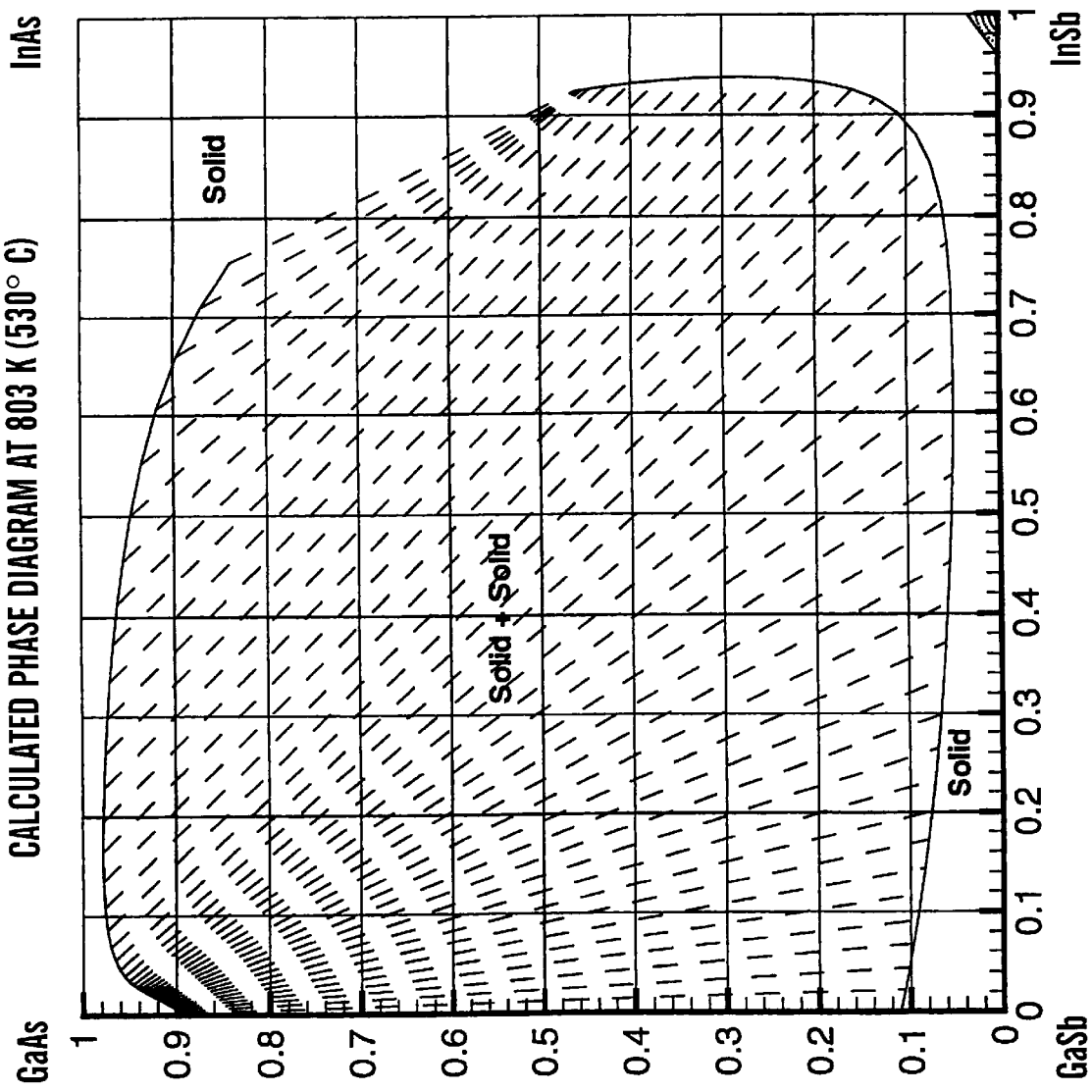
Figure 1I:
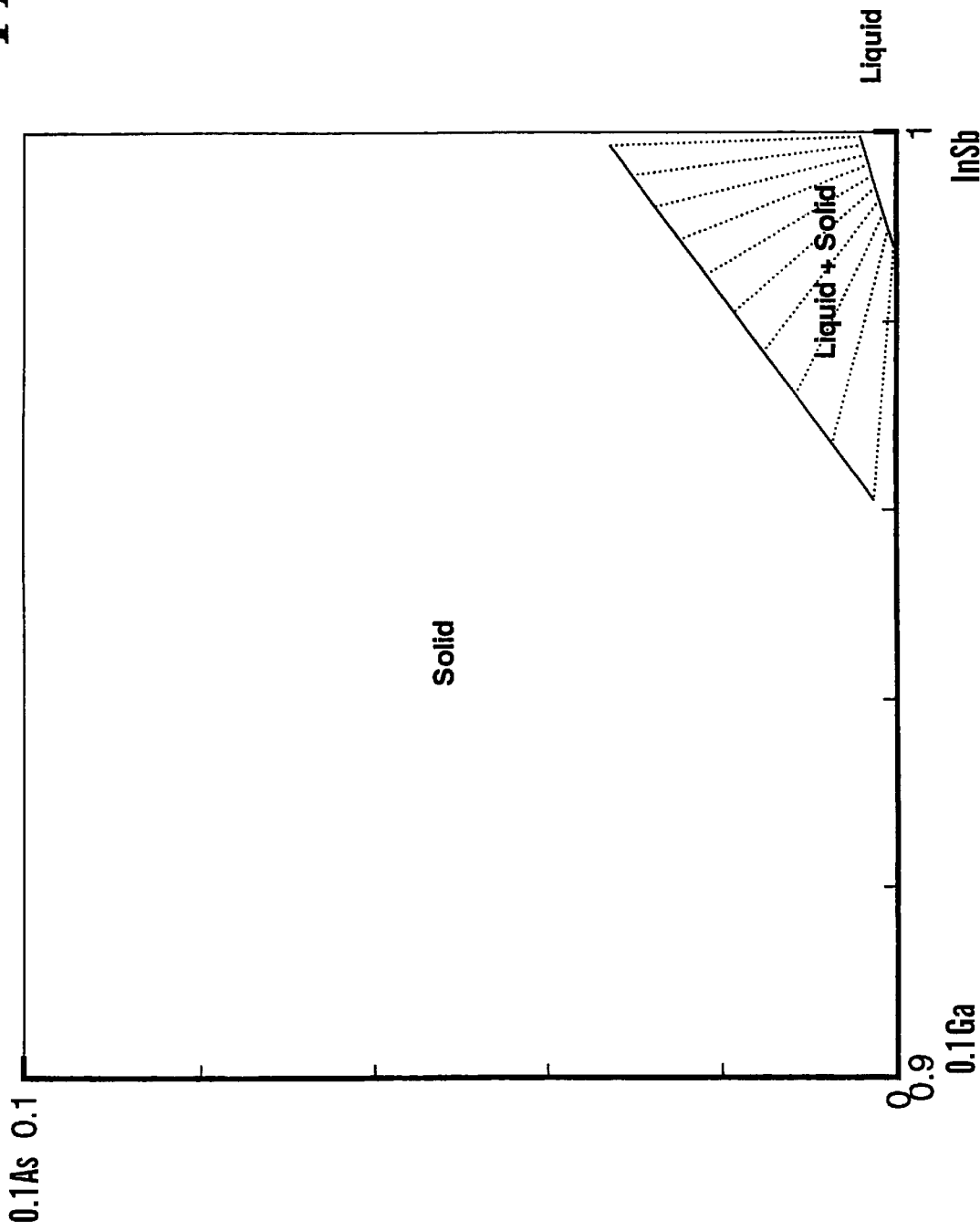
Figure 1J:
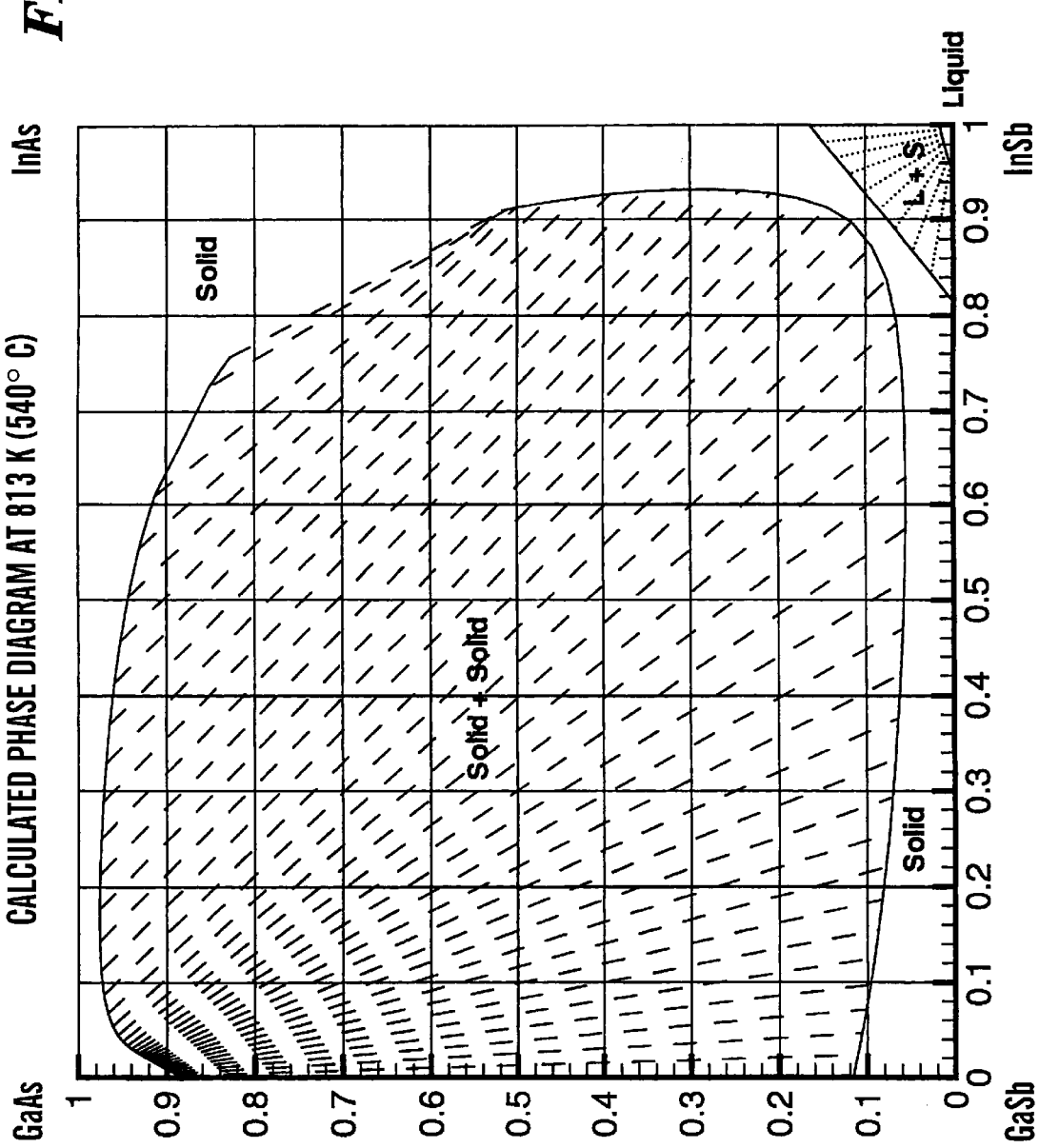
Figure 1K:
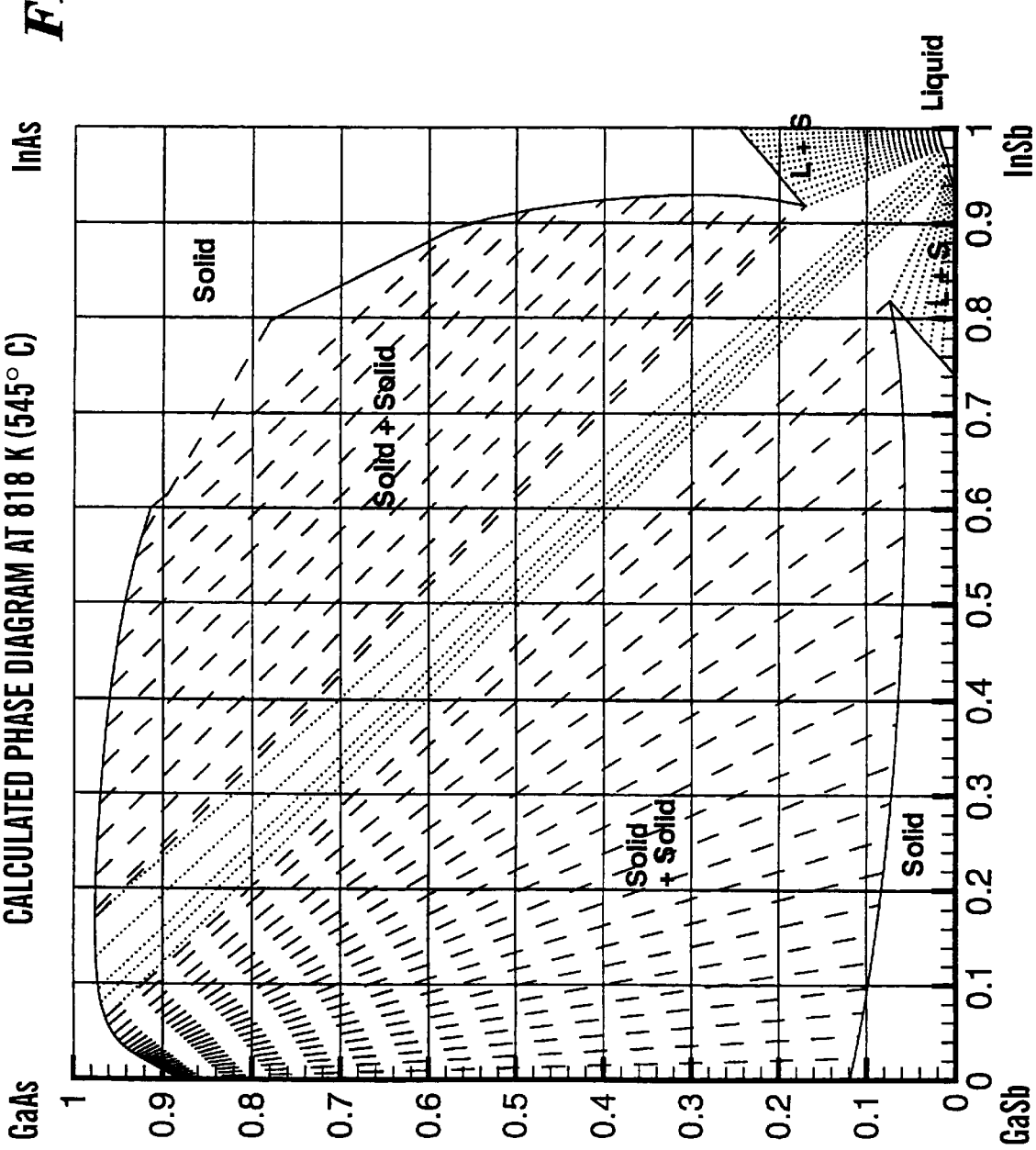
Figure 1L:
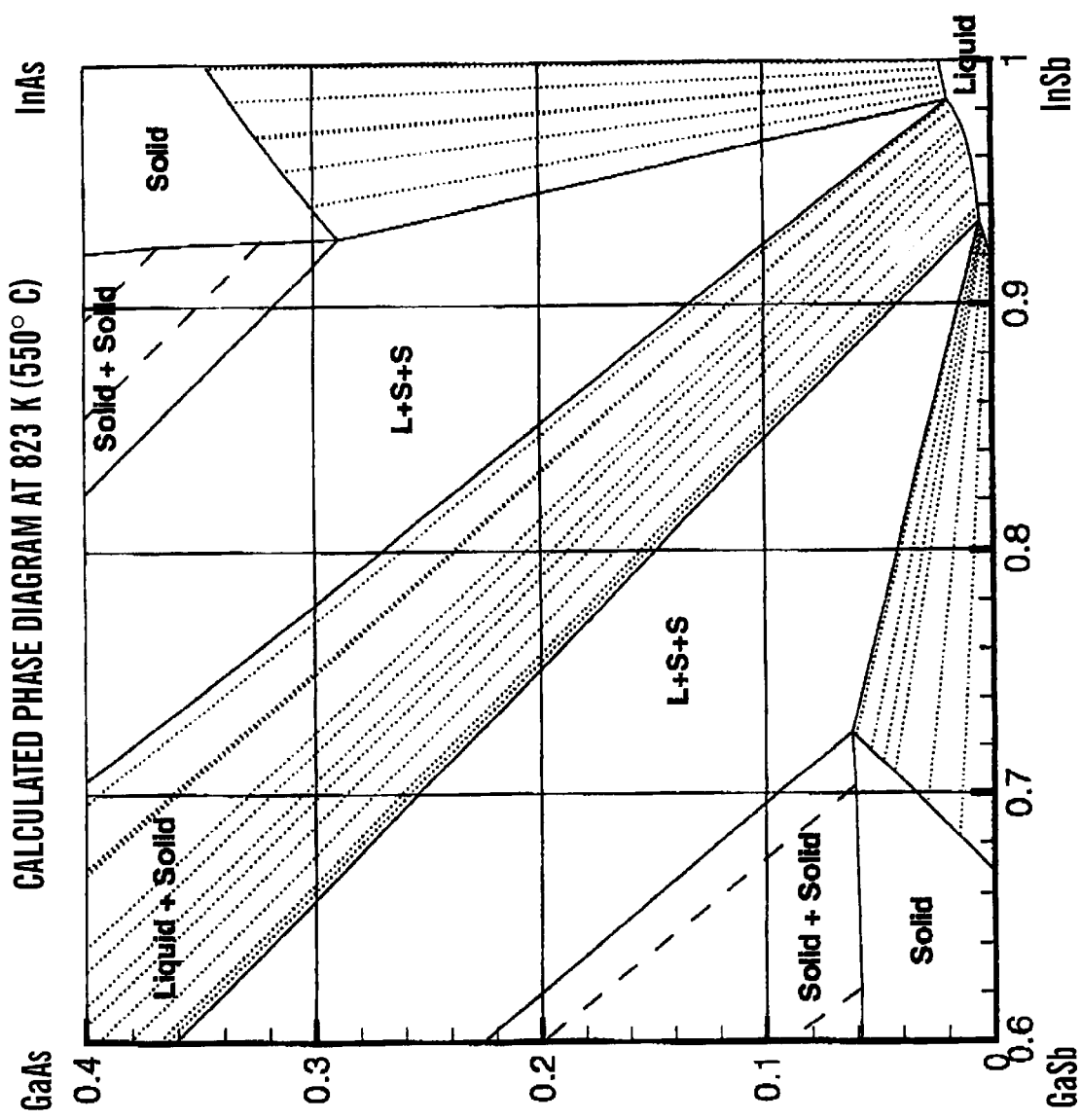
Figure 1M:
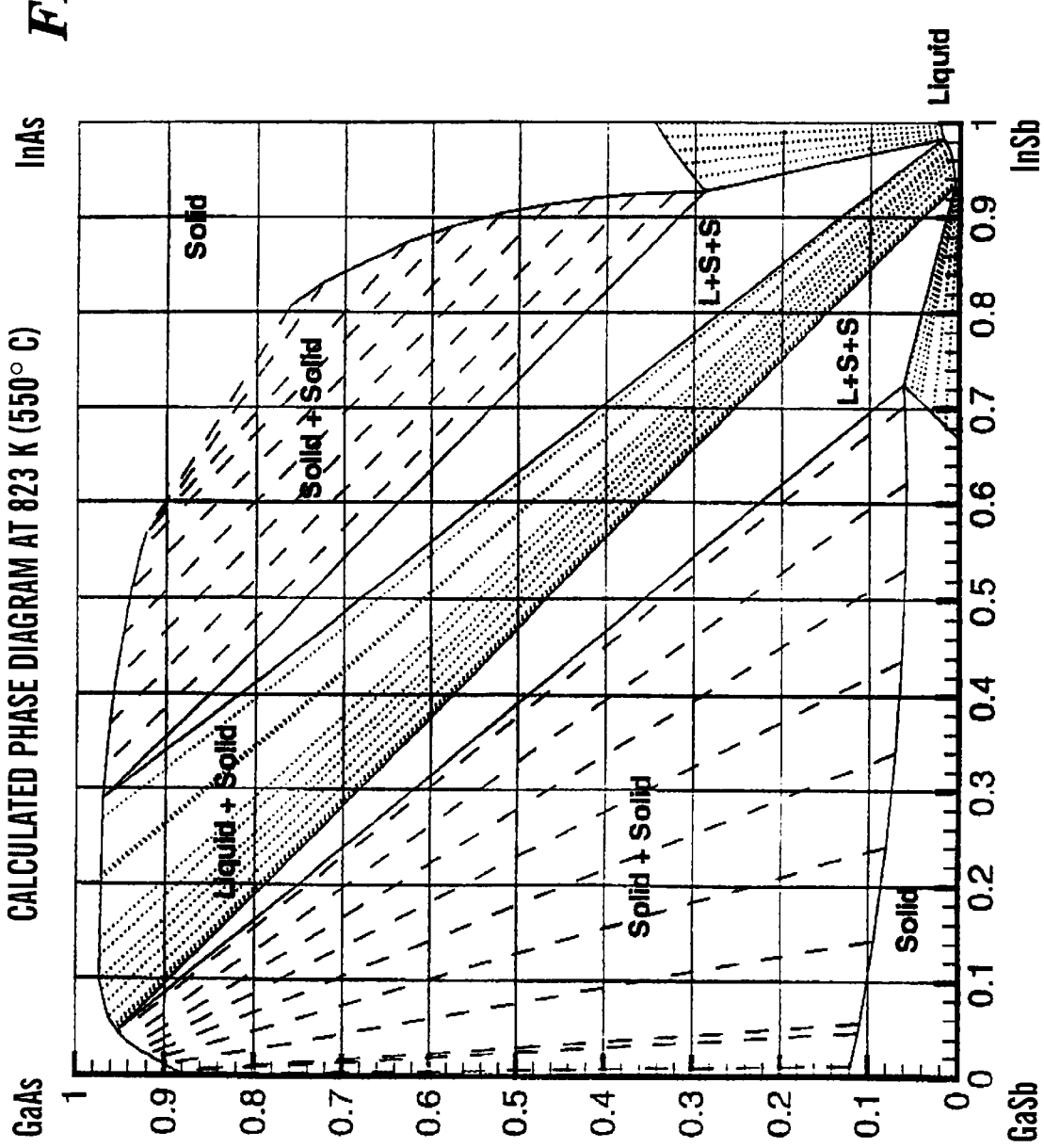
Figure 1N:
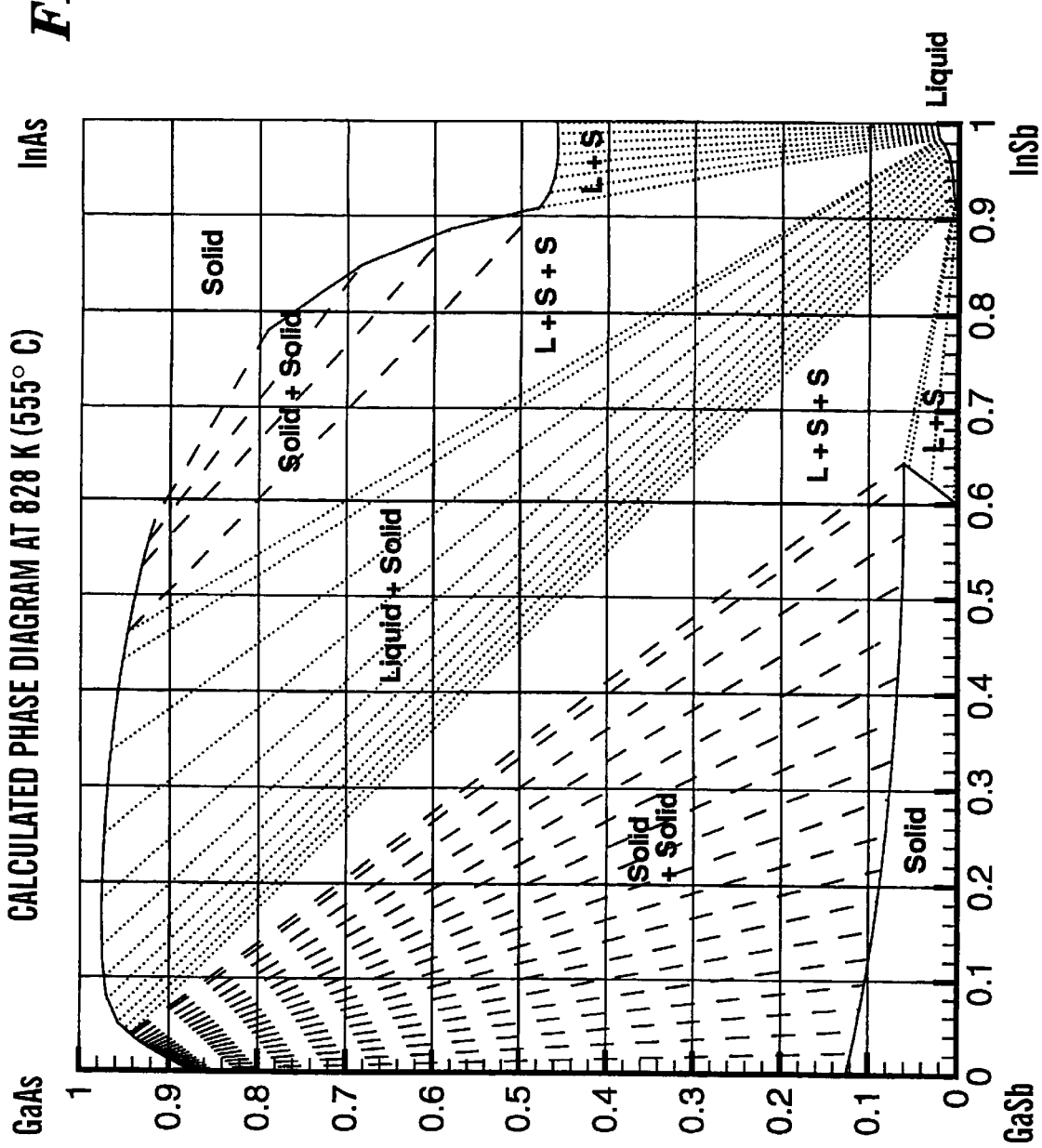

The present invention relates to a method for preparing a homogeneous ternary or quaternary alloy from a quaternary melt. The method includes providing a family of phase diagrams for the quaternary melt which shows (i) composition/temperature data, (ii) tie lines connecting equilibrium liquid and solid compositions, and (iii) isotherms representing boundaries of a miscibility gap. Based on the family of phase diagrams, a quaternary melt composition and an alloy growth temperature is selected. A quaternary melt having the selected quaternary melt composition is provided, and a ternary or quaternary alloy is grown from the quaternary melt at the selected alloy growth temperature.

Ternary alloys which can be produced using the method of the present invention include those having the formula ABC, where A and B are Group III elements and C is a Group V element; where A is a Group III element and B and C are Group V elements; where A and B are Group II elements and C is a Group VI element; or where A is a Group II element and B and C are Group VI elements. Examples of such ternary compounds include GaInAs, GaInSb, GaInP, AlGaAs, AlGaSb, AlGaP, AlInAs, AlInSb, AlInP, InAsSb, InAsP, InSbP, GaAsSb, GaAsP, GaSbP, AlAsSb, AlAsP, AlSbP, ZnTeSe, ZnTeS, ZnSeS, CdTeSe, CdTeS, CdSeS, HgTeSe, HgTeS, HgSeS, ZnCdTe, ZnCdSe, ZnCdS, ZnHgTe, ZnHgSe, ZnHgS, CdHgTe, CdHgSe, and CdHgS.

Quaternary alloys which can be produced using the method of the present invention include those having the formula ABCD, where A and B are Group III elements and C and D are Group V elements or where A and B are Group II elements and C and D are Group VI elements. Examples of such ternary compounds include GaInAsSb, GaInAsP, GaInSbP, AlGaAsSb, AlGaAsP, AlGaSbP, AlInAsSb, AlInAsP, AlInSbP, ZnCdTeSe, ZnCdTeS, ZnCdSeS, HgCdTeSe, HgCdTeS, HgCdSeS, ZnHgTeSe, ZnHgTeS, and ZnHgSeS.

As indicated above, one step in the method of the present invention involves providing a family of phase diagrams for the quaternary melt which shows (i) composition/temperature data, (ii) tie lines connecting equilibrium liquid and solid compositions, and (iii) isotherms representing boundaries of a miscibility gap. As used herein, a "family of phase diagrams" is meant to include one or more phase diagrams, typically one for each temperature in a temperature region of interest, for a particular set of four elements from which the quaternary melt is to be made. In principle, only one phase diagram is needed to practice the present invention, so long as the temperature is one in which solid and liquid are in equilibrium. However, depending on the size of the solid/liquid equilibrium region, it may be necessary or desirable to provide more phase diagrams at other temperatures to find a temperature at which solid and liquid exists in equilibrium for a particular ternary or quaternary melt.

In any event, the phase diagrams can be provided by generating them using, for example, a free energy minimization method. Briefly, this involves providing data corresponding to the free energies for each of the at least four quaternary melt elements as a function of temperature; providing data corresponding to excess free energy of solution phases as a function of temperature and composition; providing free energy data for compounds formed between the elements present in the melt; and determining equilibrium solid and liquid compositions by minimizing free energy of the system.

More particularly, Gibbs free-energy for a particular system is calculated using the well-known formula G=H−TS, where G is the system's free energy, H is the system's enthalpy, T is the absolute temperature of the system, and S is the system's entropy. To perform these calculations, one needs to know the free energies, as a function of temperature, for each of the component elements in the quaternary melt. Free energies can be found for the pure elements (in their solid and liquid phases) and for pure solid compounds in the literature, for example, in Ansara et al., "A Binary Database for III–V Compound Semiconductors," *CALPHAD* 18:177–222 (1994) ("Ansara"), which is hereby incorporated by reference. On occasion, the published free energy expressions need to be multiplied by some factor to account for how the data is reported. For example, where the literature data for a compound containing A and B are reported for $A_{0.5}B_{0.5}$, the free energy expressions may need to be multiplied by two if the calculations are to be based on AB rather than on $A_{0.5}B_{0.5}$.

Free energy of the liquid components can be modeled as consisting only of atoms. Where there is a strong interaction between the component atoms of a binary material (for example, the strong attraction between group III elements and group V elements), the strong interaction in the liquid can be accounted for by negative excess free energy terms rather than by postulating the existence of binary compounds (e.g., III–V binary compounds) in the liquid phase. The even stronger interactions between group II and group VI elements may require postulating the existence of II–VI binary compounds in the melts in order to obtain more accurate results for II/VI systems.

The excess free energy of a solution phase is defined as the difference between the actual free energy of mixing and the free energy change that would result from the entropy of mixing of an ideal solution. The excess free energy of the liquid can be conveniently represented using a Redlich-Kister model (described, for example, in Redlich et al., "Algebraic Respresentation of Thermodynamic Properties and the Classification of Solutions," *Ind. Eng. Chem.*, 40:345–348 (1948) ("Redlich"), which is hereby incorporated by reference) having non-zero coefficients for some or all of the six possible binary interactions and for some (e.g., two) of the four possible ternary interactions. The contribution of an interaction to the excess free energy is $$G_{excess}=W_0(T)X_1X_2+W_1(T)X_1X_2(X_1-X_2)+W_2(T)X_1X_2(X_1-X_2)^2$$

for a binary interaction, and $$G_{excess}=W_0(T)X_1X_2X_3$$

for a ternary interaction, where $X_n$ is the mole fraction of species n and $W_m$ is the mth order Redlich-Kister coefficient for a particular interaction.

Redlich-Kister coefficients for the binary interactions in the liquid can be found, for example, in Ansara, which is hereby incorporated by reference, and coefficients for the ternary interaction among Ga, In, and Sb in the liquid can be found, for example, in Yang et al., "An Assessment of Phase Diagram and Thermodynamic Properties of the Gallium-Indium-Antimony System," *CALPHAD (Computer Coupling of Phase Diagrams and Thermochemistry)*, 18:165–175 (1994) ("Yang"), which is hereby incorporated by reference.

The zincblende or wurtzite phases can be treated using a two-sublattice model. For example, where the alloy is a quaternary alloy which includes gallium, indium, arsenic, and antimony, gallium and indium can be viewed as occupying one sublattice, while arsenic and antimony can be viewed as occupying the other sublattice. Using $Y_x$ to represent the fraction of sites on its appropriate sublattice occupied by element X, the free energy of the solid can be calculated as:

$$G = Y_{Ga}Y_{As}G^o_{GaAs} + Y_{In}Y_{As}G^o_{InAs} + Y_{Ga}Y_{Sb}G^o_{GaSb} + Y_{In}Y_{Sb}G^o_{InSb} +$$
$$RT(Y_{Ga}\ln Y_{Ga} + Y_{In}\ln Y_{In}) + RT(Y_{As}\ln Y_{As} + Y_{Sb}\ln Y_{Sb}) +$$
$$G_{excess}$$

where $$G_{excess}=Y_{Ga}Y_{As}Y_{Sb}a_o+Y_{Ga}Y_{In}Y_{As}b_o+Y_{Ga}Y_{In}Y_{Sb}c_o+Y_{In}Y_{As}Y_{Sb}d_o$$

Expressions for the $a_o$, $b_o$, $c_o$, and $d_o$ coefficients can be found in literature sources, such as Redlich and Yang, which are hereby incorporated by reference, or by fitting the calculated liquidus and solidus curves to experimental data, for example by using optimizing computer programs, such as the TERGSS program referred to i Yang. Improved estimates for $G_{excess}$ can be achieved by accounting for ternary interactions in the liquid and making adjustments to the $d_o$ coefficient. For example, in the InAs-InSb subsystem, improved estimates for $G_{excess}$ can be achieved by addition of a ternary As, In, Sb interaction in the liquid and making adjustments to the $d_o$ coefficient. The values for these two coefficients are most easily obtained by trial-and-error rather than by a rigorous optimization procedure, although the latter can be employed. Typically, reliable results can be obtained even when only the first term ($W_0$) in the Redlich-Kister series is used.

The above-described free energy calculations can be performed using a software package, such as the MULTIPHASE module of MTBATA, which is available from UES Software Inc., Pittsburgh, Pa. For example, at each temperature, overall compositions (moles of each element) corresponding to selected points expected to be in the interior of two phase or three phase regions can be used as input. The software then calculates the compositions and amounts of the phases present at equilibrium. Each point that is within a two-phase region can be used to generate a tie line, and each point within a three phase region can be used to generate the three lines forming the boundaries of the region.

Figure 1P:
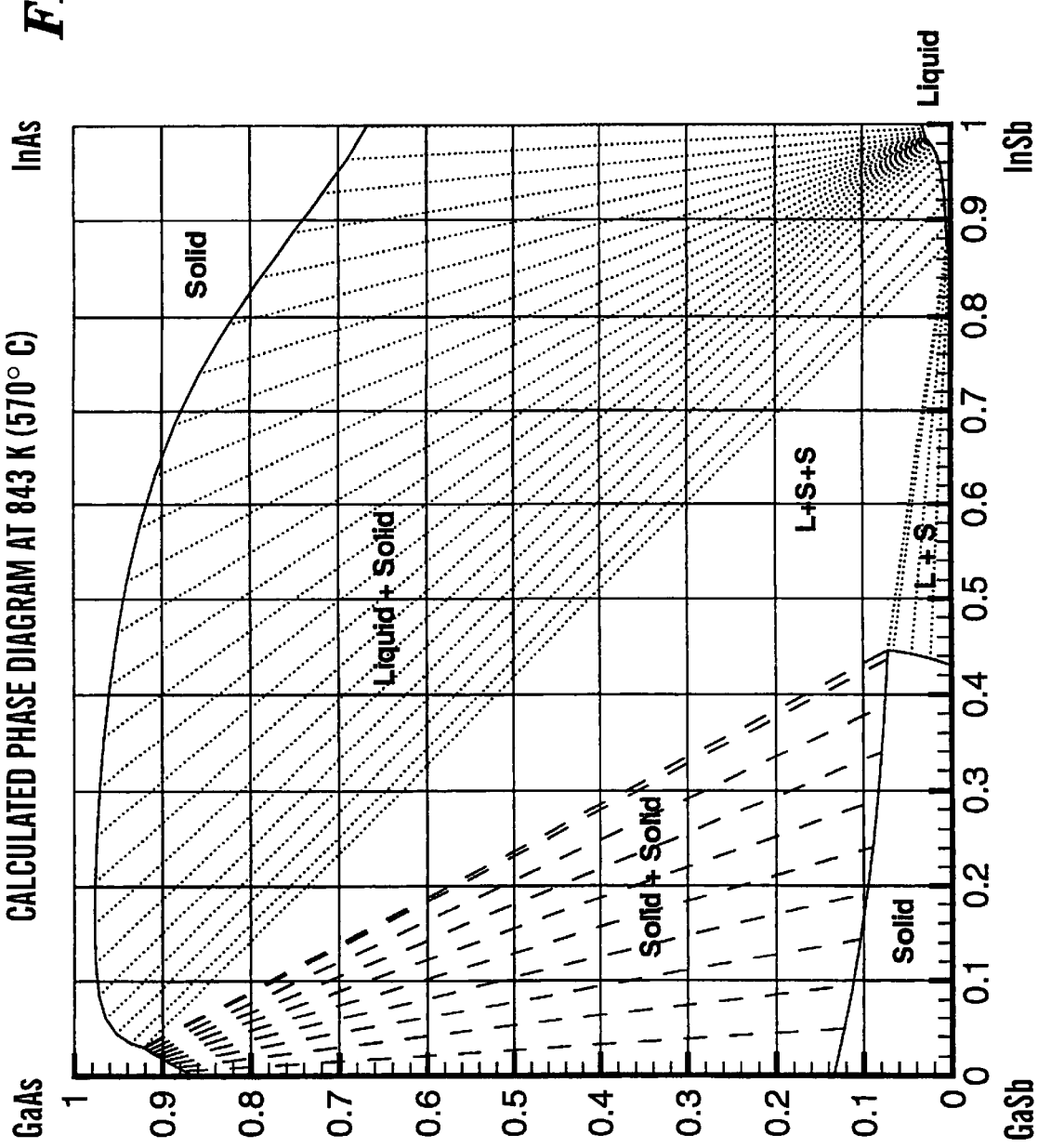
Figure 1Q:
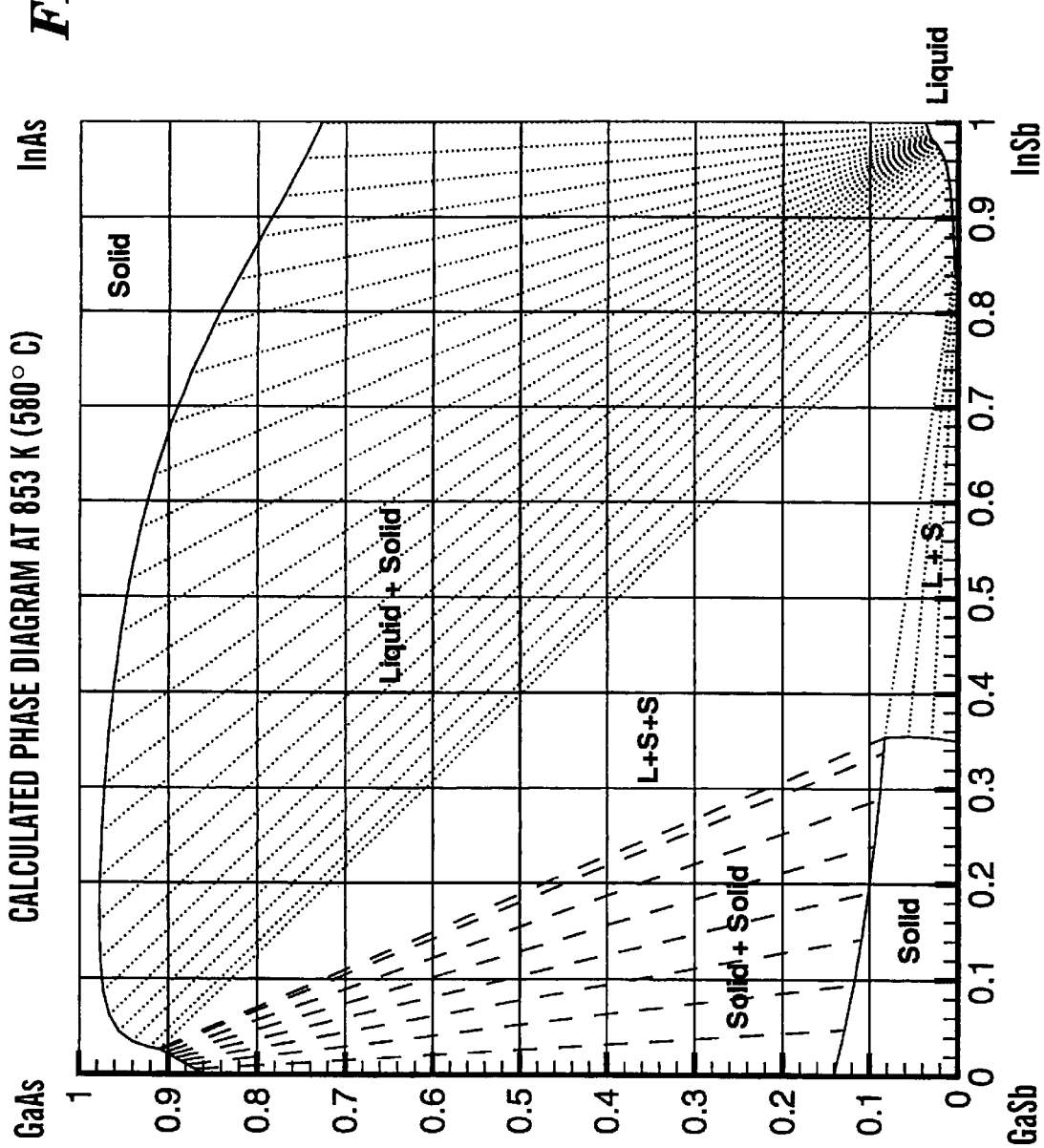
Figure 1R:
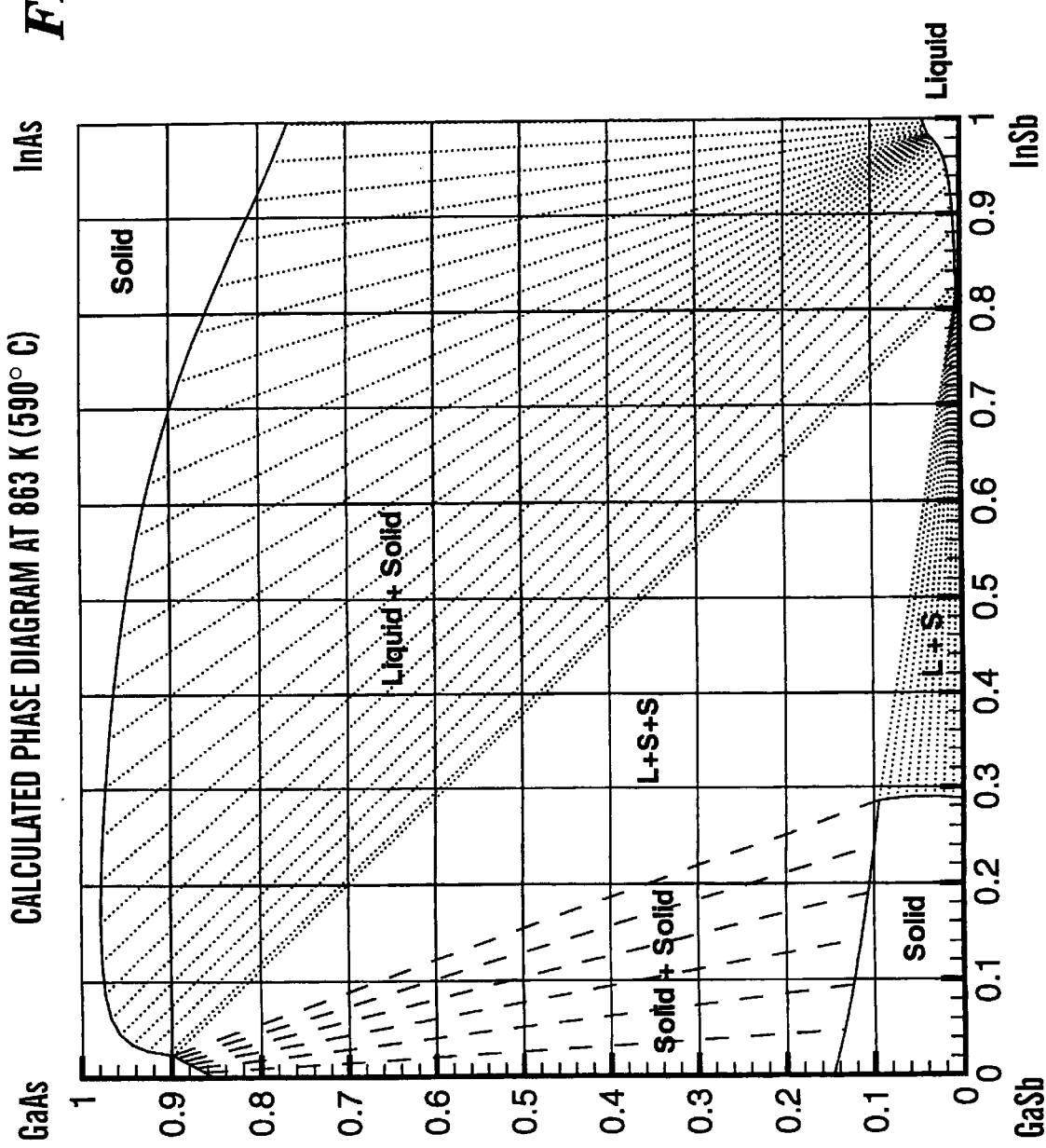
Figure 1T:
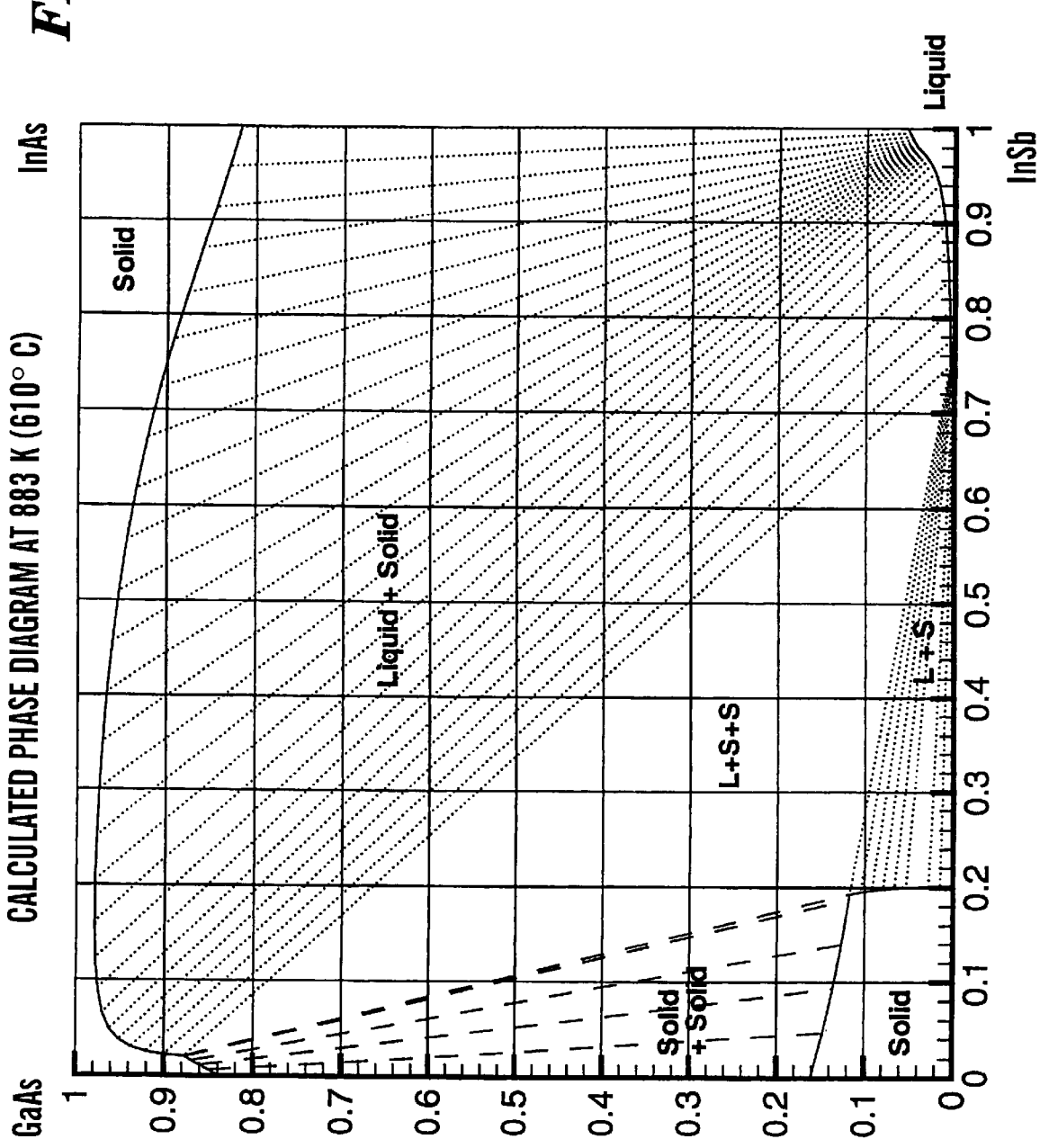
Figure 1U:
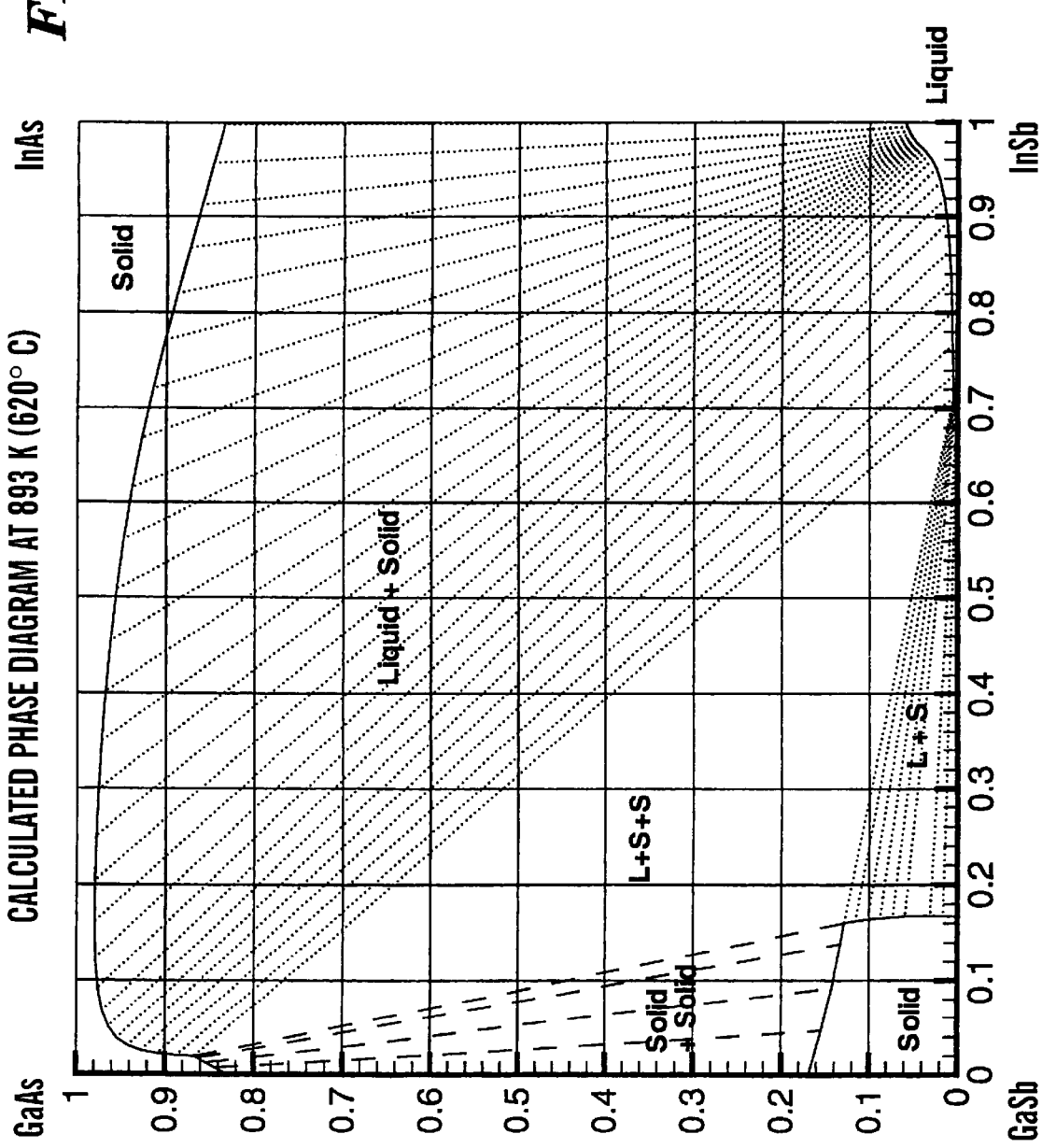
Figure 1V:
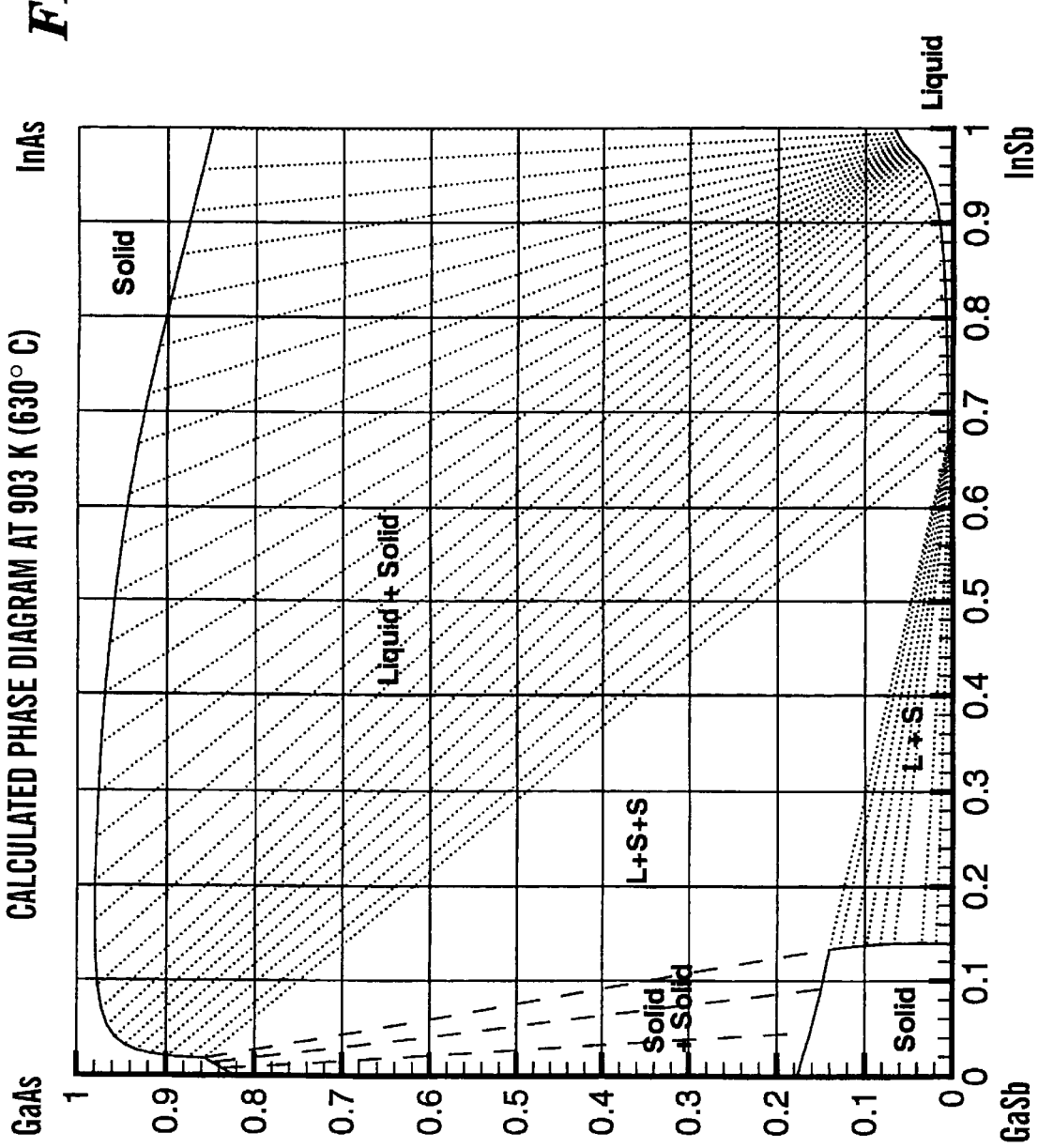
Figure 1W:
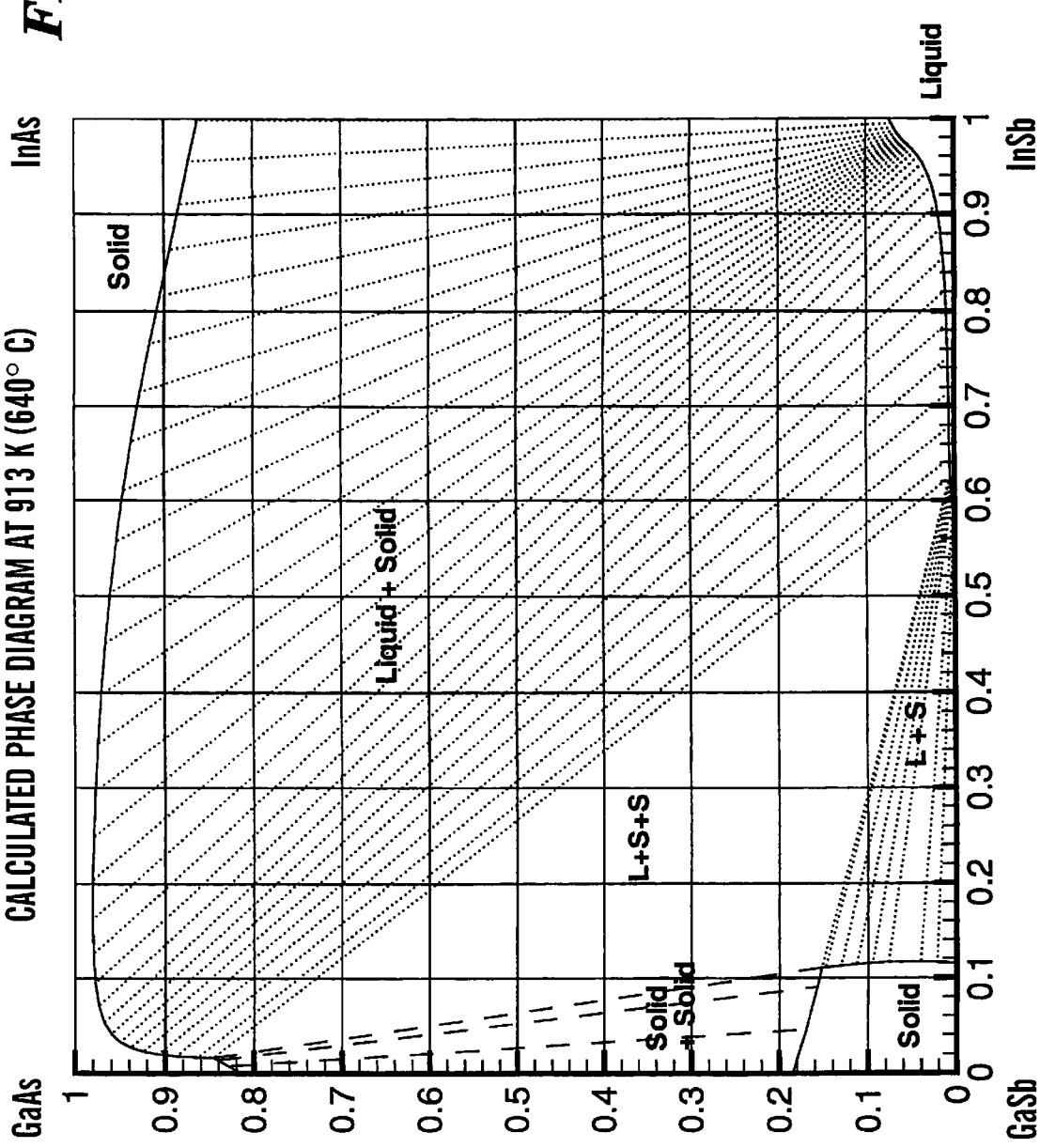
Figure 1Y:
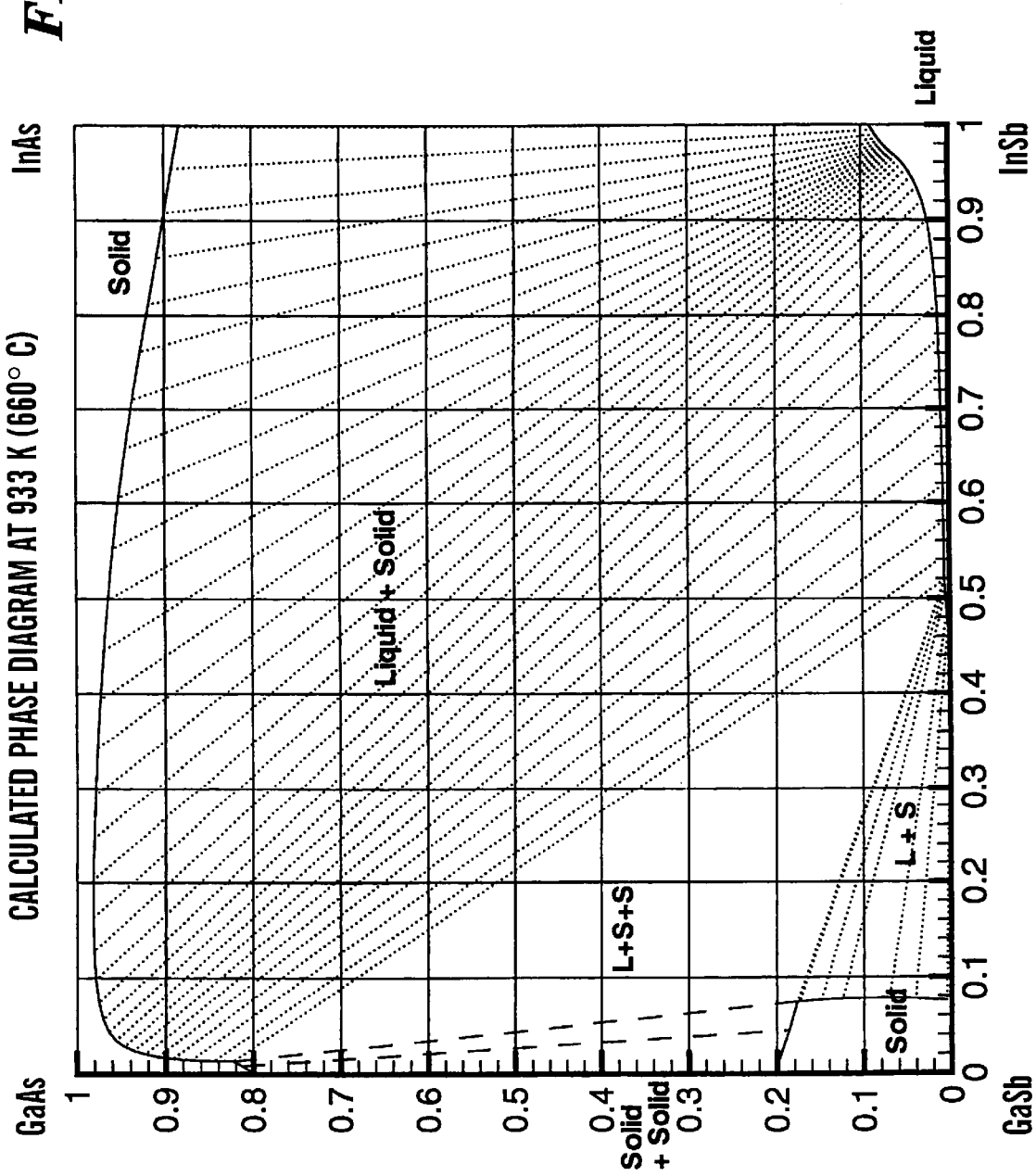
Figure 1Z:
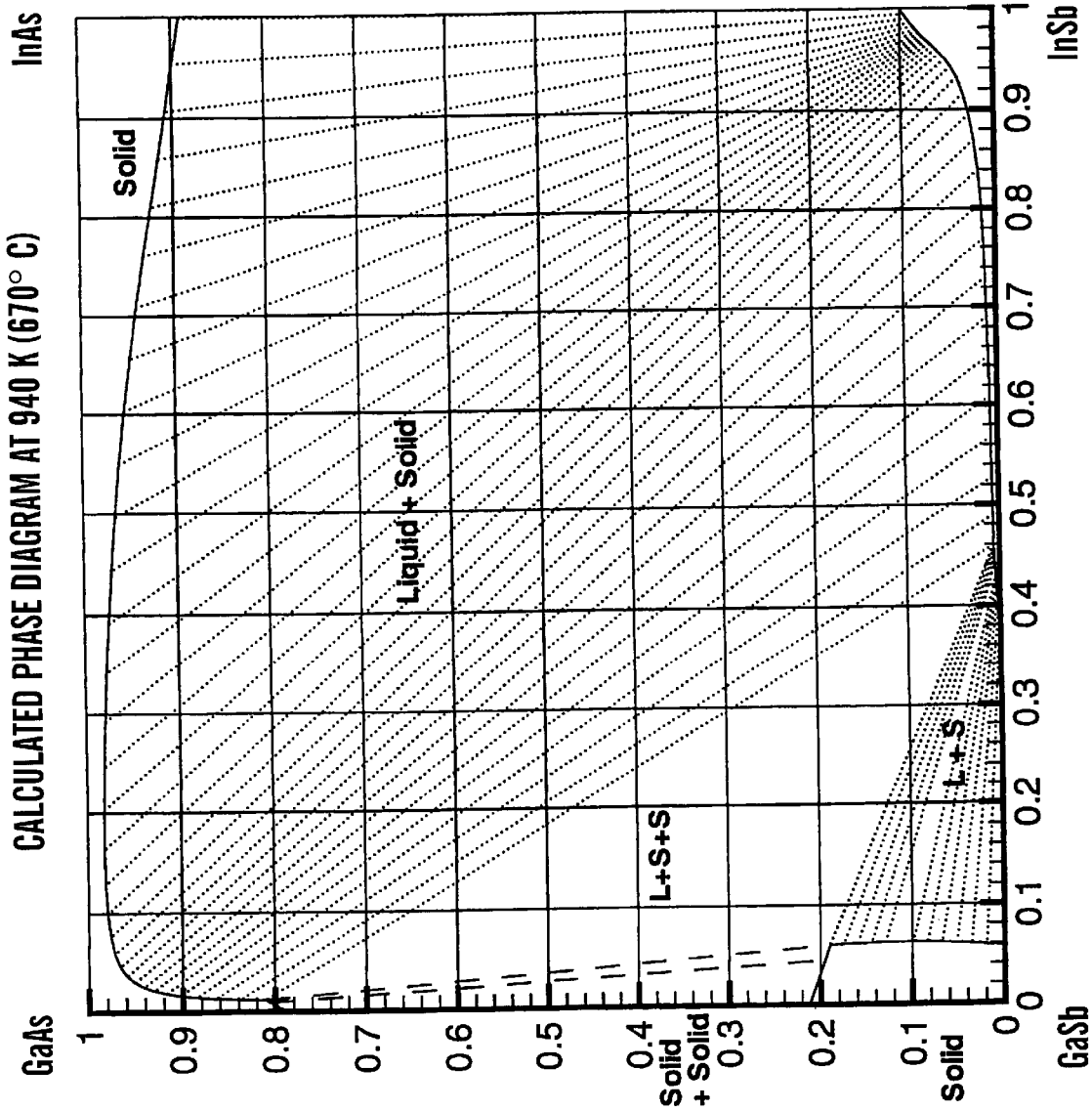
Figure 2A:
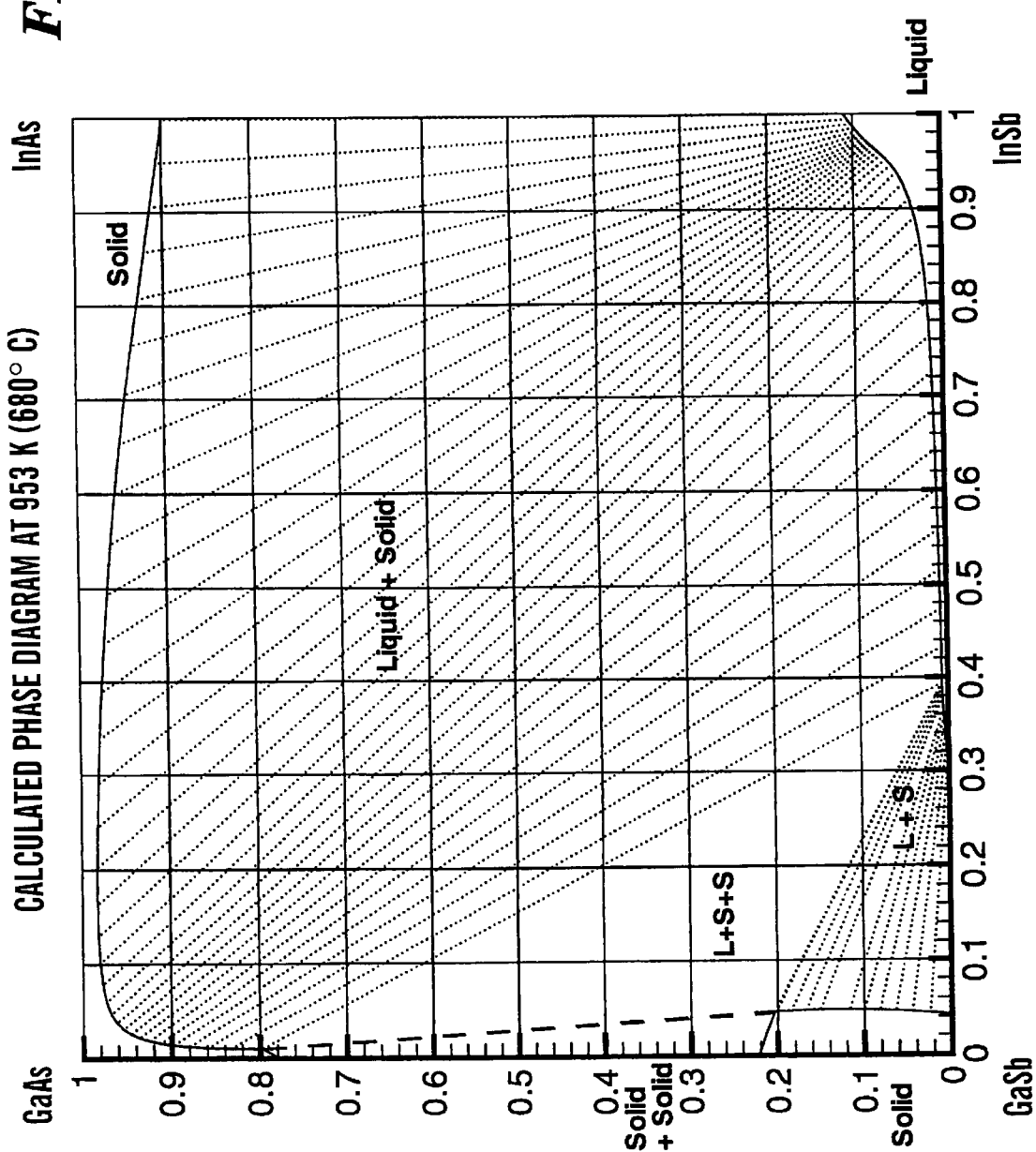
FIGS. 2A–2V are additional Ga—In—As—Sb phase diagrams at various temperatures showing tie lines (dashed lines) and isotherms representing boundaries of a miscibility gap (solid line) which can be used in the practice of a method of the present invention.
Figure 2B:
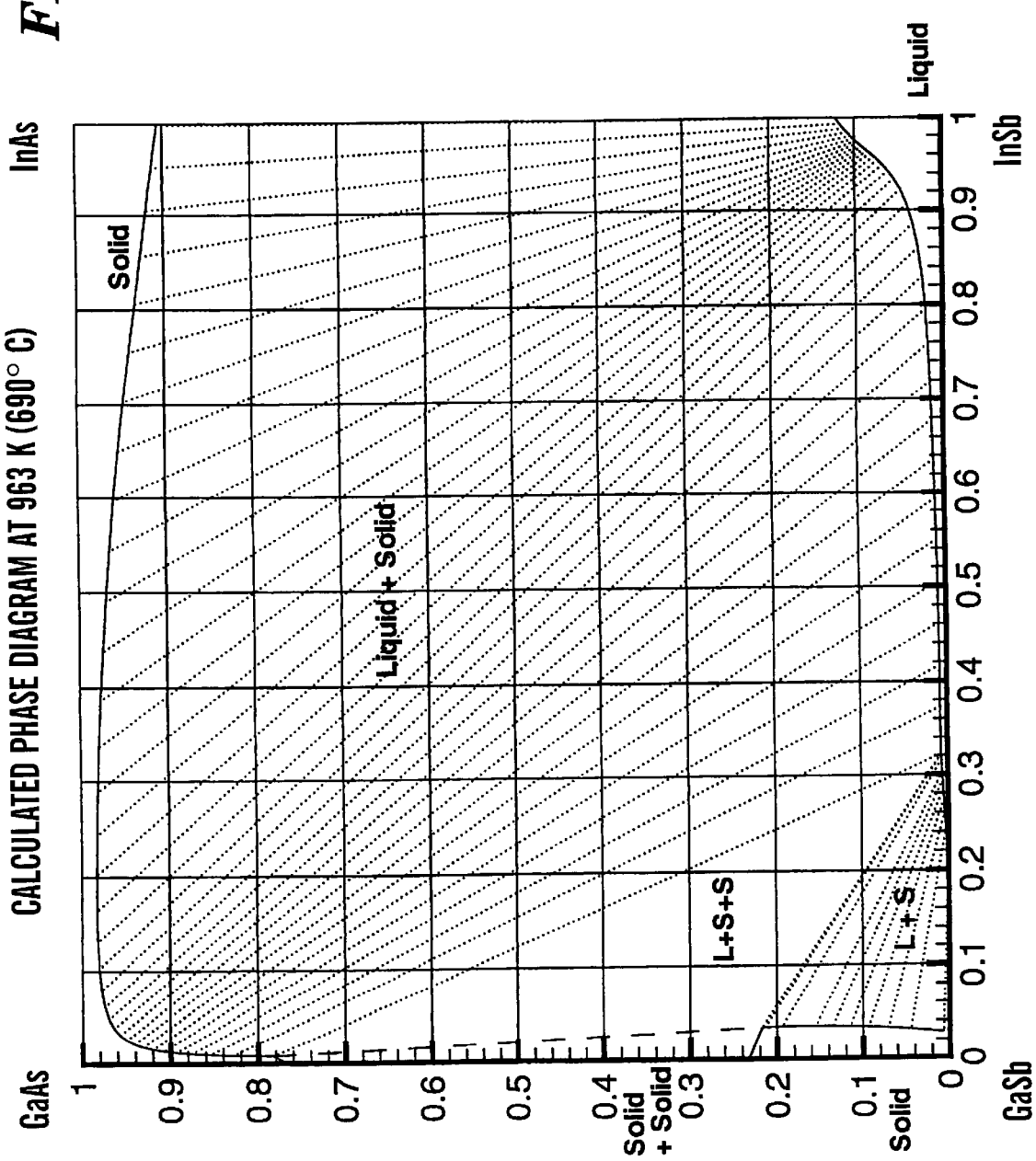
Figure 2C:
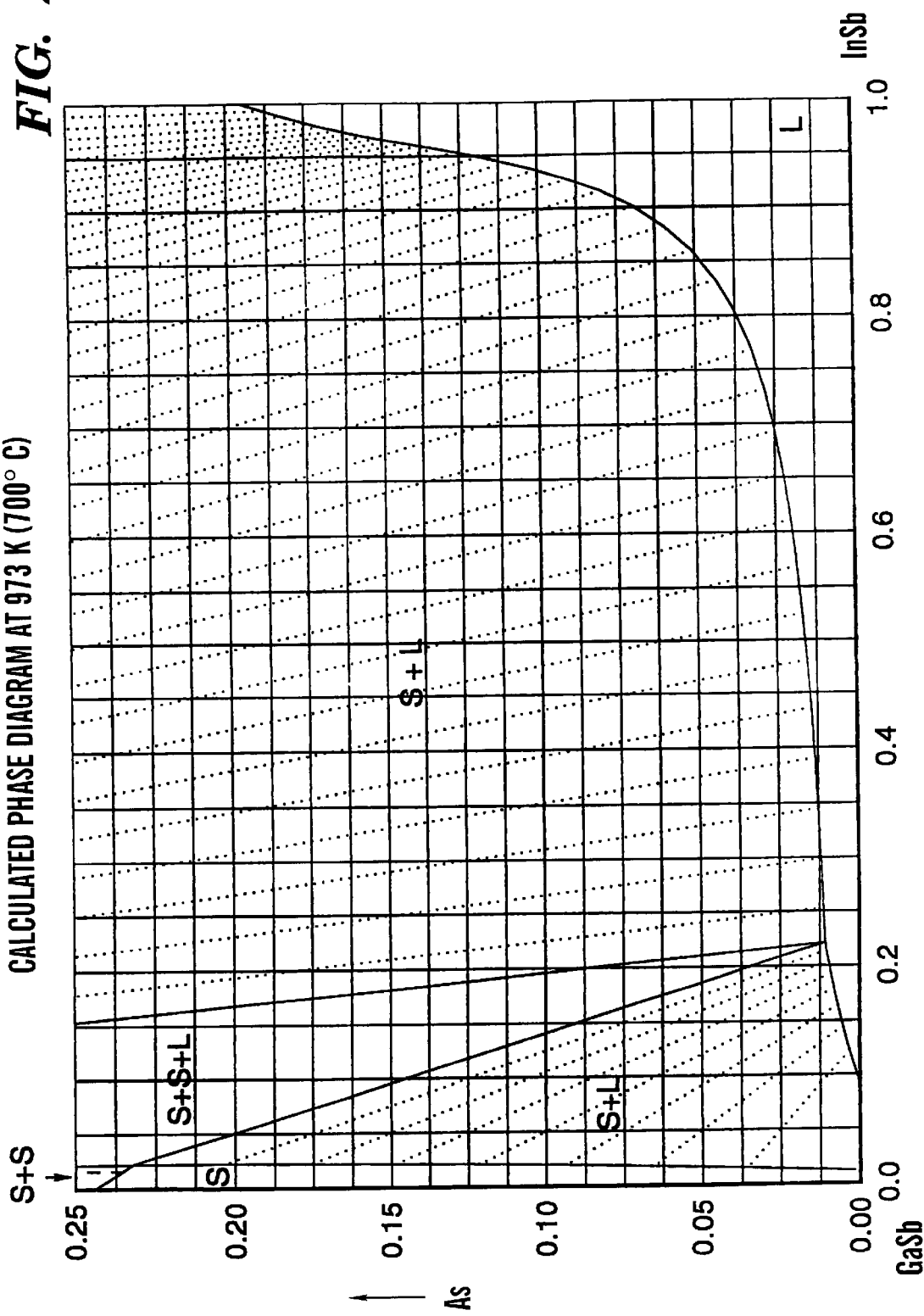
Figure 2E:
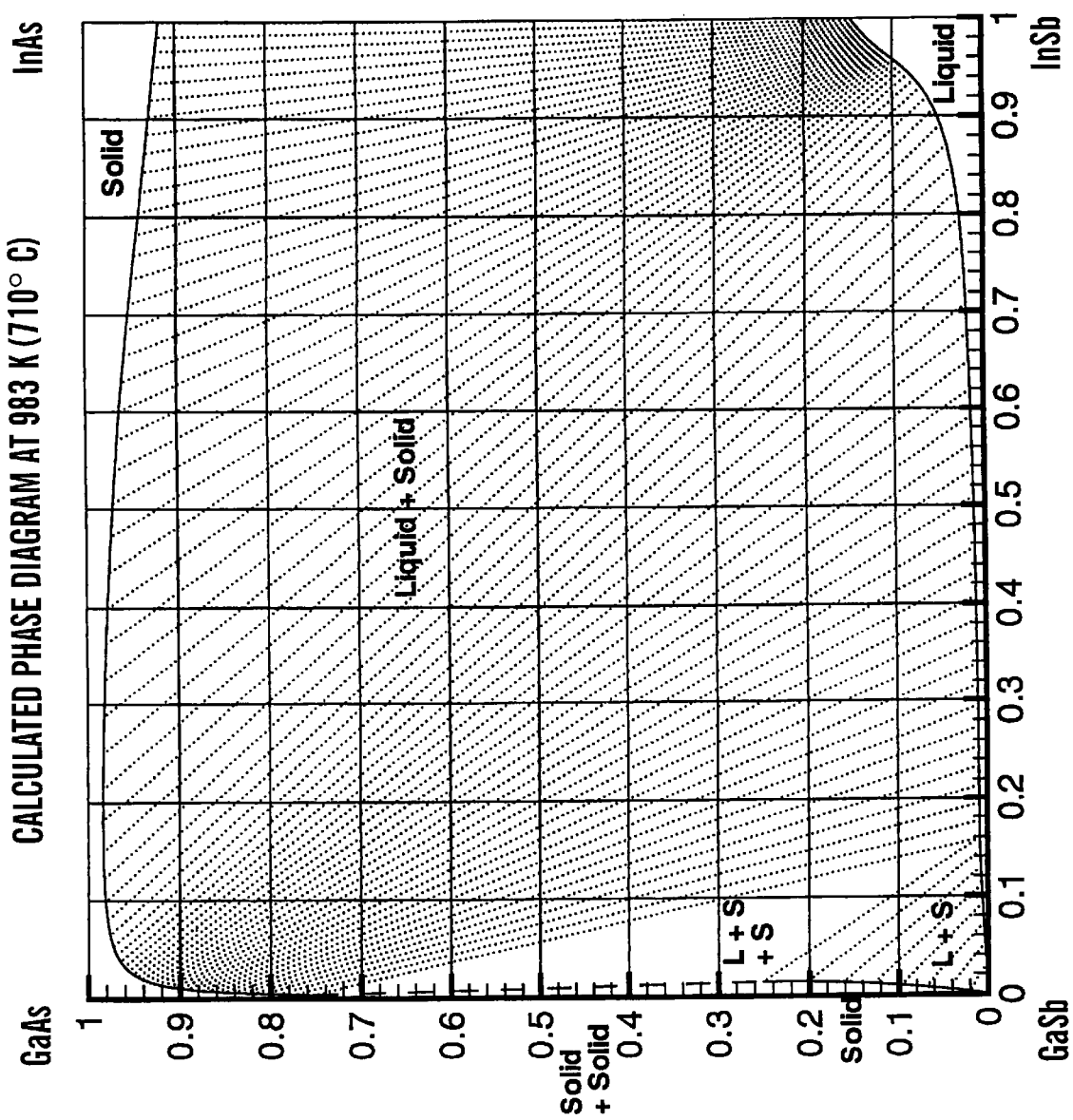
Figure 2F:
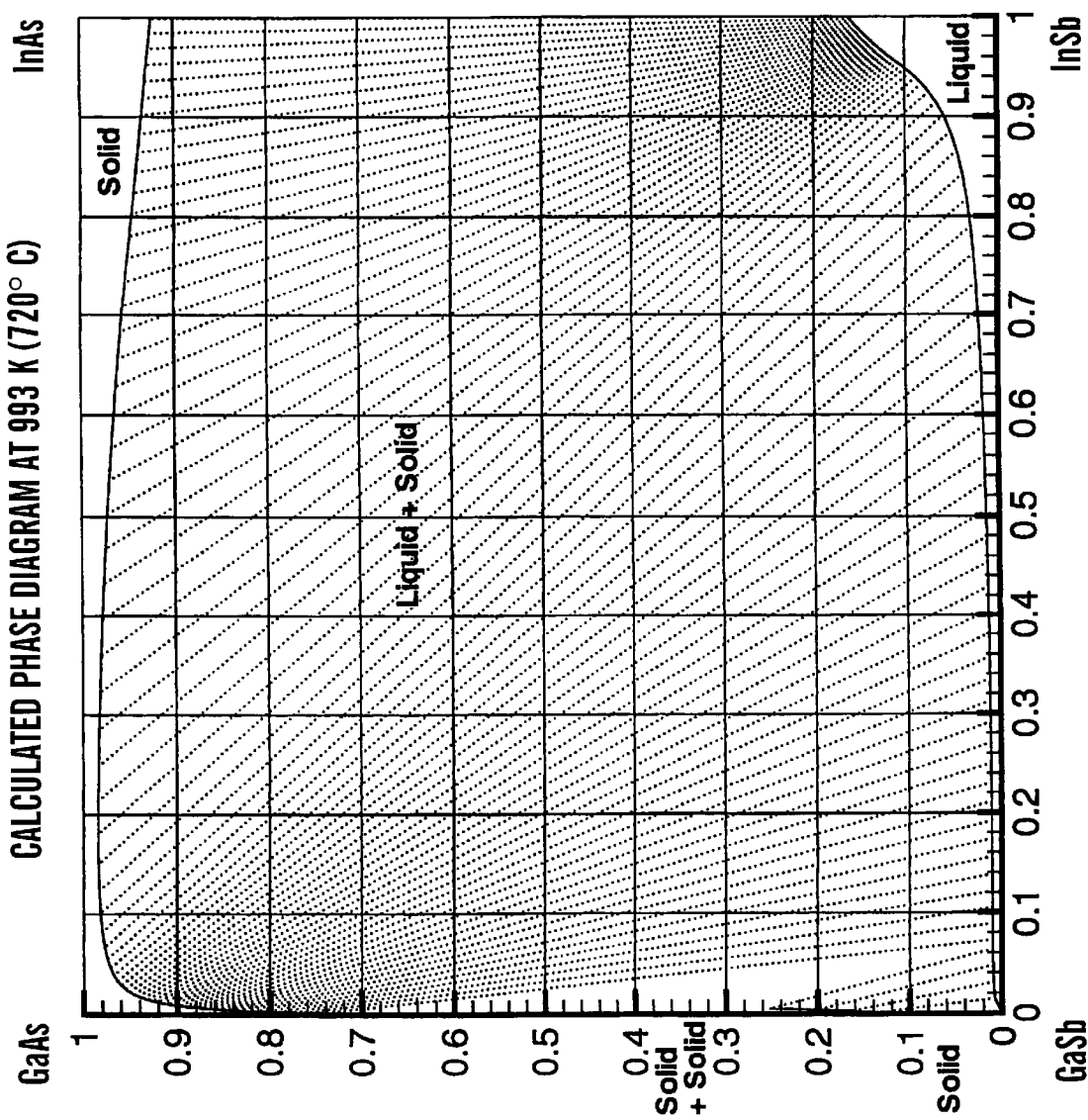
Figure 2G:
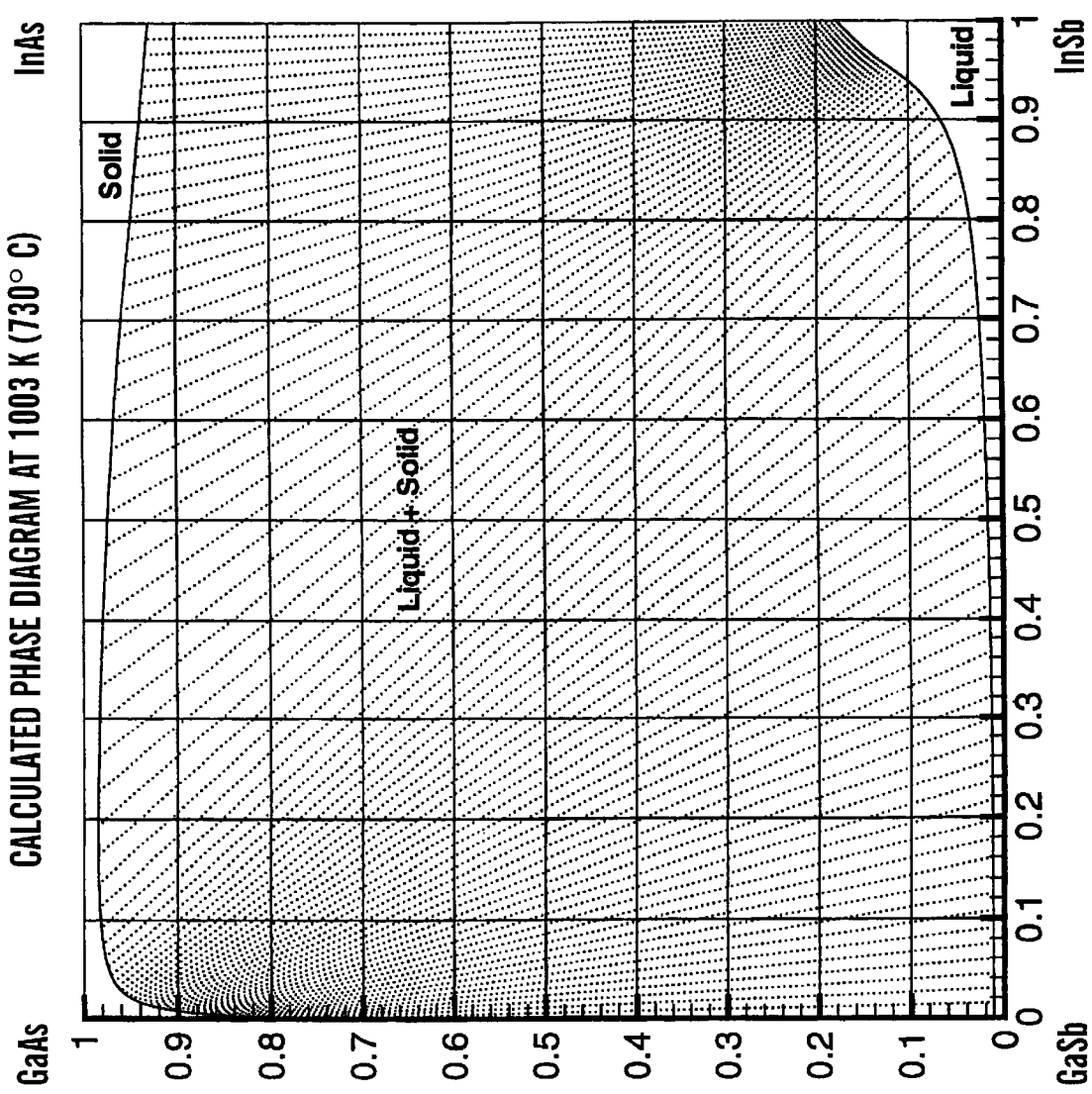
Figure 2H:
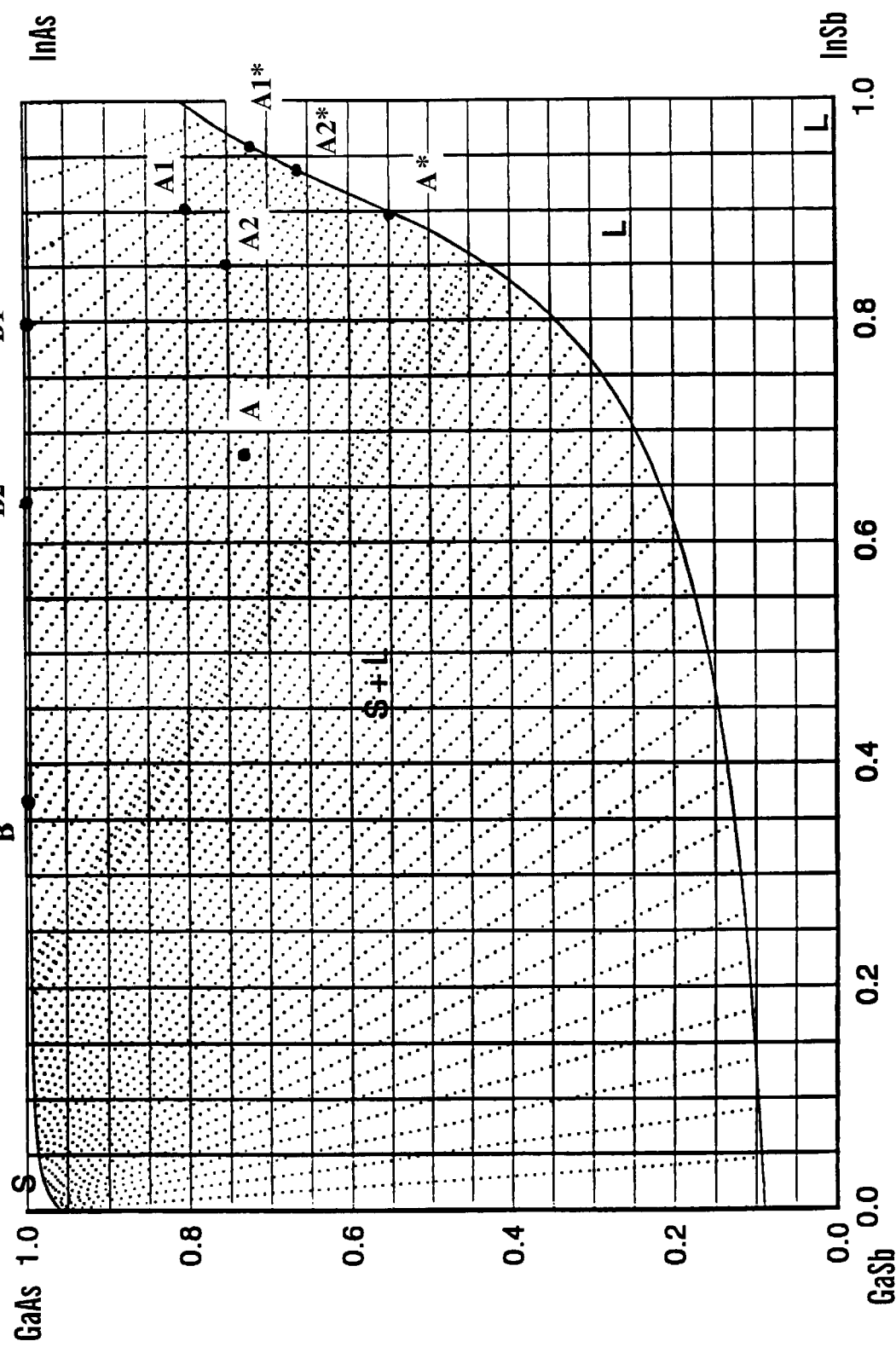
Figure 2I:
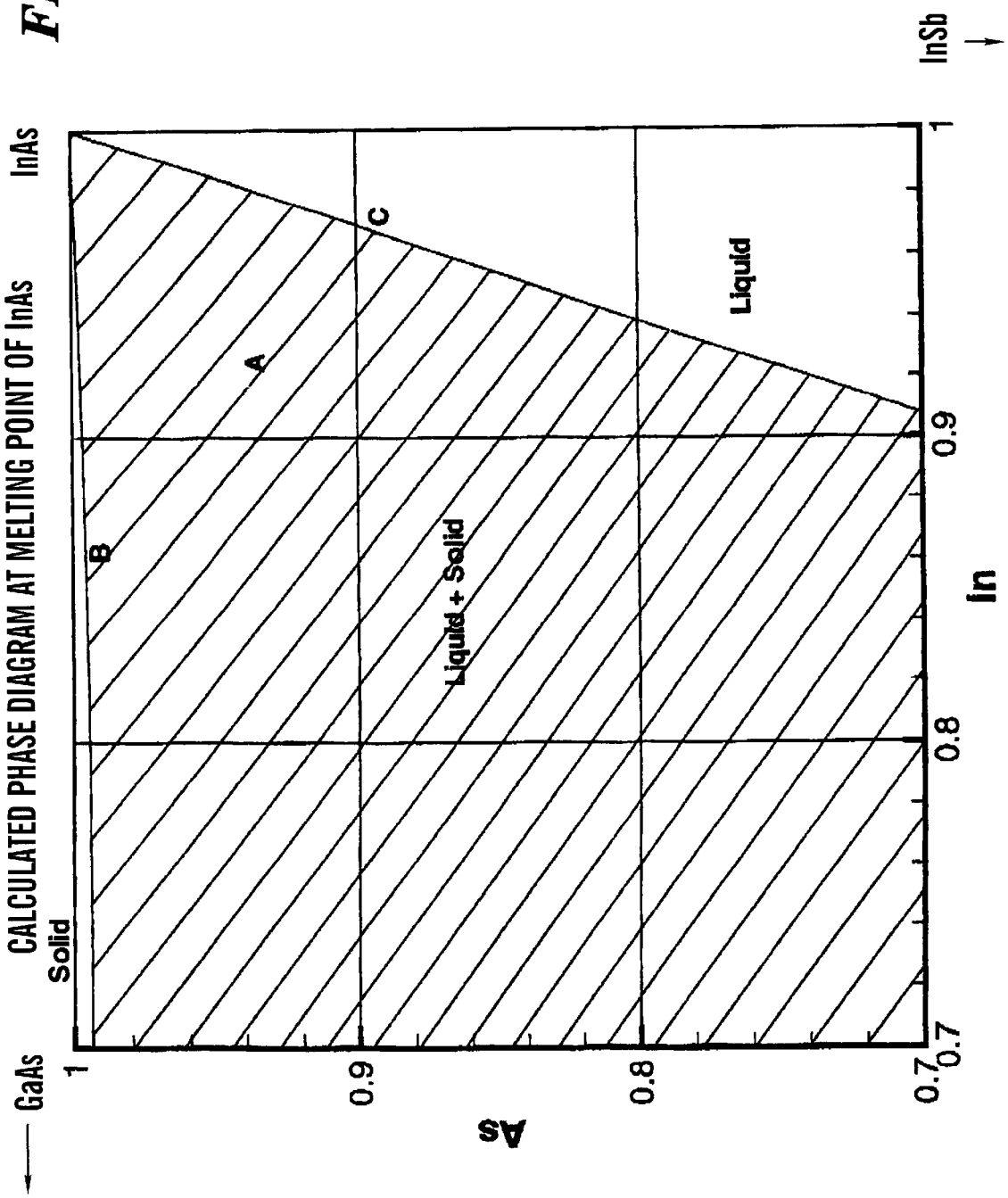
Figure 2J:
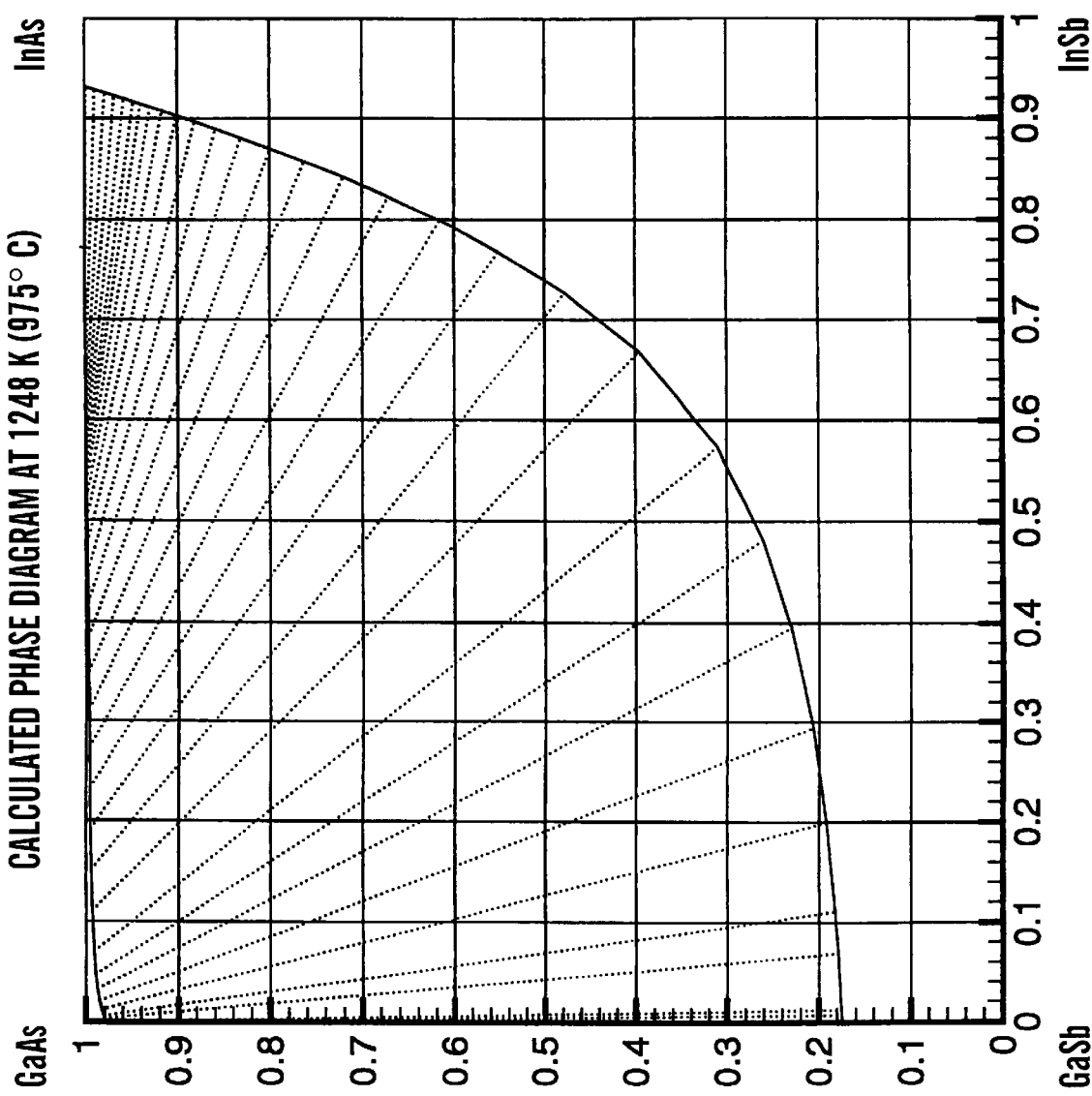
Figure 2K:
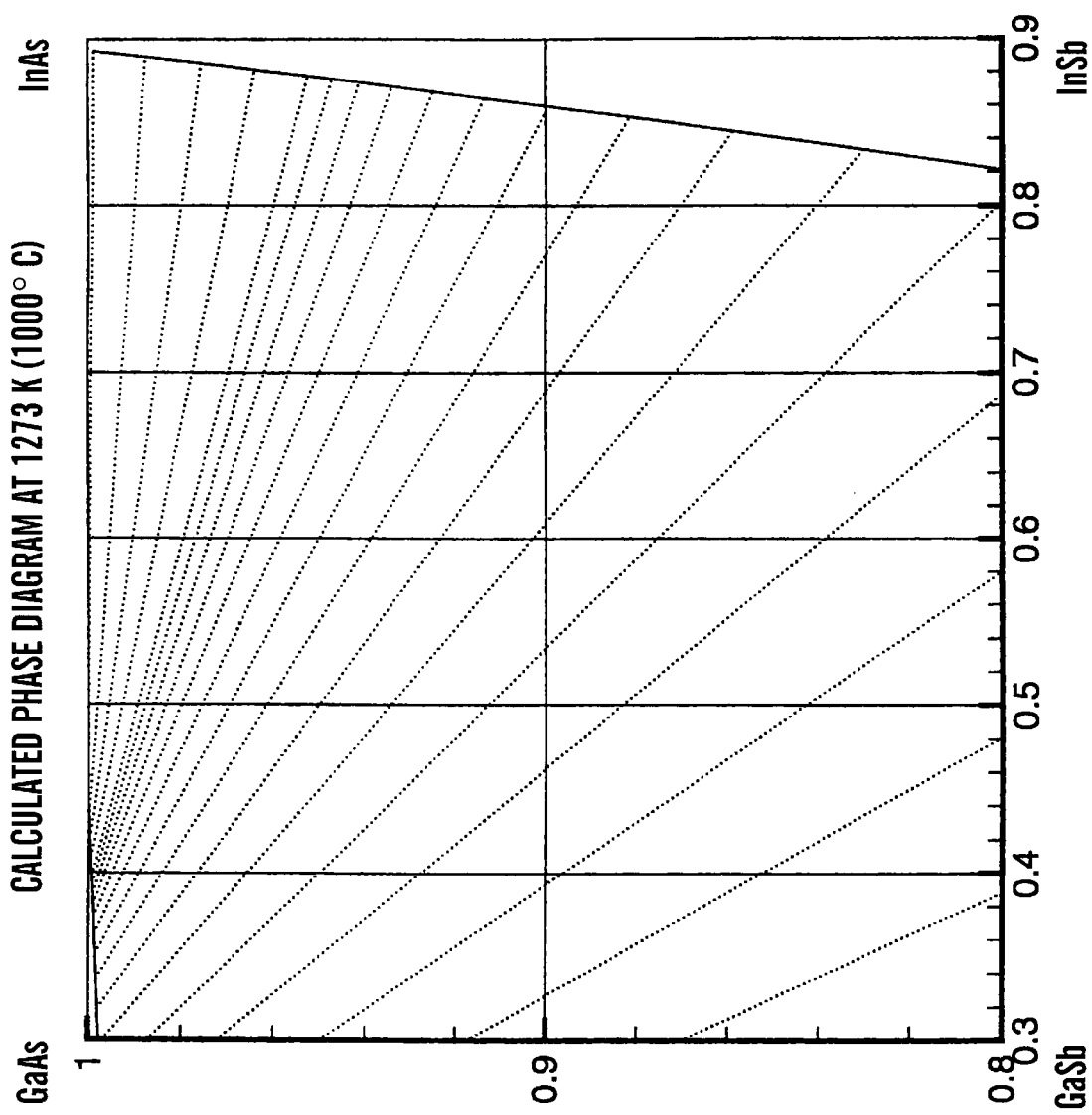
Figure 2L:
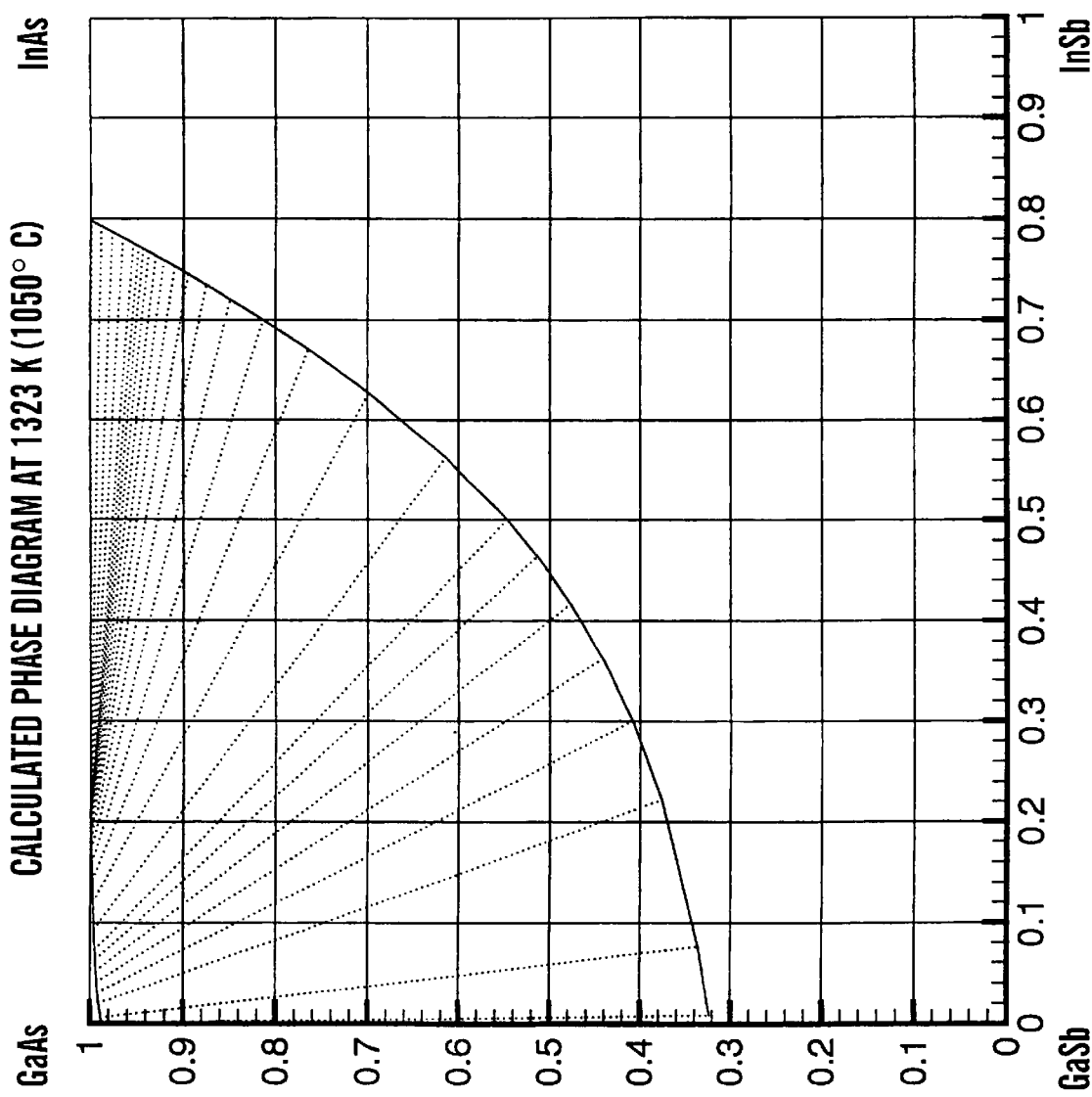
Figure 2M:
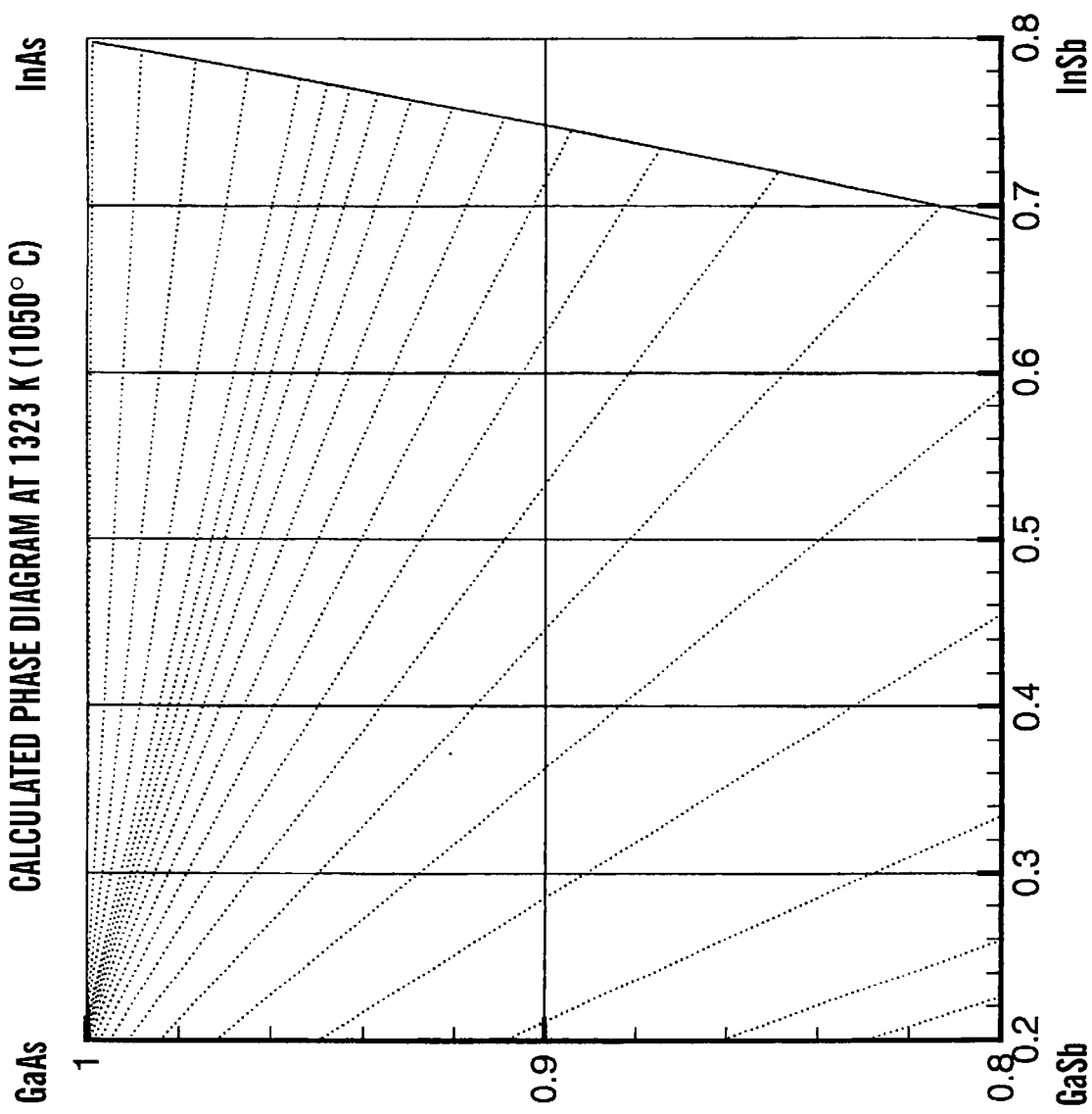
Figure 2N:
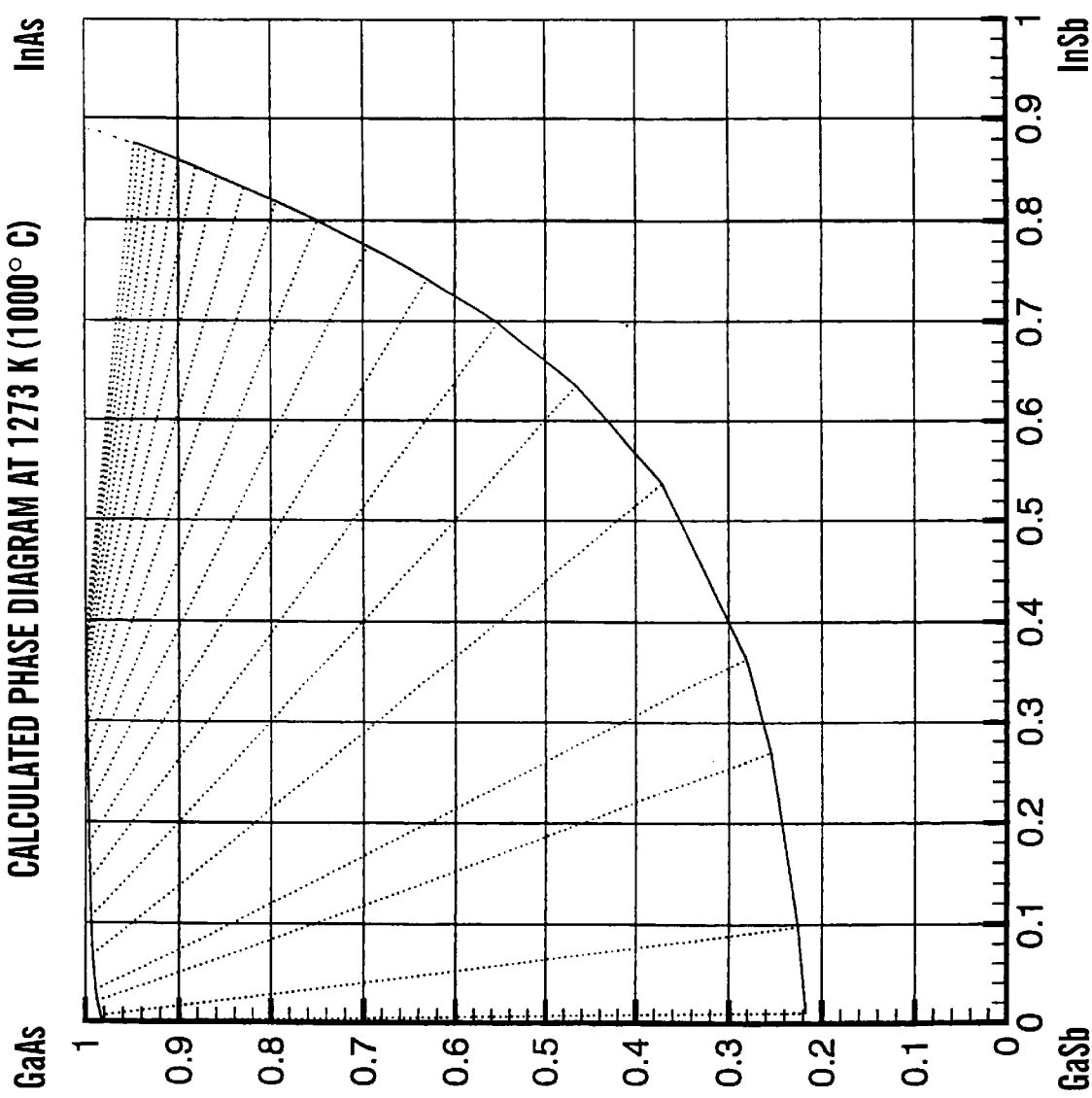
Figure 3A:
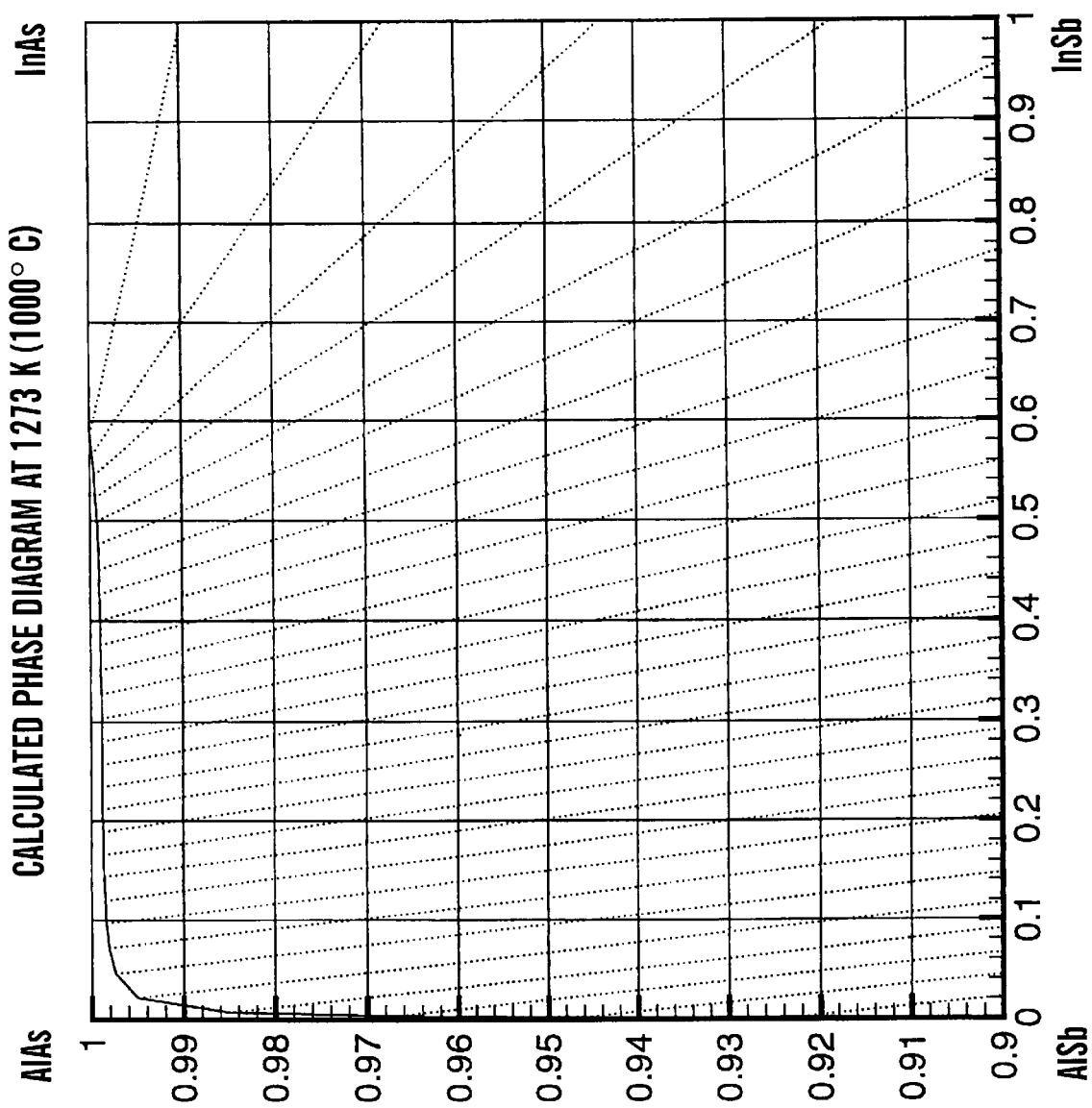
FIGS. 3A–3R are Al—In—As—Sb, Al—Ga—As—Sb, Ga—In—P—Sb, Al—In—P—Sb, and Zn—Cd—Se—Te phase diagrams at various temperatures showing tie lines (dashed lines) and isotherms representing boundaries of a miscibility gap (solid line) which can be used in the practice of a method of the present invention.
Figure 3B:
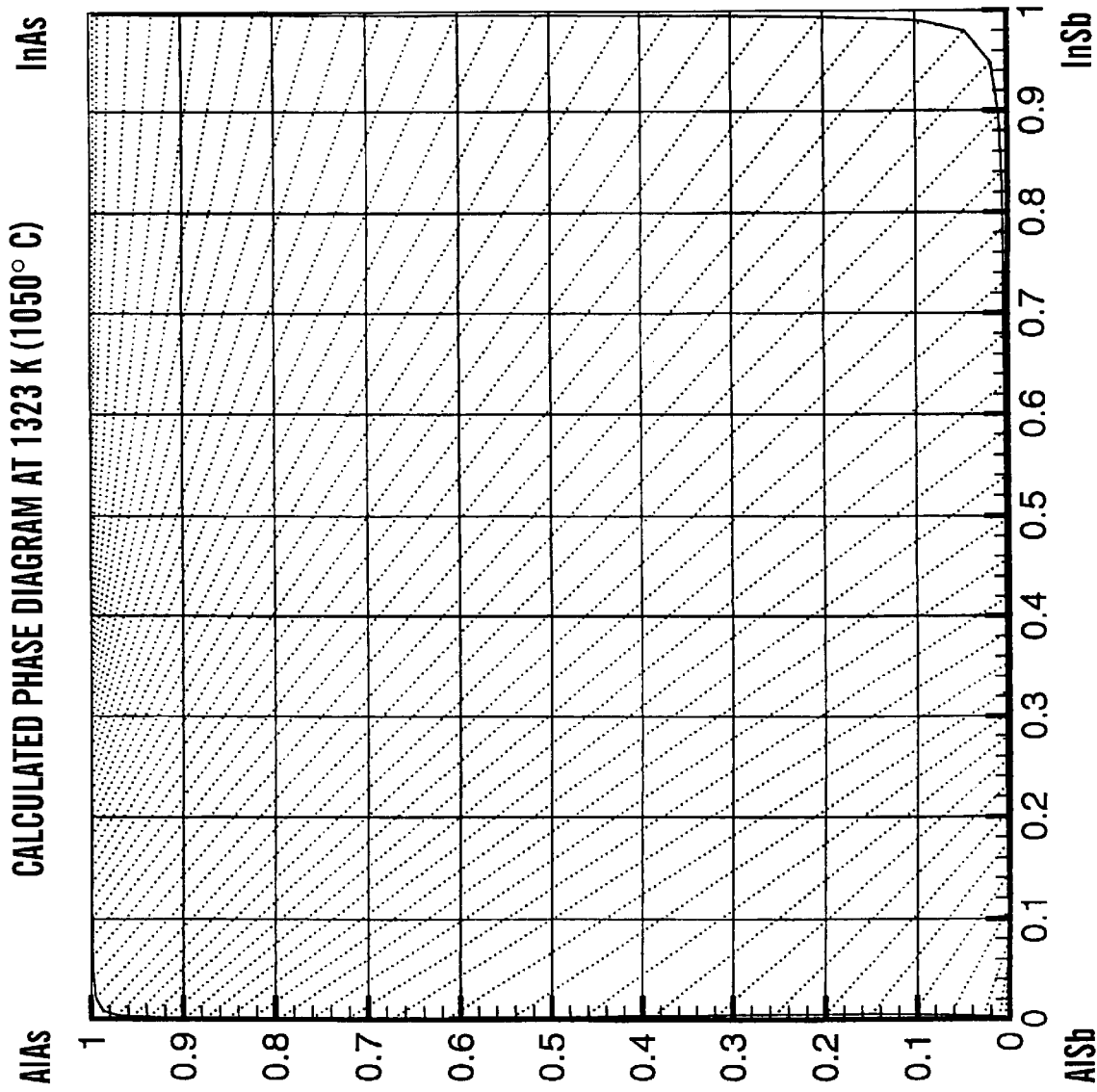
Figure 3C:
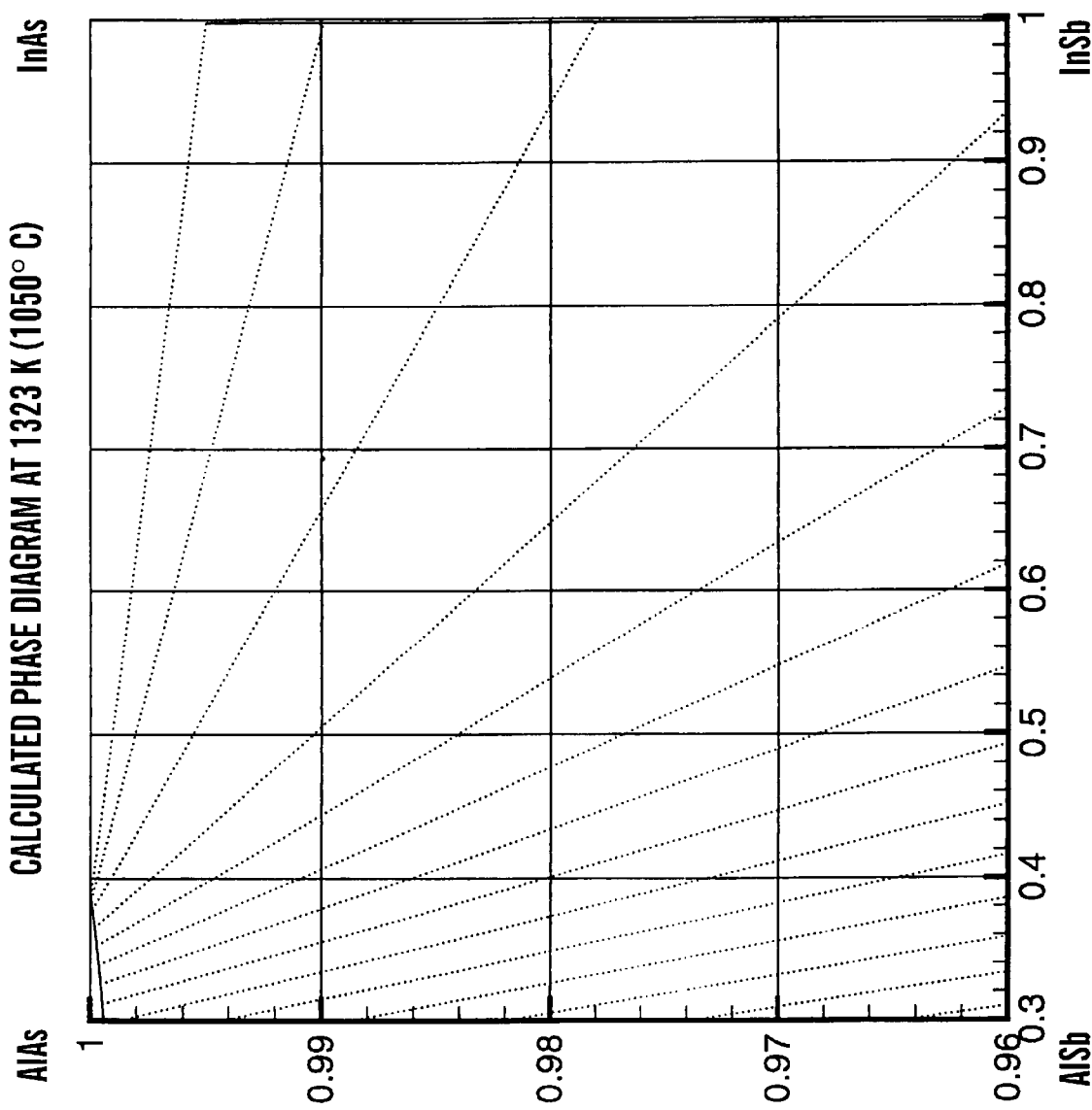
Figure 3D:
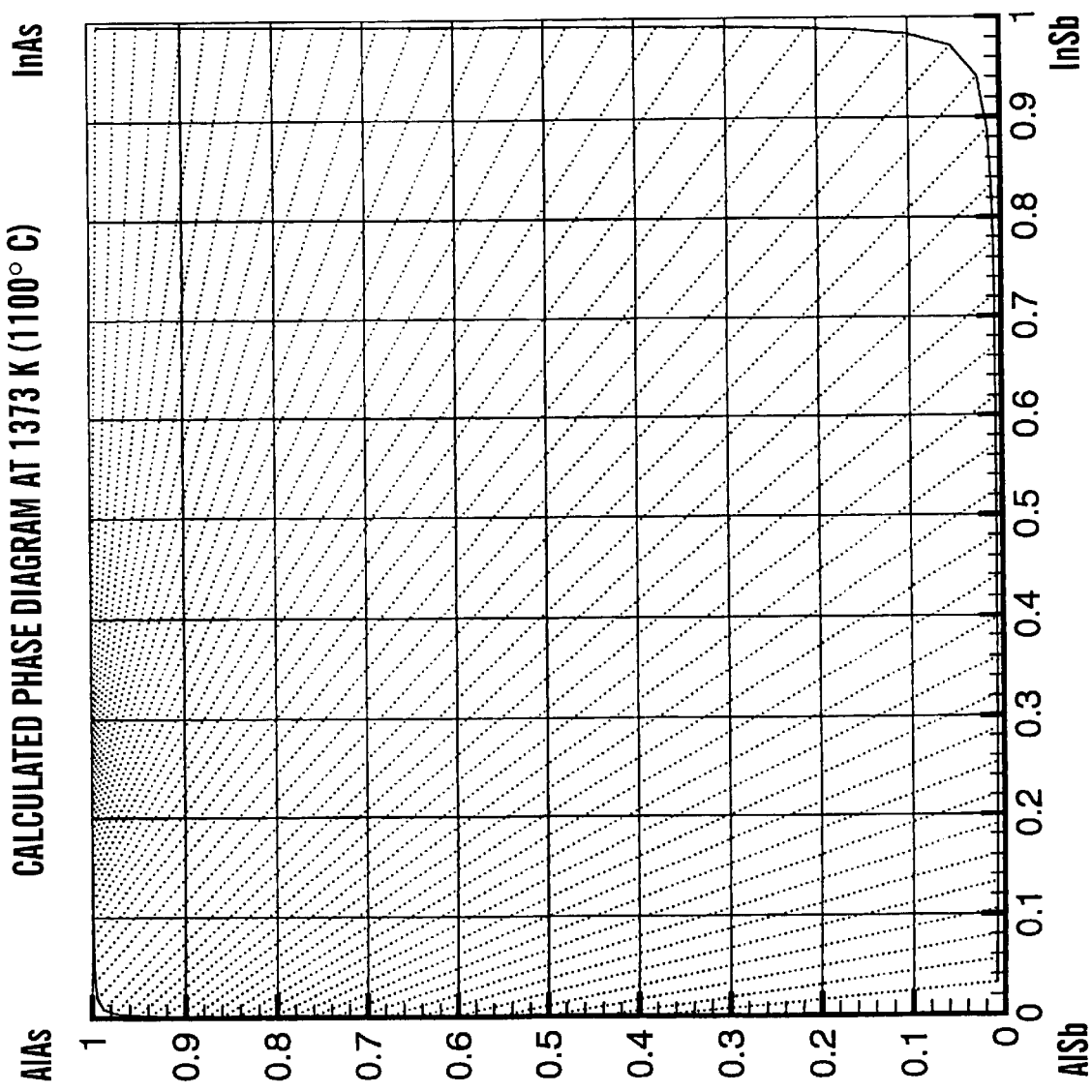
Figure 3E:
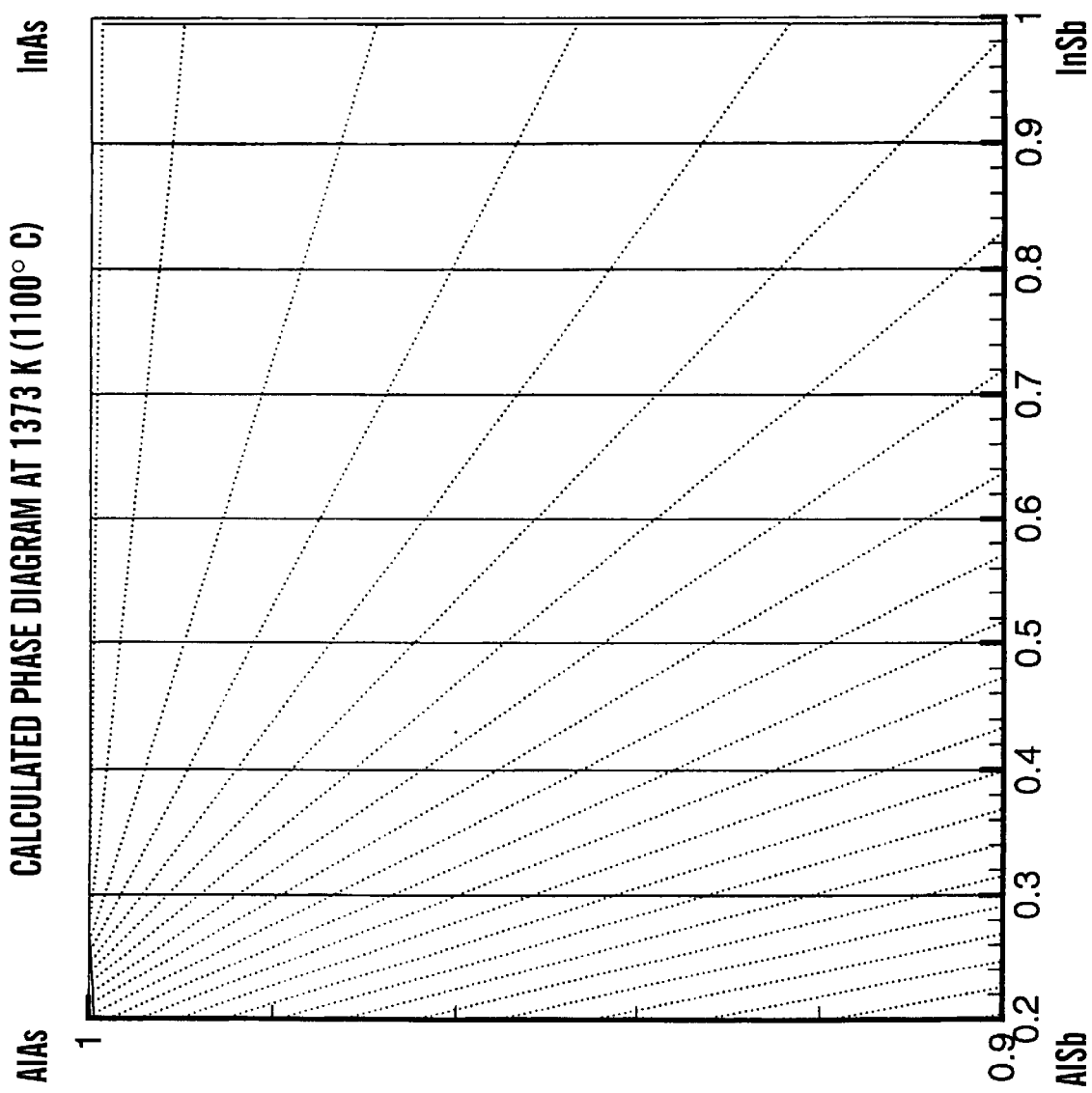
Figure 3F:
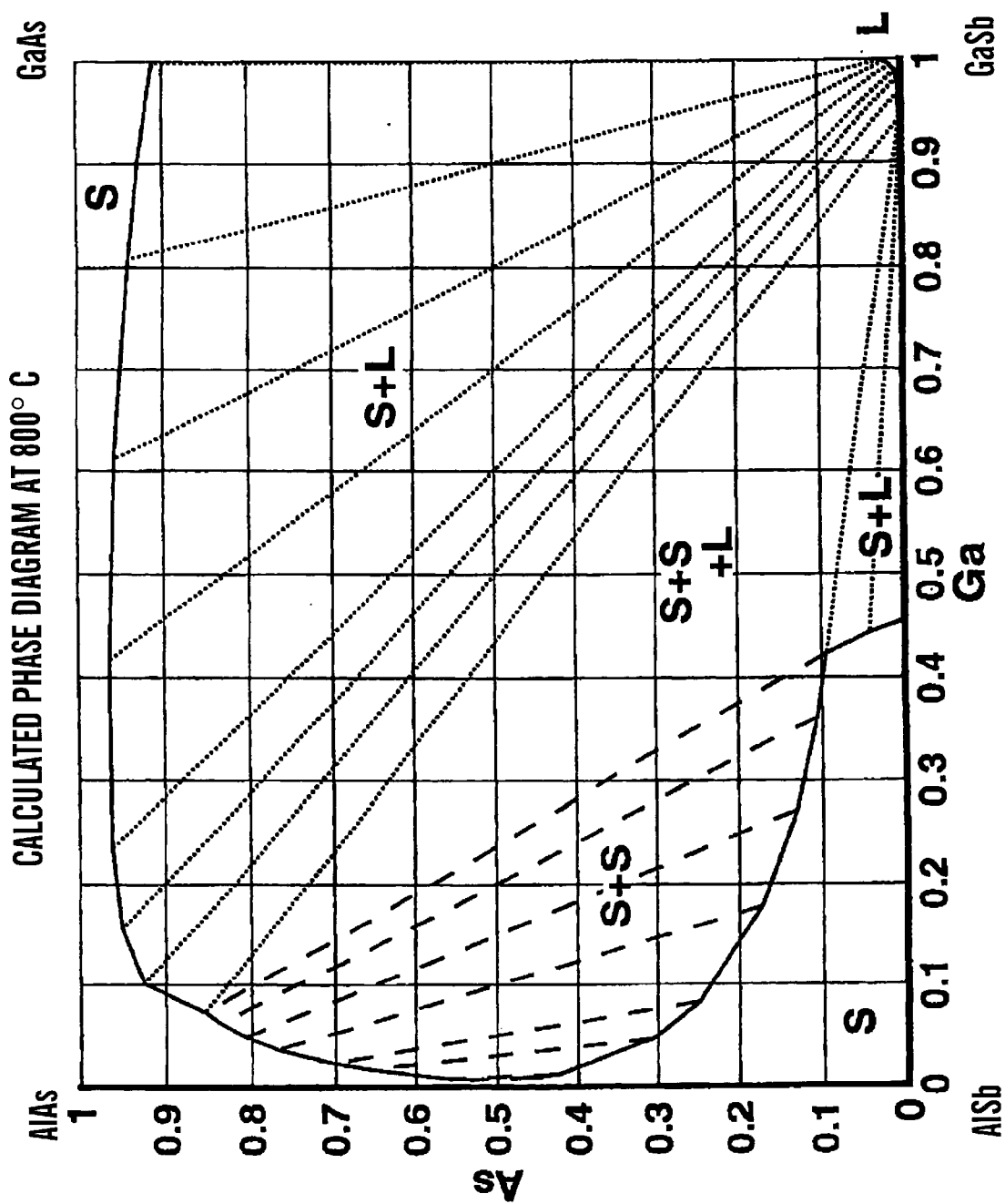
Figure 3H:
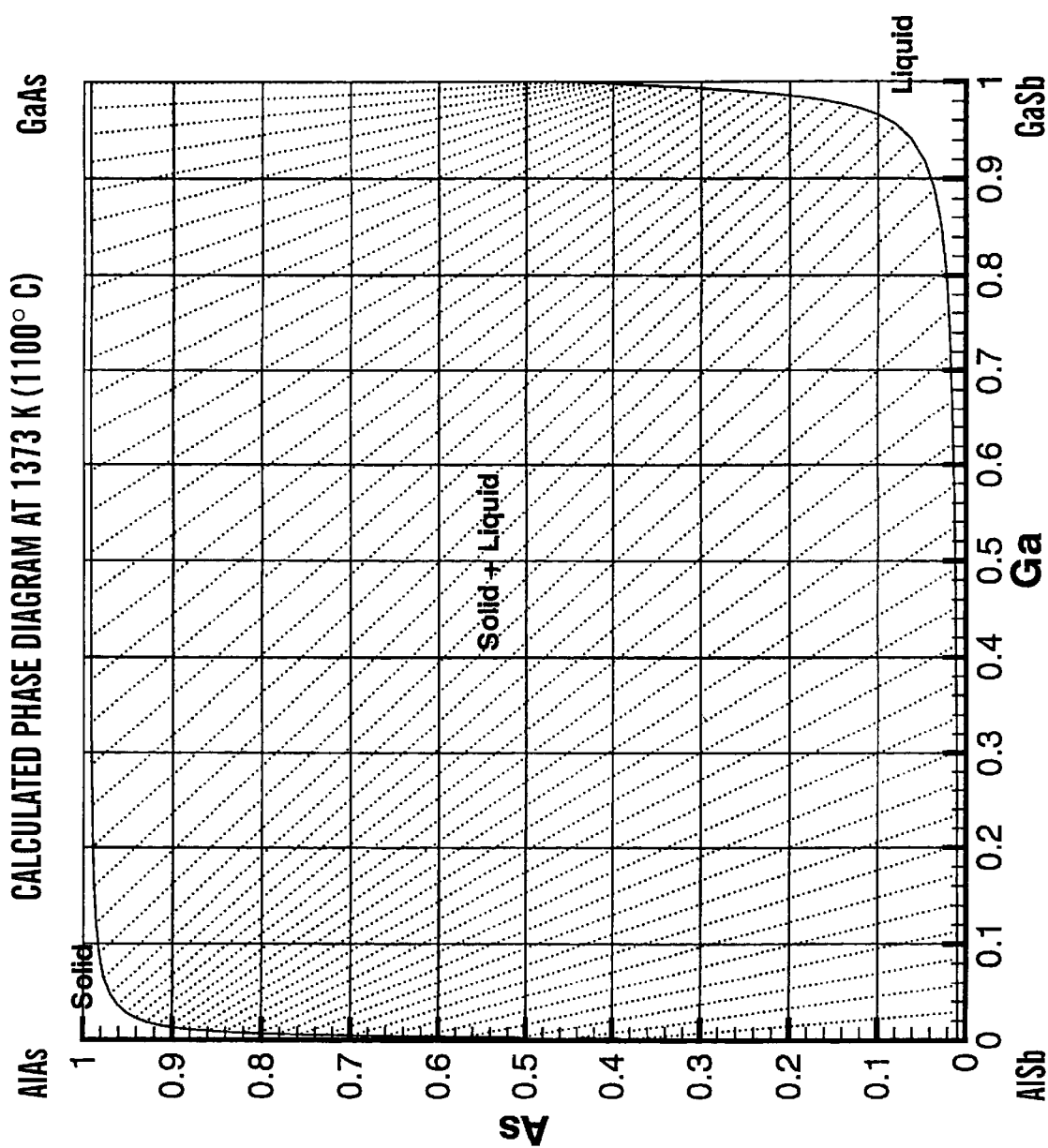
Figure 3I:
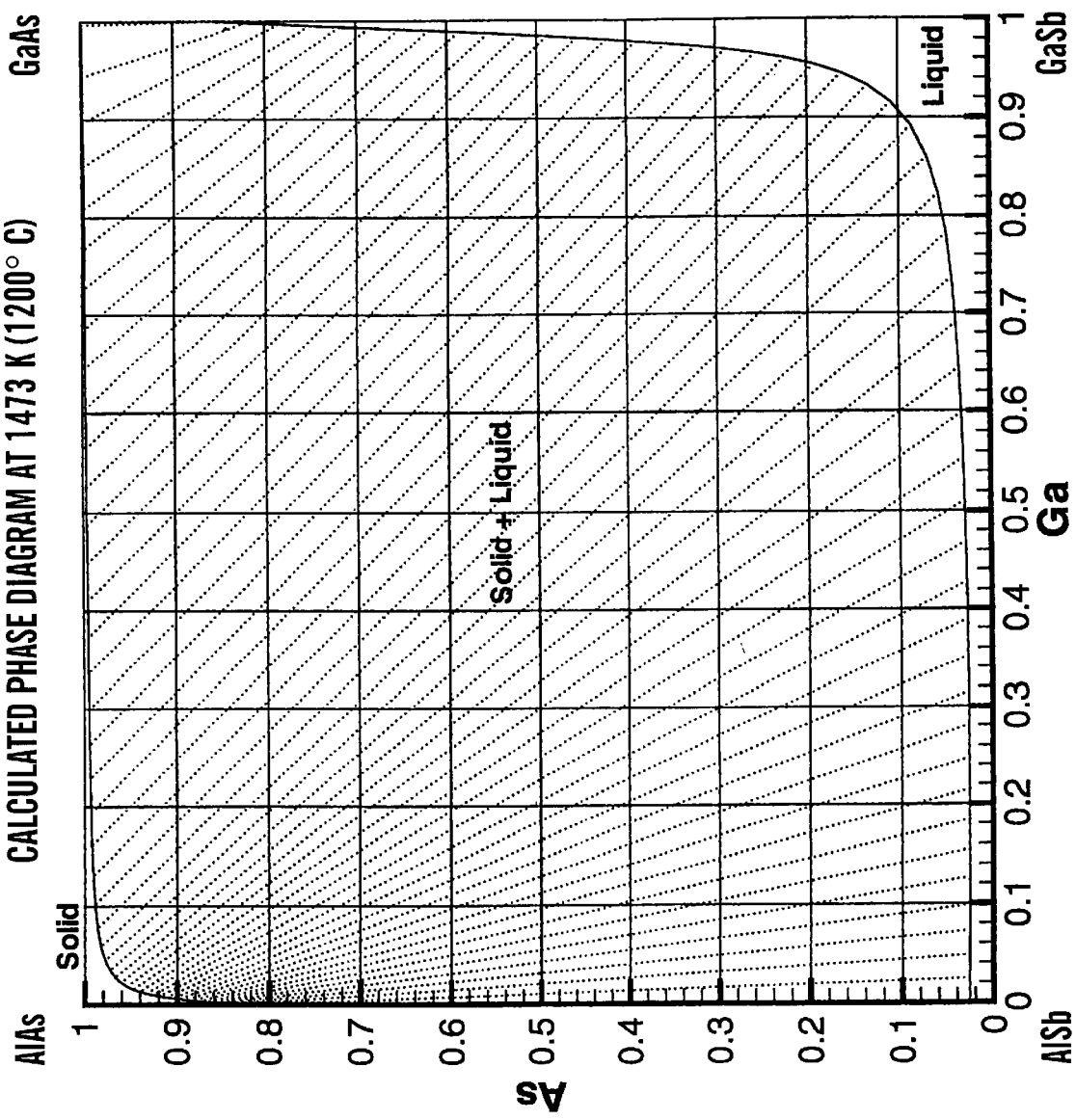
Figure 3J:
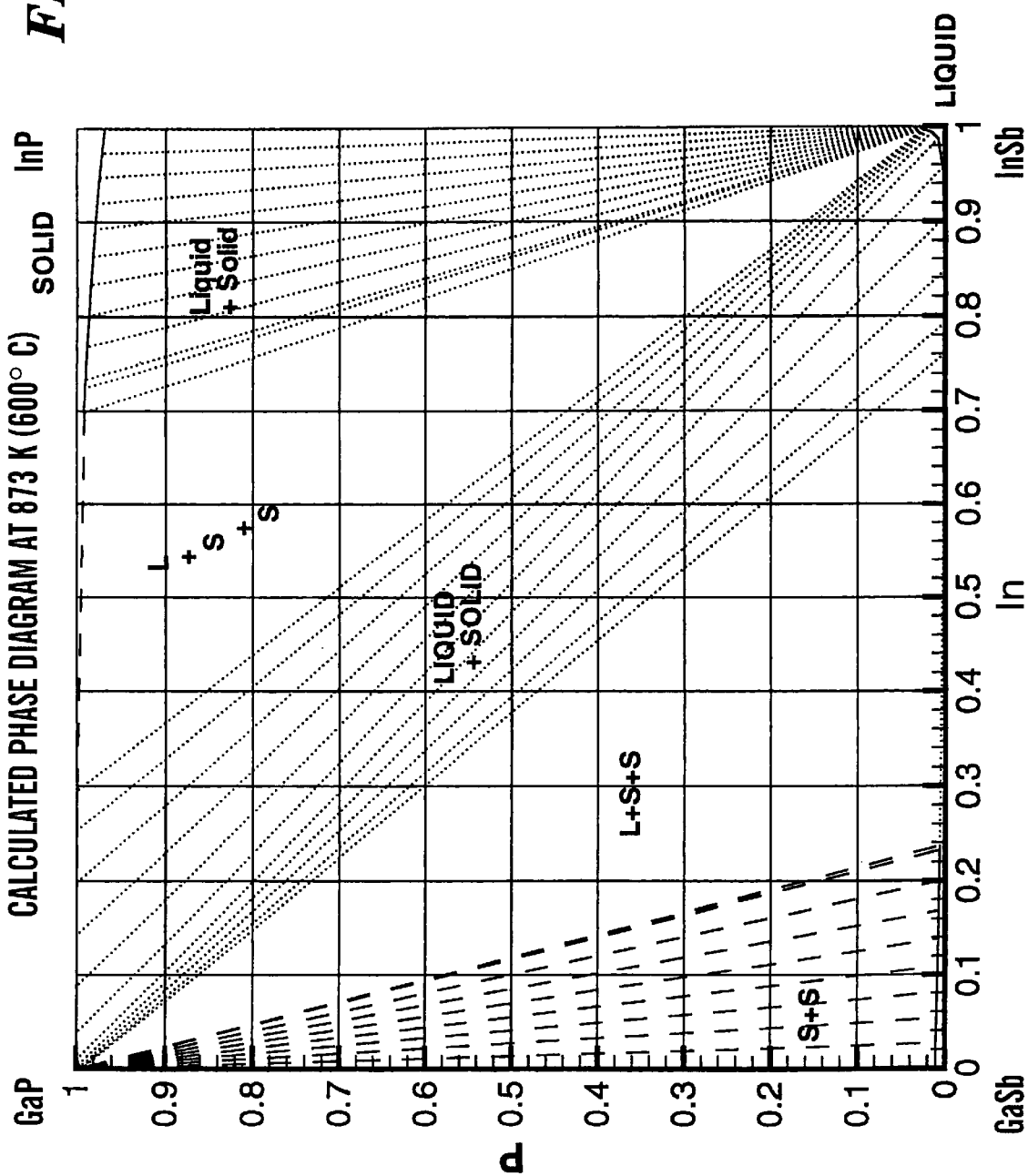
Figure 3K:
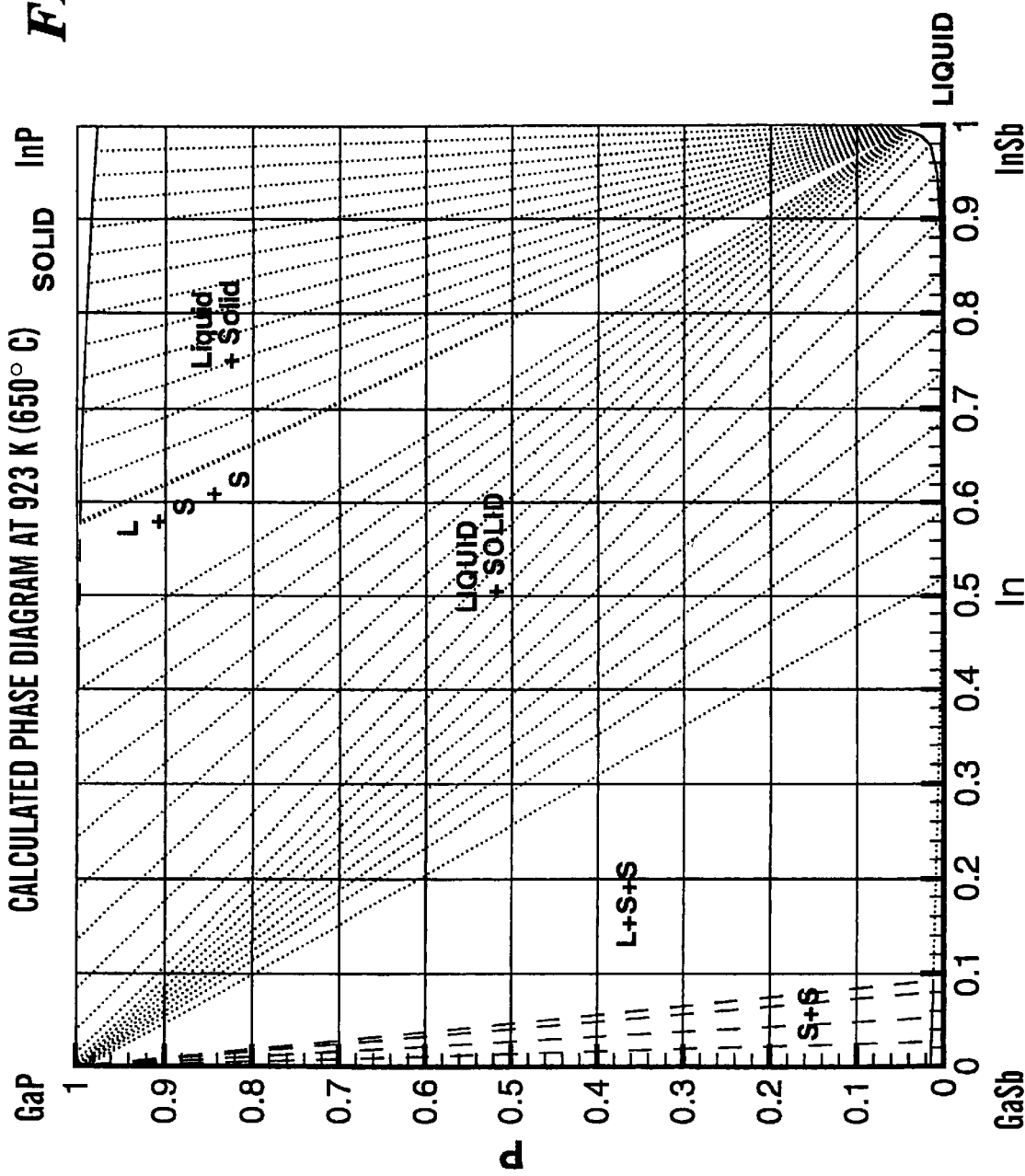
Figure 3L:
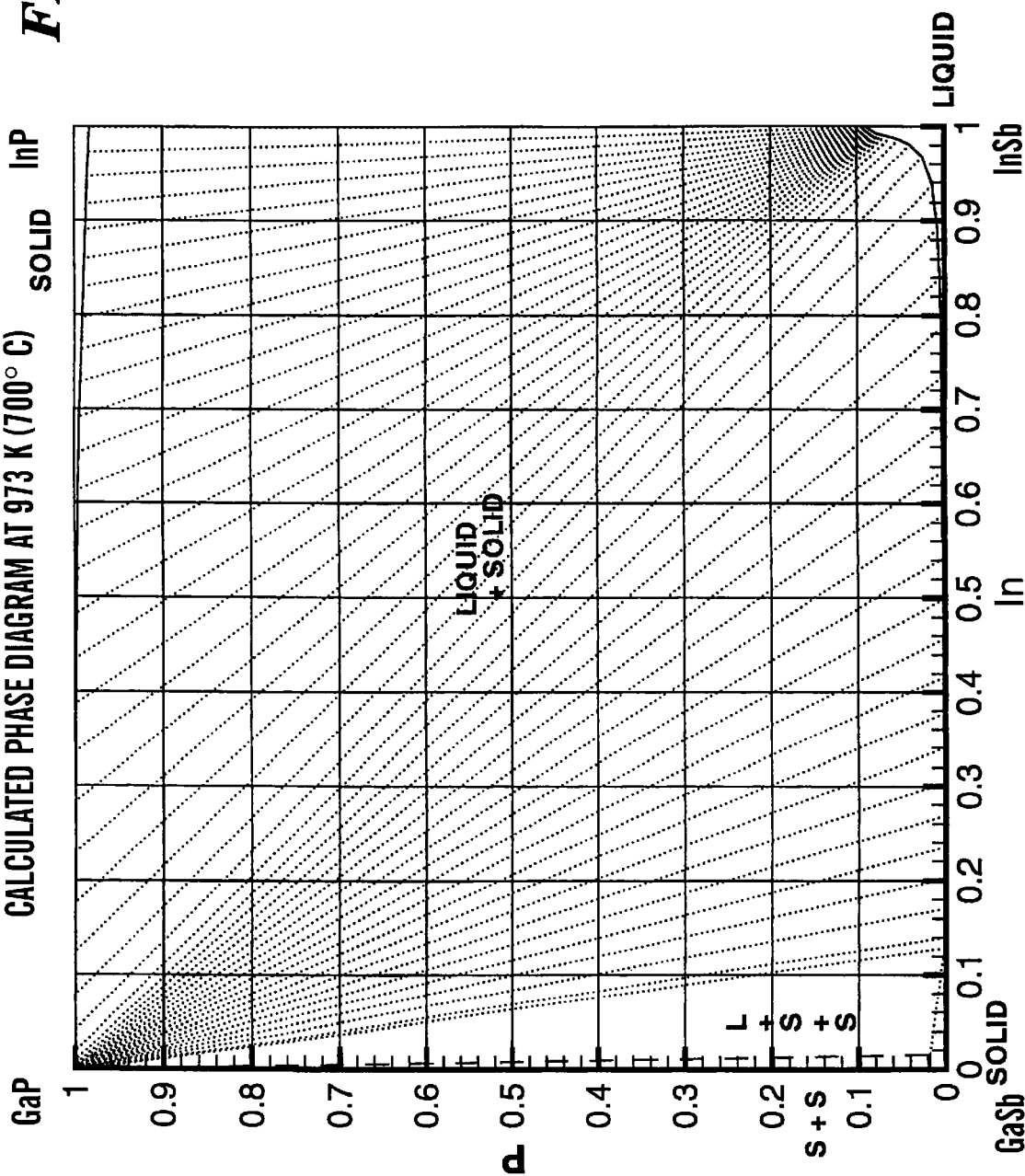
Figure 3M:
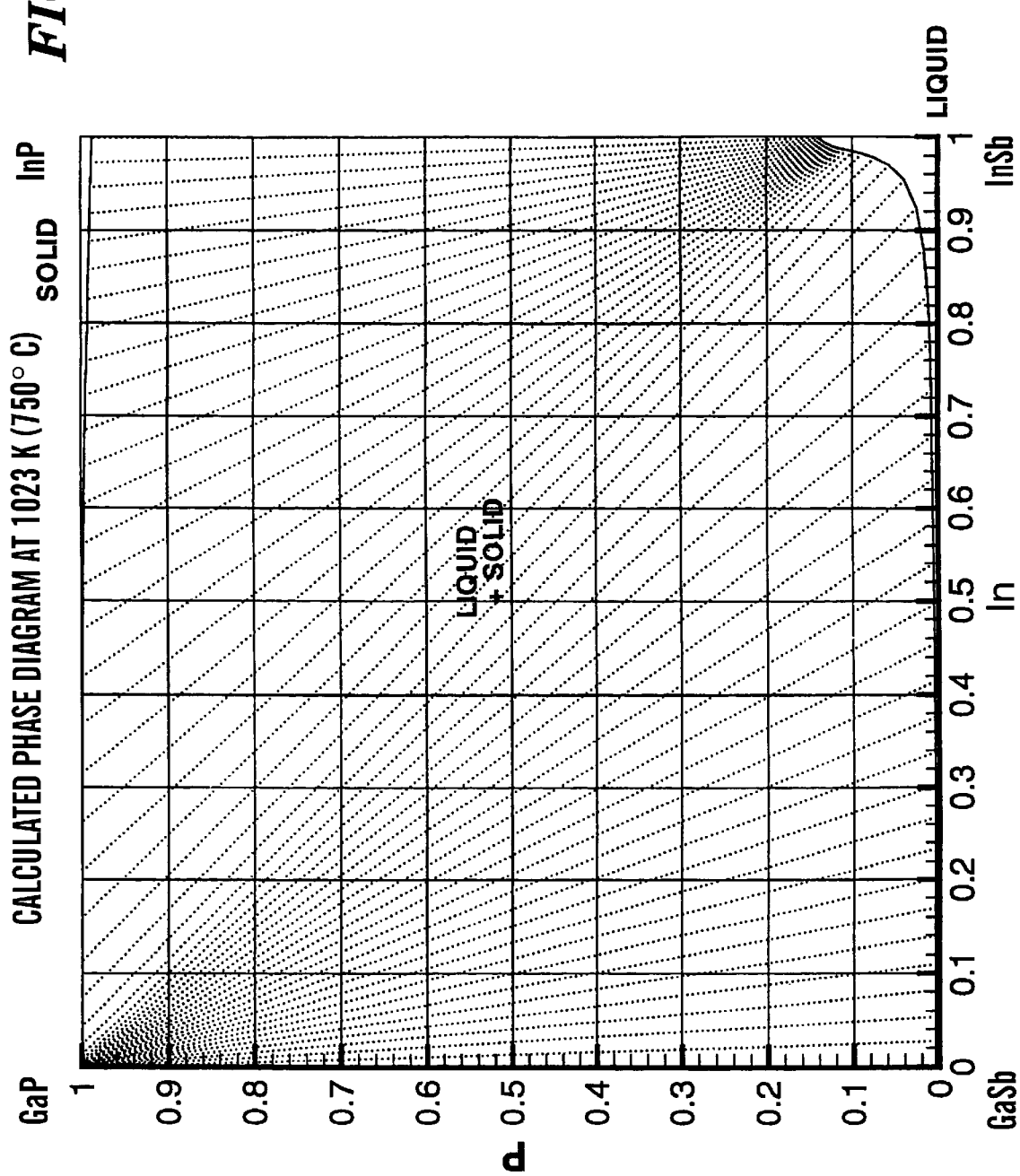
Figure 3N:
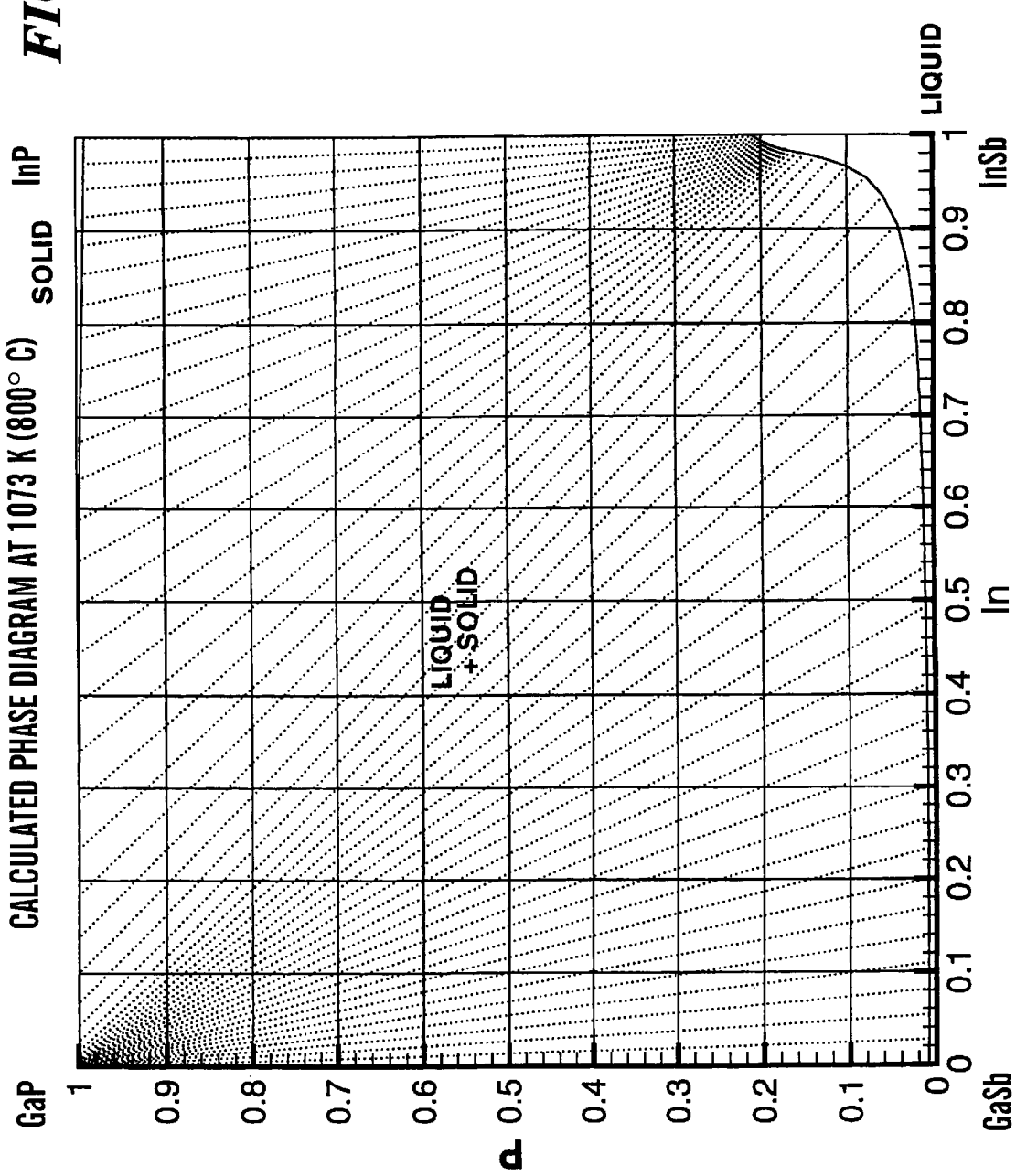
Figure 30:
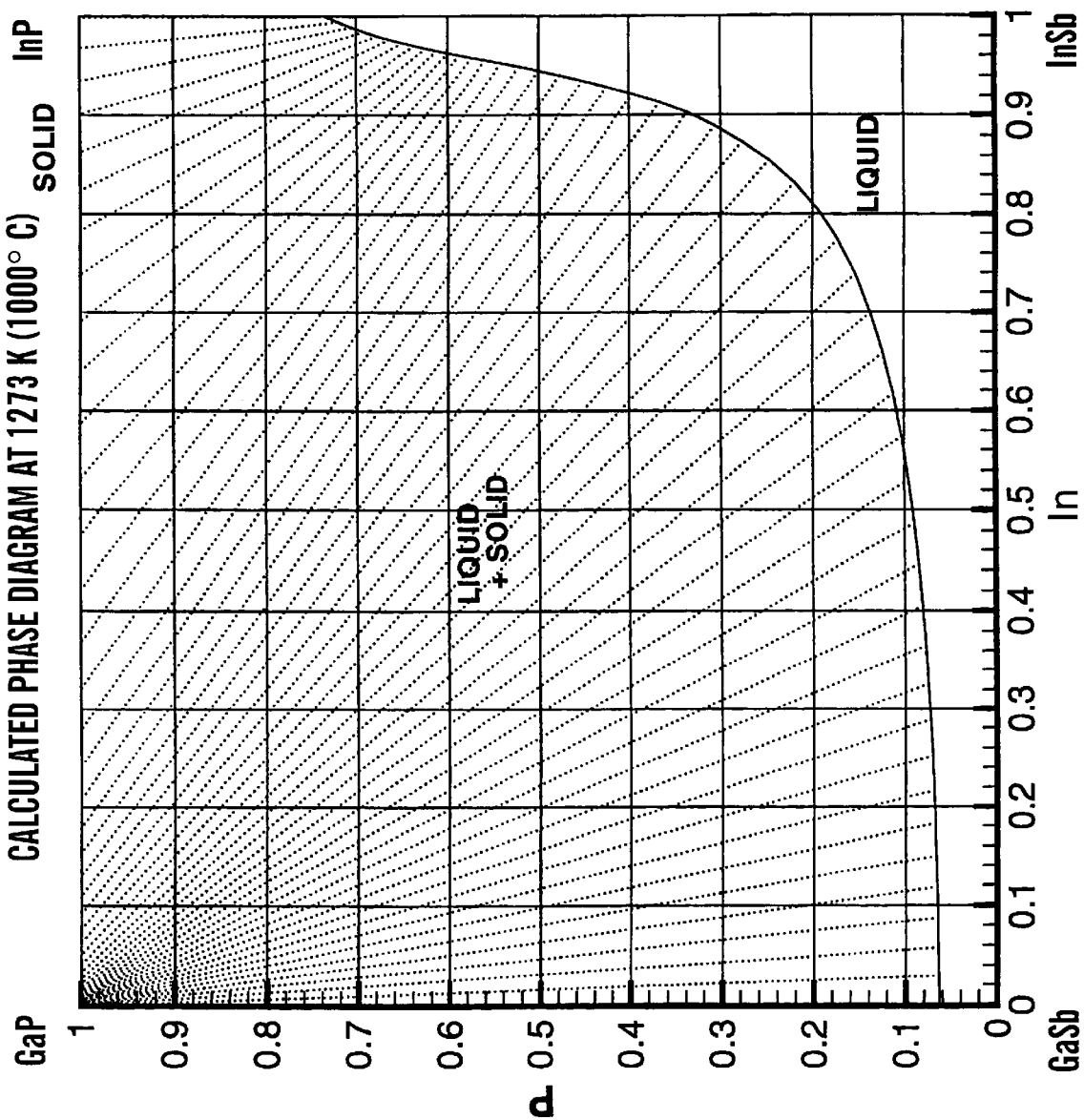
Figure 3P:
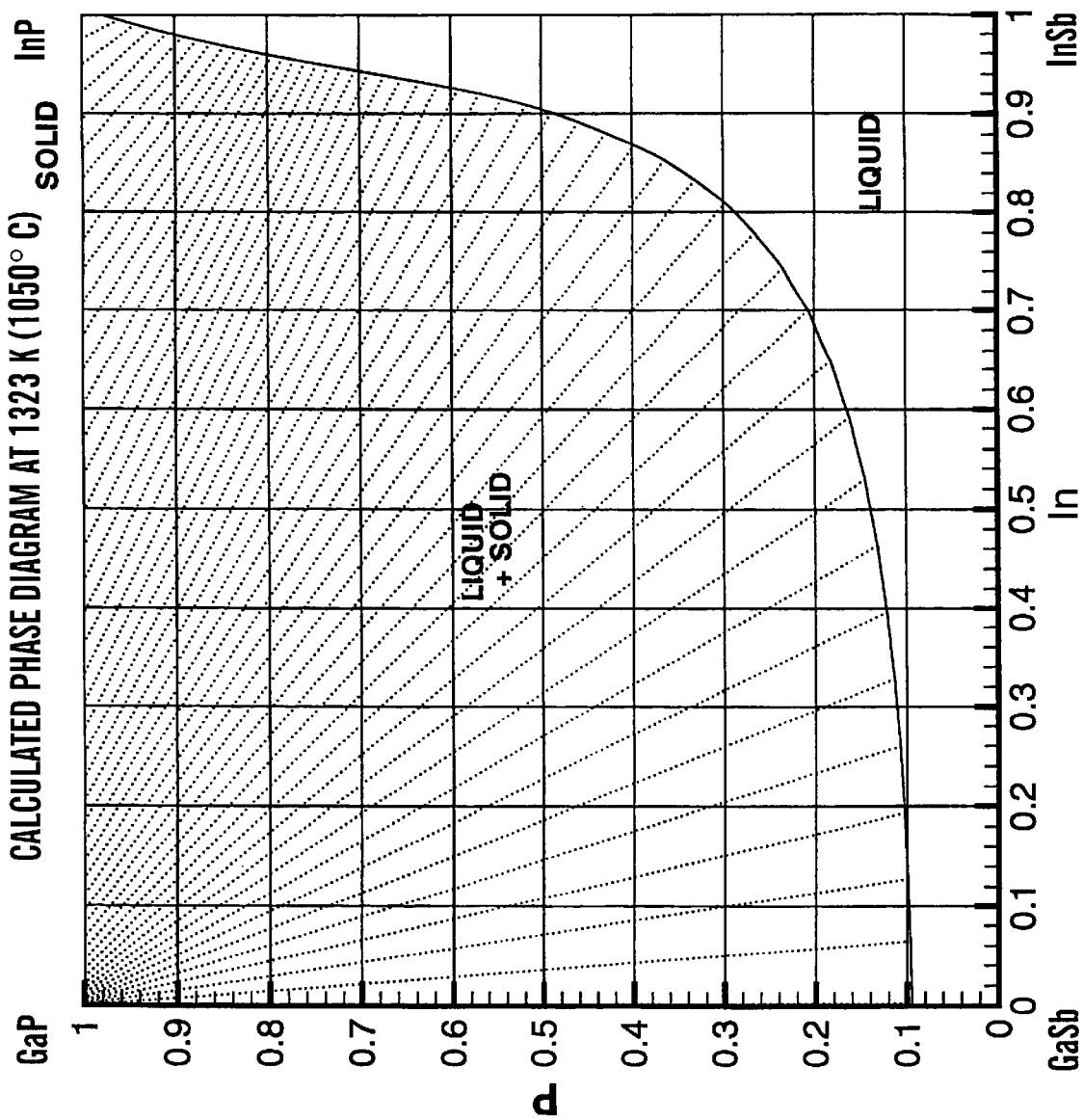
Figure 3Q:
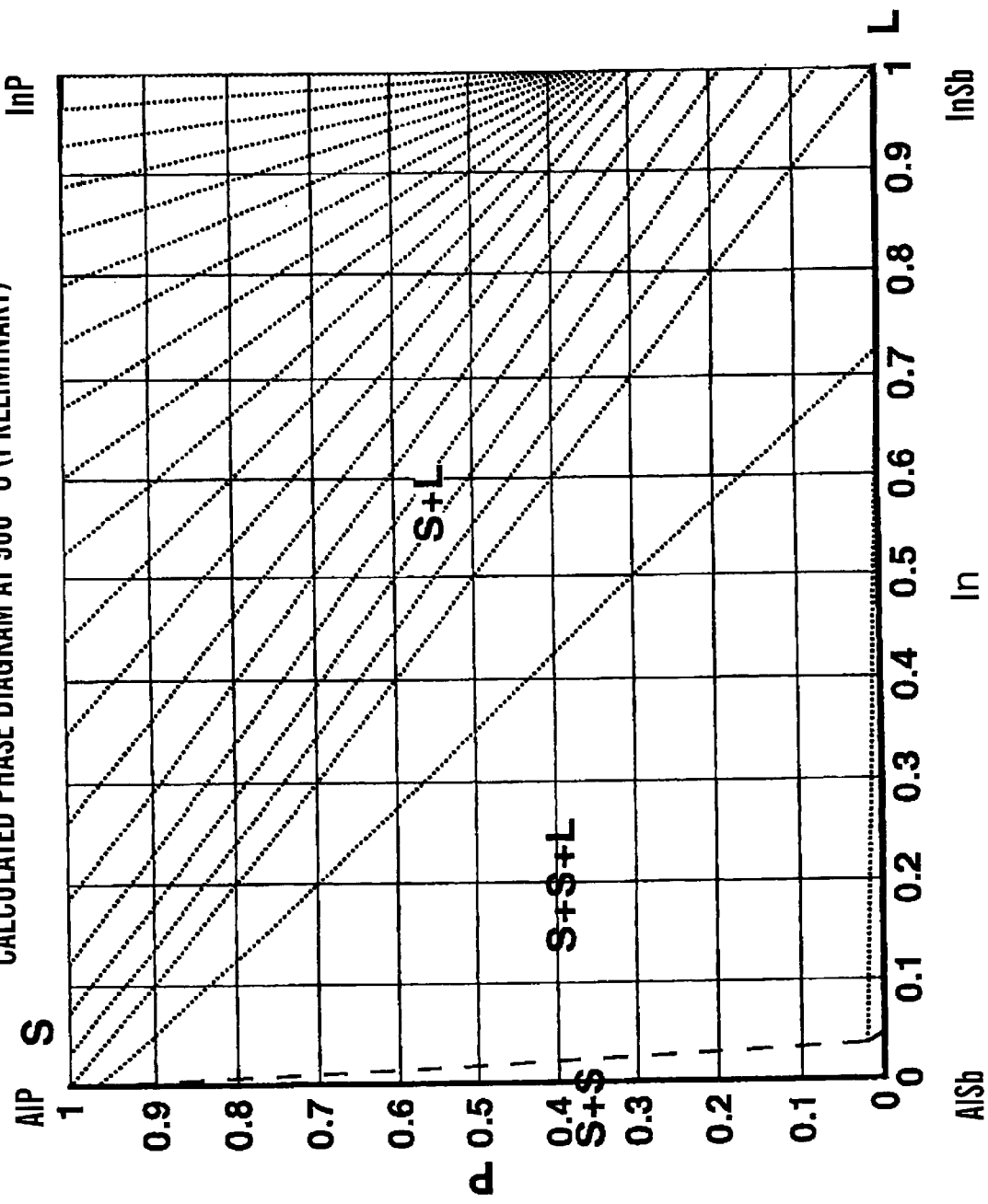
Figure 3R:
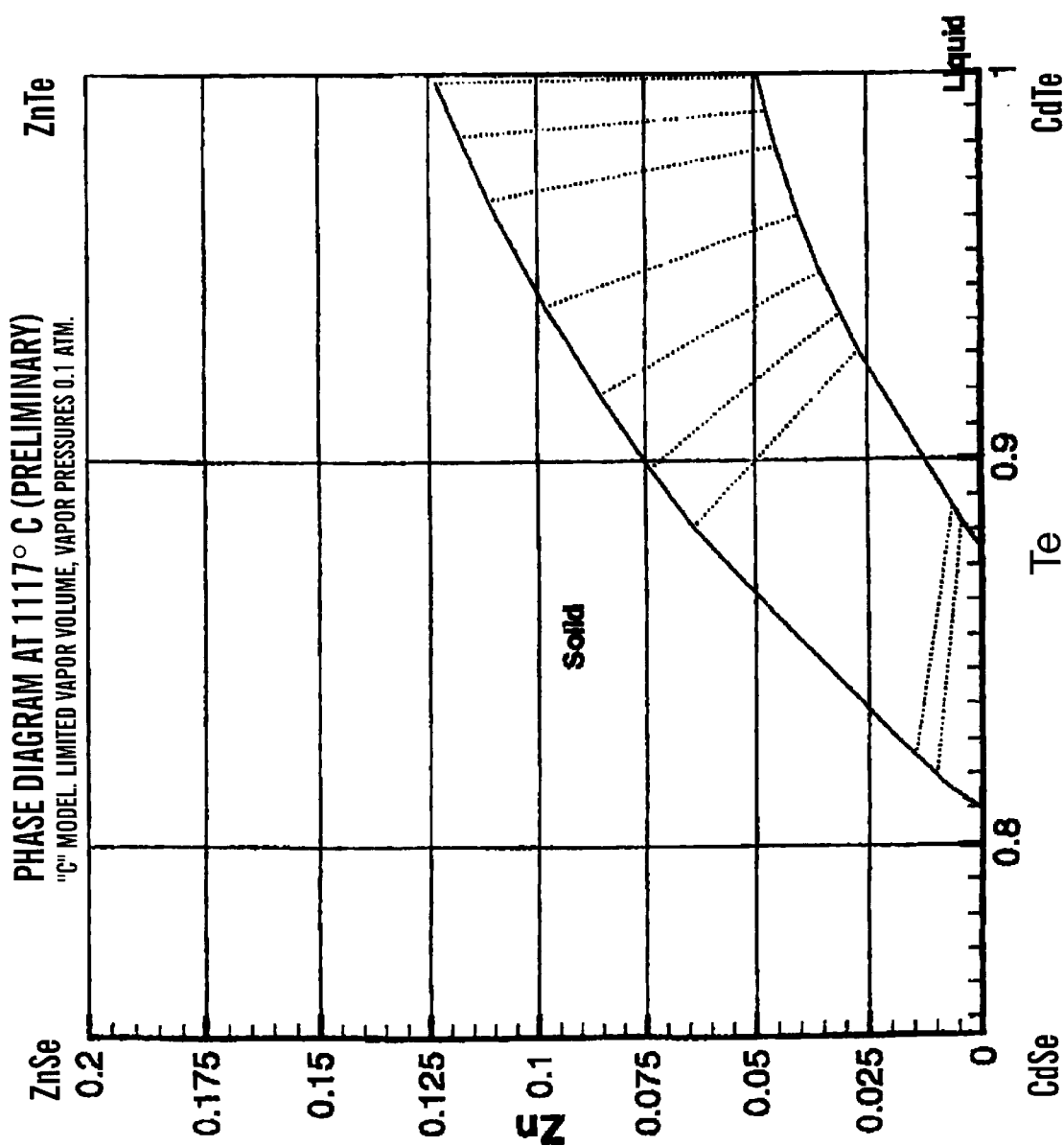

Rather than generating the family of phase diagrams, one can provide the family of phase diagrams by using pre-existing phase diagrams, such as the ones set forth herein in FIGS. 1A–1Z, in FIGS. 2A–2V, and in FIGS. 3A–3R.

Once the family of phase diagrams is provided, the family of phase diagrams is used to select a quaternary melt composition and an alloy growth temperature for making the desired ternary or quaternary alloy. Generally, to make a ternary or quaternary alloy having a given composition, one selects a quaternary melt composition which lies on a tie line which terminates at a point on the solidus curve which corresponds to the desired ternary or quaternary alloy composition at a given temperature. If one selects a quaternary melt composition lying close to the solidus curve, the amount of material having uniform composition will be relatively large, whereas, if one selects a quaternary melt composition lying further from the solidus curve, the mount of material having uniform composition will be smaller. This principle is illustrated in the examples provided hereinbelow. However, maximizing yield by starting with a liquid composition as close as possible to the desired solid composition (i.e., at a position on the tie line close to the solidus curve) increases the risk of nucleation within the bulk liquid, and, thus, increases the risk of inhomogeneities within the crystal. Accordingly, it is sometimes advantageous to sacrifice yield to ensure crystal homogeneity by selecting a starting liquid composition such that the ratio of the distance (along the tie line) from the starting composition to the solidus curve to the distance (along the tie line) from the liquidus curve to the solidus curve is between about 1:100 to 50:100, such as between about 5:100 and 40:100, between about 10:100 and 35:100, or between about 20:100 and 30:100.

Having selected the quaternary melt composition and an alloy growth temperature for making the desired ternary or quaternary alloy, one then provides a quaternary melt having the selected quaternary melt composition. This can be done by mixing together four elements, for example, A, B, C, and D; it can be done by mixing together two binary compounds, such as AB and CD; or it can be done by mixing a binary compound (e.g., AB) with two elements (e.g., C and D). Illustratively, the quaternary melt can include at least four quaternary melt elements, two of which are Group III elements (e.g., selected from the group consisting of aluminum, gallium, and indium) and two of which are Group V elements (e.g., selected from the group consisting of phosphorus, arsenic, and antimony). Further illustratively, the quaternary melt can include at least four quaternary melt elements, two of which are Group II elements (e.g., selected from the group consisting of zinc, cadmium, and mercury) and two of which are Group VI elements (e.g., selected from the group consisting of sulfur, selenium, and tellurium). Typically, A, B, C, and D; AB and CD; or AB, C, and D are contacted with each other in a suitable container, such as a crucible (e.g., a silica crucible or a pyrolytic boron nitride ("pBN") crucible), and the container and materials contained therein are heated to a temperature which permits some of A, B, C, D, AB, and CD, to melt and which permits the remaining of A, B, C, D, AB, and CD to dissolve in the melted components. Preferably, the temperature to which crucible and materials contained therein are heated is the selected growth temperature. Heating can be carried out in any suitable apparatus, such as a furnace. Preferably, the materials contained in the crucible are thoroughly mixed or homogenized, for example, by using the mechanical agitation techniques described hereinbelow.

Optionally, dopants can be added to the melt prior to crystal growth, or dopants can be added to the mixture of quaternary melt starting materials prior to melting the starting materials. Suitable dopants include any material which may impart desirable properties (e.g., desirable electrical properties) to the ternary or quaternary material made from the process of the present invention, such as any material which is commonly used in conventional binary, ternary, quaternary alloys. Examples of such dopants include an n-type dopant, such as tellurium, selenium, and sulfur, and p-type dopants, such as zinc, cadmium, and the like. Preferably, the n-type or p-type dopant is used in an amount effective to make the alloy a n-type or p-type semiconductor, respectively. Suitable amounts of these types of dopants can range from about 1 ppm to about 1000 ppm, preferably from about 10 ppm to about 100 ppm, per unit weight of the quaternary melt composition. Preferably, the dopant does not contain any element which is present in the quaternary melt's starting components. For example, where the quaternary melt contains Ga, Sb, Zn, and Te, it is preferable to use an n-type dopant other than a tellurium-containing dopant. Similarly, when a p-type dopant is employed in this material, it is preferable not to use zinc as the p-type dopant.

As indicated above, the method of the present invention also includes growing a ternary or quaternary alloy from the quaternary melt at the selected alloy growth temperature. Growth can be carried out by reducing the quaternary melt's temperature, for example, by discontinuing heating or slowly reducing the heat output of the furnace in which heating was effected. Preferably, the ternary or quaternary alloy is grown under conditions effective to produce a single crystal. Generally, this involves a slow and controlled growth process. For example, directional solidification techniques, such as those described in Hurle et al., ed., *Handbook of Crystal Growth*, Vol. 2A, Amsterdam: Elsevier Science B. V. (1994) ("Hurle"), which is hereby incorporated by reference, can be employed. These directional solidification techniques are meant to include vertical or horizontal gradient freeze techniques, as well as directional solidification techniques, such as those described in Hurle, which is hereby incorporated by reference. Alternatively, the melt can be solidified using the Czochralski method (which is meant to include the Liquid Encapsulated Czochralski ("LEC") method and Czochralski methods which employ inert gas overpressure and/or seed crystals), which is described, for example, in Hurle, which is hereby incorporated by reference. In the case where the quaternary melt includes Ga, Sb, In, and As, a GaSb seed can be used in the Czochralski method for alloys with low solidification temperatures (i.e., where the alloy has low InAs molar content). InAs seed can be used in the Czochralski method, irrespective of the GaSb/InAs molar ratio in the alloy. Various Bridgman methods, including the vertical Bridgman method and the horizontal Bridgman method can be employed. The Bridgman method is generally described in Hurle, which is hereby incorporated by reference. The floating zone method (described, for example, in Hurle, which is hereby incorporated by reference) can also be used to promote single crystal growth.

Additionally or alternatively to the methods described above, single crystal solidification can be carried out by contacting the melt with a seed crystal. Contact of the seed crystal with the melt can be effected by simply dipping the seed crystal, optionally attached to a substrate, into the solution. Preferably, the seed crystal has a lattice constant similar to the alloy lattice constant and a melting point higher than the selected growth temperature. In addition, it is preferred that the seed crystal have a lattice constant similar to the lattice constant of the alloy to be produced. For example, seed crystals are preferably chosen such that the ratio of the seed crystal's lattice constant to the lattice constant of the alloy is from about 0.95 to about 1.05, more preferably, from about 0.98 to about 1.02. Lattice constants of alloys that have not yet been formed can be estimated from Weast et al., eds., *CRC Handbook of Chemistry and Physics*, 60th ed., Florida: CRC Press, Inc. (1980), which is hereby incorporated by reference.

Tip nucleation, in a closed vessel or open vessel and with or without the use of seed crystals, can also be employed to effect single crystal growth. Tip nucleation methods are described in, for example, Hurle, which is hereby incorporated by reference. Pulling methods, which are described, for example, in Hurle, which is hereby incorporated by reference, can also be used.

The materials used in the practice of the present invention to form the quaternary melt can vaporize at the high temperatures typically used to form the melt and/or at which the alloy is grown. In such situations, it can be advantageous to encapsulate the melt. This technique is commonly referred to as liquid encapsulation. Briefly, an encapsulant is layered over the quaternary melt materials, either before or after the quaternary melt is formed. The encapsulant, having a melting point significantly lower than the quaternary melt, melts and forms a liquid layer on the surface of the quaternary melt. This liquid layer prevents evaporation of the quaternary melt materials and, thereby, prevents unexpected changes to the composition of the alloy. Suitable encapsulants include boric oxide ($B_2O_3$) glass and various low vapor pressure salts, such as metal halide salts, combinations of two or more alkali metal halide salts (e.g., LiCl/KCl and NaCl/KCl), or combinations of alkali metal salts and alkaline earth metal halide salts (e.g., NaCl/$CaCl_2$). Because of its extremely low vapor pressure, boric oxide glass is generally preferred.

The method of the present invention is capable of producing homogeneous quaternary single-crystal alloy boules having radially uniform compositions and uniform compositions over at least part of their thickness. From such boules, one can readily produce homogeneous quaternary single-crystal alloy boules having radially uniform compositions and uniform compositions over their entire thickness by slicing the boule (generally in a direction perpendicular to thickness) to sever the compositionally uniform portion from the seed crystal and from any non-compositionally uniform portions.

The present invention also relates to a method for preparing a homogeneous ternary or quaternary alloy from a ternary or quaternary melt which includes, respectively, at least three or at least four melt elements. The ternary or quaternary melt is in solution equilibrium with a solid binary material. As used herein, "solution equilibrium" means that the binary material is in contact with the melt so that any change in the melt's composition can result in dissolution of the binary material into the melt. The binary material includes two of the three or four elements contained in the ternary or quaternary melt. For example, where the ternary or quaternary melt is a ternary melt of In, Ga, and Sb, the binary material can be GaSb. Preferably, the binary material has a melting temperature greater that temperature at which crystal growth is carried out.

Figure 4A:
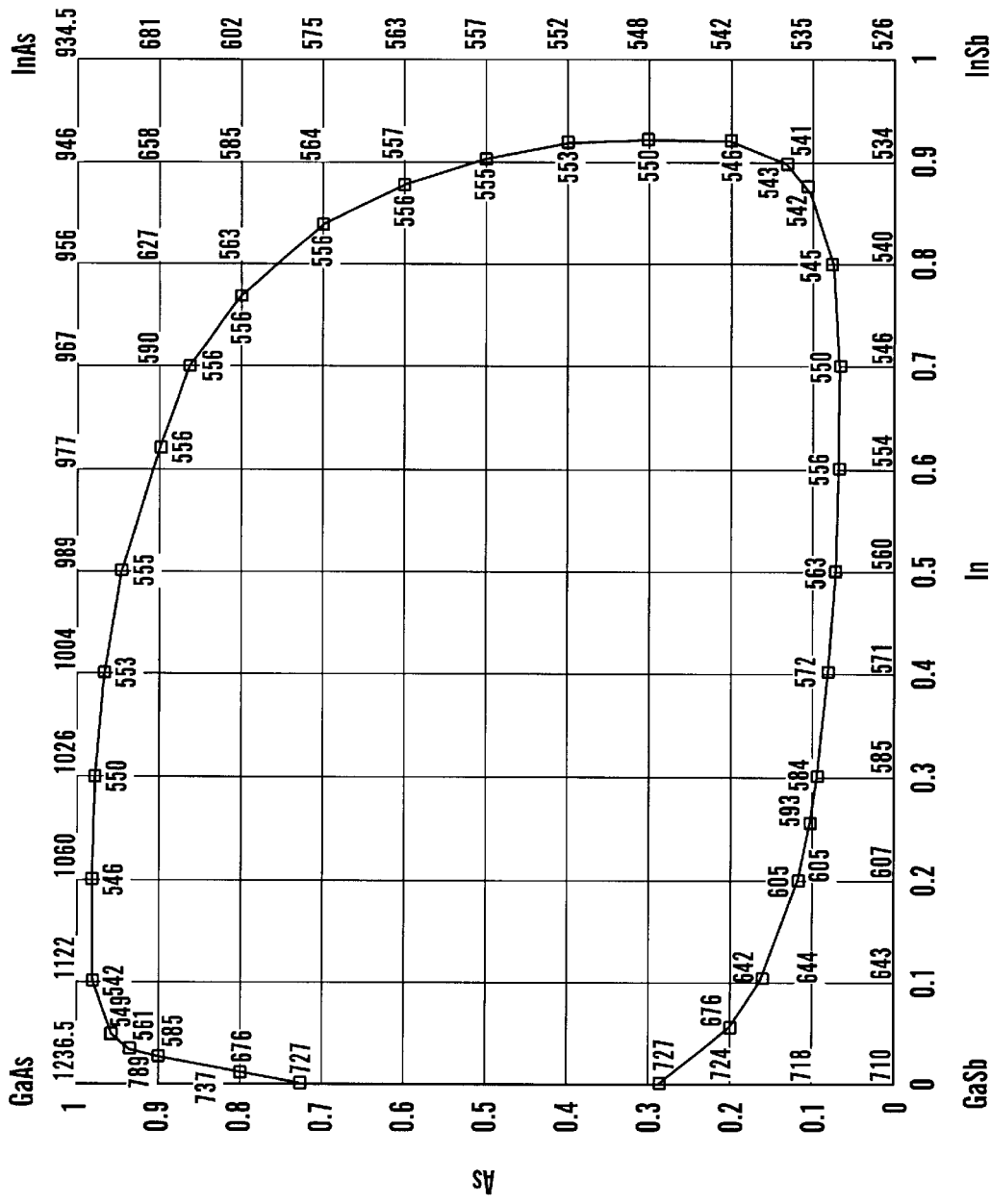
FIG. 4A is a phase diagram showing calculated solidus temperatures for Ga—In—Sb, Ga—In—As, Ga—As—Sb, In—As—Sb, and Ga—In—As—Sb systems which can be used in the practice of a method of the present invention.

Typically, the ternary or quaternary melt in solution equilibrium with a solid binary material is produced as follows. A mixture of binary compounds which, when taken together, have the exact elemental ratio of the desired ternary or quaternary alloy is placed in a suitable container (e.g., a pBN crucible), and the mixture is heated to a predetermined temperature which corresponds to the solidus temperature of the desired ternary or quaternary alloy. Optionally, the mixture can include one or more dopants, such as the ones discussed above. The solidus temperature of the desired ternary or quaternary alloy can be determined experimentally, can be estimated from free energy calculations, or can be obtained by reference to FIG. 4A. FIG. 4A shows the solidus temperatures for Ga—In—As—Sb alloys (outside the miscibility gap). For example, if one wished to make $Ga_{0.6}In_{0.4}As_{0.95}Sb_{0.5}$, one would use the solidus temperature of 553° C. for this alloy, as shown in FIG. 4A. If one wished to make $Ga_{0.2}In_{0.8}As_{0.8}Sb_{0.2}$, one would use the solidus temperature of 563° C. for this alloy. If one wished to make the ternary alloy $Ga_{0.5}In_{0.5}As$, one would use the solidus temperature of 989° C. for this alloy.

During at least a portion of the heating process, the ternary or quaternary melt is mechanically agitated so as to maintain a solution equilibrium between the solid binary material and the ternary or quaternary melt. Mechanical agitation can be effected by rotating the crucible about its vertical axis, preferably intermittently or in an oscillatory (back and forth) motion, by use of an appropriate temperature-resistant and chemically-resistant stirrer (e.g., a silica or pBN stirrer), and the like. Preferably, the entire melt is maintained at a substantially uniform temperature, both spatially and temporally. As used herein, "substantially uniform temperature" refers to that degree of uniformity of temperature sufficient to prevent maintaining a compositional equilibrium by thermal convention.

The method further includes directionally cooling the ternary or quaternary melt to grow the ternary or quaternary alloy. Any of the aforementioned directional cooling methods can be employed. Preferably, a seed crystal is used to initiate crystal growth. As the crystal grows, the melt becomes depleted in the solid binary material's two elements, and a portion of the solid binary material dissolves into the ternary or quaternary melt to replenish these depleted two elements. In this manner, the melt is maintained at a uniform composition, which results in the ternary or quaternary alloy's having a uniform composition. Preferably, the binary material has a density which is less than that of the ternary or quaternary melt, so that it floats in the melt, and the directional cooling takes place at the bottom of the crucible. More preferably, the ternary or quaternary melt is in contact with a seed crystal, and the directional cooling is carried out in a region where the ternary or quaternary melt contacts the seed crystal.

Suitable ternary melts that can be used in the method of the present invention include those which include two Group III elements (e.g., aluminum, gallium, and indium) and one Group V element (e.g., phosphorus, arsenic, and antimony); those which include two Group V elements and one Group III element; those which include two Group II elements (e.g., zinc, cadmium, and mercury) and one Group VI element (e.g., sulfur, selenium, and tellurium); and those which include two Group VI elements and one Group II element.

The present invention also relates to a homogeneous quaternary single-crystal alloy having the formula $A_xB_{1-x}C_yD_{1-y}$ wherein x and y are the same or different and are in the range of 0.001 to 0.999, such as between 0.005 and 0.995, such as between 0.01 and 0.99, such as between 0.05 and 0.95, such as between 0.1 and 0.9, etc. Preferably, the single-crystal alloy has a volume of greater than about 1 $cm^3$, such as greater than 2 $cm^3$, such as greater than about 5 $cm^3$, such as greater than about 10 $cm^3$, such as greater than about 20 $cm^3$, such as greater than about 30 $cm^3$, such as greater than about 40 $cm^3$. In addition, the alloy is preferably substantially free from crystal defects. For the purposes of the present invention, an alloy is considered to be "substantially free from crystal defects" when it has fewer than about $10^6$ crystal defects (e.g., cracks, inclusions, precipitates, dendrites, and/or dislocations) per $cm^2$, such as when it has fewer than $10^5$ crystal defects per $cm^2$, such as when it has fewer than $10^4$ crystal defects per $cm^2$, such as when it has fewer than $10^3$ crystal defects per $cm^2$, such as when it has fewer than 100 crystal defects per $cm^2$, as measured using an etch pit density method, for example, as described in Hurle and Bachman, which are hereby incorporated by reference.

Figure 4B:
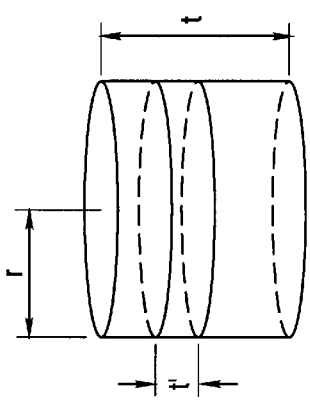
FIG. 4B is a perspective view of a boule produced by a method of the present invention.

Typically, the alloy is in the shape of a cylinder having a thickness t and a radius r, such as the one illustrated in FIG. 4B. As used herein, "cylinder" is meant be include any three dimensional object having uniform cross section. Generally, the cylinders contemplated here have circular cross-sections, though this need not be the case. The alloy is substantially compositionally uniform over at least a portion t' of its thickness t and over its entire radius r. For purposes of the present invention, an alloy is considered to be "substantially compositionally uniform over at least a portion t' of its thickness t'" when the alloy's composition at any point within the thickness t' differs from the alloy's composition at all other points within the thickness t' by less than about 1 mol %, preferably by less than about 0.7 mol %, more preferably by less than 0.5 mol %. For example, in the case of a quaternary alloy $A_xB_{1-x}C_yD_{1-y}$ having a thickness t, if the alloy has a composition of $A_{x1}B_{1-x1}C_{y1}D_{1-y1}$ at some point $P_1$ within the thickness t' and, if, at points $P_n$ within the thickness t', the alloy has a composition of $A_{xn}B_{1-xn}C_{yn}D_{1-yn}$, then the alloy is considered to be "substantially compositionally uniform over at least a portion t' of its thickness t'" when each of $|xn-x1|$ and $|yn-y1|$ is less than about 1% (i.e., less than about 0.01) for all points $P_n$ within the thickness t'. For purposes of the present invention, an alloy is considered to be "substantially compositionally uniform over its entire radius r" when the alloy's composition at any point lying in a cross-sectional slice thereof differs from the alloy's composition at all other points lying in that cross-sectional slice thereof by less than about 1 mol %, preferably by less than about 0.7 mol %, more preferably by less than 0.5 mol %. For example, in the case of a quaternary alloy $A_xB_{1-x}C_yD_{1-y}$, if the alloy has a composition of $A_{x1}C_{y1}D_{1-y1}$ at some point $P_1$ within the crystal's cross-sectional slice S and, if, at points $P_n$ within cross-sectional slice S, the alloy has a composition of $A_{xn}B_{1-xn}C_{yn}D_{1-yn}$, then the alloy is considered to be "substantially compositionally uniform over its entire radius r" when each of $|xn-x1|$ and $|yn-y1|$ is less than about 1% (i.e., less than about 0.01) for all points $P_n$ within cross sectional slice S. In determining whether a crystal is substantially compositionally uniform, only the elements which make up the quaternary alloy are considered. For example, dopants are not considered in making this determination. Preferably, the thickness of the compositionally uniform portion of the alloy is greater than about 4 mm (i.e., t' is greater than about 4 mm), such as greater than about 5 mm, greater than about 10 mm, greater than about 20 mm, greater than about 30 mm, greater than about 40 mm, and/or greater than about 50 mm. More preferably, the homogeneous quaternary single-crystal alloy is substantially compositionally uniform over its entire thickness t and over its entire radius r. Examples of homogeneous quaternary single-crystal alloy within the scope of the present invention include those which include two elements which are Group III elements (e.g., two elements selected from the group consisting of aluminum, gallium, and indium) and two elements which are Group V elements (e.g., two elements selected from the group consisting of phosphorus, arsenic, and antimony). Other examples of homogeneous quaternary single-crystal alloy within the scope of the present invention include those which include two elements which are Group II elements (e.g., two elements selected from the group consisting of zinc, cadmium, and mercury) and two elements which are Group VI elements (e.g., two elements selected from the group consisting of sulfur, selenium, and tellurium). Alloys of the following forms are illustrative: GaInAsSb, GaInAsP, GaInSbP, AlGaAsSb, AlGaAsP, AlGaSbP, AlInAsSb, AlInAsP, AlInSbP, ZnCdTeSe, ZnCdTeS, ZnCdSeS, HgCdTeSe, HgCdTeS, HgCdSeS, ZnHgTeSe, ZnHgTeS, and ZnHgSeS. In each of these, the subscripts are not indicated. However, it is to be understood, that, for example, GaInAsSb is meant to include all alloys containing Ga, In, As, and Sb, irrespective of the relative amounts of the individual Ga, In, As, and Sb components. Stated differently, GaInAsSb, for example, as used above, is meant to include all compounds having the formula $Ga_xIn_{1-x}As_ySb_{1-y}$, where x and y, are independently selected and are in the range of from about 0.001 to about 0.999. These alloys can be prepared using the methods described hereinabove.

The alloys of the present invention and those prepared in accordance with the methods of the present invention can be used, for example, in a variety of applications. For example, they can be used in thermophotovoltaic ("TPV") generation of electricity. Details regarding this use is set forth for example in Dutta, which is hereby incorporated by reference. The alloys can also be used in other applications requiring opto-electronic devices. These include infrared detectors; tandem and other types of solar cells; high frequency devices; monitoring environmental pollution, trace chemicals, and toxic or other types of gases, for example, in industrial environments; fire detection devices; and laser diodes and detectors. By altering the relative amounts of the elements present in the ternary and quaternary alloys, the band gap can be tuned for a particular application.

The ternary and quaternary alloys of the present invention can also be used as substrates for other alloys. For example, using a $Ga_xIn_{1-x}Sb$ ternary alloy of the present invention as a substrate, one can grow another alloy layer (e.g., $InAs_ySb_{1-y}$) thereon. The alloy layer (e.g., $InAs_ySb_{1-y}$) will also be substantially free from crystal defects. In contrast, when one uses prior art methods of first growing $Ga_xIn_{1-x}Sb$ on a binary (e.g., GaSb) substrate and then growing a layer of $InAs_ySb_{1-y}$ on the resulting composition to form an $InAs_ySb_{1-y}/Ga_xIn_{1-x}Sb/GaSb$ structure, the $InAs_ySb_{1-y}$ is not substantially free from crystal defects. It is believed that the failure to produce $InAs_ySb_{1-y}/Ga_xIn_{1-x}Sb/GaSb$ structures having a $InAs_ySb_{1-y}$ that is free from crystal defects is caused by defects in the $Ga_xIn_{1-x}Sb$ layer of the $Ga_xIn_{1-x}Sb/GaSb$ composition on which the $InAs_ySb_{1-y}$ is grown. By being able to provide a ternary (e.g., $Ga_xIn_{1-x}Sb$) alloy substantially free from crystal defects, the need to use $Ga_xIn_{1-x}Sb/GaSb$ is eliminated. Furthermore, $Ga_xIn_{1-x}Sb/GaSb$ compositions in which x is greater than about 0.1 are cannot be made using the methods of the prior art because growing $Ga_xIn_{1-x}Sb$ (in which x>0.1) on GaSb results is so many crystal defects that the $Ga_xIn_{1-x}Sb$ is subject to mechanical failure. In contrast, using the methods of the present invention, there is no need for a binary substrate and $Ga_xIn_{1-x}Sb$ having x greater than 0.1 can be produced. As one skilled in the art will appreciate, by increasing the value of x in $Ga_xIn_{1-x}Sb$, one can shift the emission wavelength of infrared lasers to longer wavelengths.

In this regard, the present invention also contemplates an infrared laser which employs a $Ga_xIn_{1-x}Sb$ alloy having, for example x greater than about 0.1, such as greater than 0.15, greater than about 0.2, etc. The $Ga_xIn_{1-x}Sb$ alloy can also include one or more dopants. For example, the $Ga_xIn_{1-x}Sb$ alloy can be uniformly doped throughout with Te. The Te-doped $Ga_xIn_{1-x}Sb$ alloy can also be doped with zinc, preferably in a near-surface region so as to create a p-n junction. This near-surface doping with zinc can be carried out using standard doping techniques, such as by exposing the surface of the Te-doped $Ga_xIn_{1-x}Sb$ alloy to zinc vapor.

The present invention is further illustrated by the following examples.

EXAMPLES

Example 1

Thermodynamic Model. Models and Data Sources

MTDATA determines equilibrium compositions by minimizing the Gibbs free energy of the system. It requires an input file containing free energies of pure substances as a function of temperature, and excess free energies of solution phases as functions of temperature and composition. Data for the pure elements in their solid and liquid phases and for the pure solid compounds were taken from the assessment of Ansara, which is hereby incorporated by reference. The published free energy expressions were multiplied by two because the compounds ere formulated in the present work as AB, rather than as $A_{0.5}B_{0.5}$ (MTDATA reads the stoichiometry of each substance in the system from the input file and accounts for it in the calculations).

The liquid was modeled as including only atoms. The strong attraction between group III elements and group V elements in the liquid was accounted for by negative excess free energy terms rather than by postulating the existence of III–V compounds in the liquid phase. The excess free energy of a solution phase is defined as the difference between the actual free energy of mixing and the free energy change that would result from the entropy of mixing of an ideal solution. The excess free energy of the liquid was represented using a Redlich-Kister model, as described in Redlich, which is hereby incorporated by reference, having non-zero coefficients for all of the six possible binary interactions and for two of the four possible ternary interactions. The contribution of an interaction to the excess free energy is $$G_{excess} = W_0(T)X_1X_2 + W_1(T)X_1X_2(X_1-X_2) + W_2(T)X_1X_2(X_1-X_2)^2$$

for a binary interaction, and $$G_{excess} = W_0(T)X_1X_2X_3$$

for a ternary interaction, where $X_n$ is the mole fraction of species n.

Redlich-Kister coefficients for the binary interactions in the liquid were taken from Ansara, which is hereby incorporated by reference. A coefficient for the ternary interaction among Ga, In, and Sb in the liquid was taken from Yang, which is hereby incorporated by reference.

The zincblende phase was treated using a two-sublattice model, with gallium and indium occupying one sublattice, while arsenic and antimony occupy the other. Using $Y_x$ to represent the fraction of sites on its appropriate sublattice occupied by element X, the free energy of the solid was calculated as:

$$G = Y_{Ga}Y_{As}G^{\circ}_{GaAs} + Y_{In}Y_{As}G^{\circ}_{InAs} + Y_{Ga}Y_{Sb}G^{\circ}_{GaSb} + Y_{In}Y_{Sb}G^{\circ}_{InSb} +$$
$$RT(Y_{Ga}\ln Y_{Ga} + Y_{In}\ln Y_{In}) + RT(Y_{As}\ln Y_{As} + Y_{Sb}\ln Y_{Sb}) +$$
$$G_{excess}$$

where $$G_{excess} = Y_{Ga}Y_{As}Y_{Sb}a_o + Y_{Ga}Y_{In}Y_{As}b_o + Y_{Ga}Y_{In}Y_{Sb}c_o + Y_{In}Y_{As}Y_{Sb}d_o$$

Expressions for the $a_o$, $b_o$, $c_o$, and $d_o$ coefficients can be found, for example, in Yang, which is hereby incorporated by reference, and in Nakajima, which is hereby incorporated by reference. Calculations of the pseudobinary phase diagrams of GaAs—InAs, GaAs—GaSb, and GaSb—InSb agreed well with experimental data from the literature, with the exception of the InAs—InSb. Improved agreement for this subsystem was achieved by addition of a ternary As, In, Sb interaction in the liquid, and adjustment of the $d_o$ coefficient. The values for these two coefficients were arrived at by trial-and-error rather than by a rigorous optimization procedure. All interaction terms from sources other than the Ansara assessment are listed in Table 1.

TABLE 1

| Interacting Species | Phase | Coefficient Joule/mole, T in Kelvin | Source |
| --- | --- | --- | --- |
| As, In, Sb | Liquid | $W_o = -36435 + 55.6$ T | Present Work |
| Ga, In, Sb | Liquid | $W_o = -5072.76 - 10.8842$ T | Yang |
| GaAs, GaSb | Zincblende | $a_o = 17866$ | Stringfellow[a] |
| GaAs, InAs | Zincblende | $b_o = 10498$ | Stringfellow[a] |
| GaSb, InSb | Zincblende | $c_o = 9093 - 2.8698$ T | Yang |
| InAs, InSb | Zincblende | $d_o = 20914 - 12$ T | Present Work |

[a]Stringfellow, "Calculation of Ternary and Quaternary III-V Phase Diagrams," J. Cryst. Growth, 27:21–34 (1974), which is hereby incorporated by reference.

All interactions listed in Table 1 used only the first term ($W_0$) in the Redlich-Kister series.

Calculations were performed using the MULTIPHASE module of MTDATA. At each temperature, overall compositions (moles of each element) corresponding to selected points expected to be in the interior of two phase or three phase regions were input. The program then calculated the compositions and amounts of the phases present at equilibrium. Each point that was within a two-phase region generated a tie line, and each point within a three phase region generated the three lines forming the boundaries of the region.

Example 2

Thermodynamic Model. Calculated Diagrams

Figure 5B:
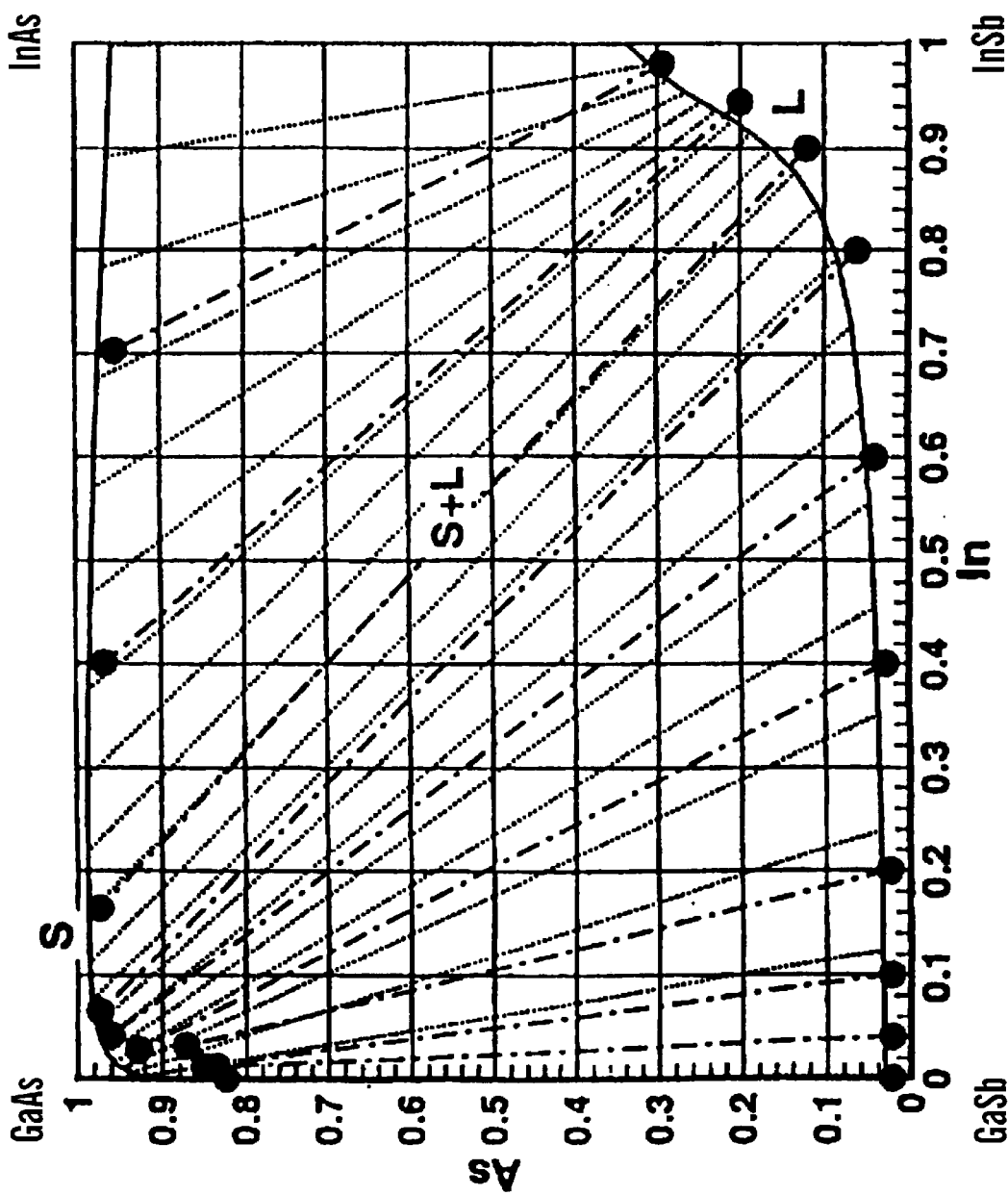
Figure 5C:
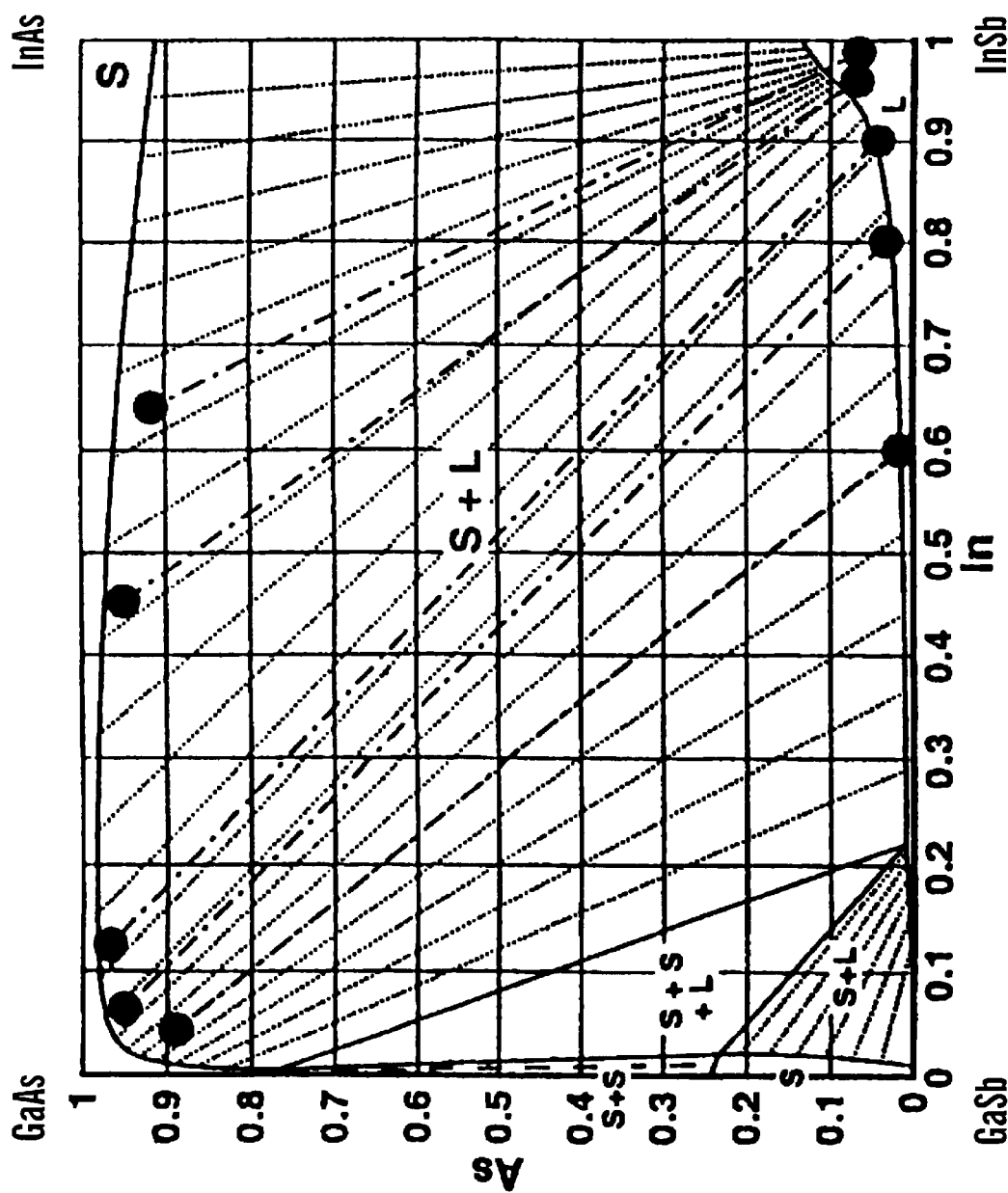

Phase diagrams for the $Ga_{1-x}In_xAs_ySb_{1-y}$ system were calculated for temperatures from 200° C. to 1200° C. Representative diagrams are presented in FIGS. 5A–5D. In these diagrams, dotted lines represent solid-liquid tie lines, while dashed lines represent solid-solid tie lines. Dashed-Dotted lines ending in filled circles (in FIGS. 5B, 5C, and 5D) are the experimental tie lines of Nakajima, which is hereby incorporated by reference. Between 720° C. and the melting point of GaAs (1237° C.), there is only a single solid, which is rich in gallium and arsenic, and a liquid which is rich in indium and antimony. This is shown in FIGS. 5A and 5B. The only change with increasing temperature in this range is a continuous shift of both the liquidus and solidus curves toward the GaAs corner. Below the melting point of InAs (942° C.), the In-rich ends of both curves are on the InSb-InAs axis. See FIGS. 5A and 5B. Above the melting point of InAs, both curves end on the GaAs-InAs axis. In the temperature range about 543–720° C., three-phase regions are predicted to exist, where an arsenic-rich solid and an antimony-rich solid are simultaneously in equilibrium with a liquid that is richer than either solid in indium and antimony See FIGS. 5C and 5D. At 400° C. and below, a three-solid region appears within the solid-solid miscibility gap, as the arsenic-rich solid decomposes further into separate gallium-rich and indium-rich phases.

The calculations predict that $Ga_{0.78}In_{0.22}As_{0.1}Sb_{0.9}$, for example, is within the miscibility gap at 500° C., but, at 600°

C., it is stable as a single solid in equilibrium with a liquid of composition Ga0.25In0.75As$_{0.004}$Sb$_{0.996}$. In contrast, Ga$_{0.8}$In$_{0.2}$As$_{0.2}$Sb$_{0.8}$ is also within the miscibility gap at 500° C., but it is not stable as a single phase solid at any temperature. Solid with bulk composition Ga$_{0.8}$In$_{0.2}$As$_{0.2}$Sb$_{0.8}$ does not separate from a liquid until the liquid has been cooled to about 600° C. When the solid does form, it will be a two phase mixture of antimony-rich and arsenic-rich solids, because it is already below the minimum temperature at which the solids would be miscible if they did not melt.

Example 3

Thermodynamic Model. Solidification Modeling

Many models for growth of solid solutions from melts have been developed, with varying degrees of complexity. One of the simplest models assumes that the actively growing zone of the solid is constantly in quasi-equilibrium with the entire bulk liquid (not a true equilibrium to the extent that the temperature is non-uniform). Solid is "frozen" in composition and cannot exchange matter with the liquid. Also, solid phase diffusion is extremely low and hence neglected. As the solid grows, the liquid becomes depleted in the elements that preferentially enter the solid; so, with time, the solid also gets depleted in those elements. The interface temperature is assumed to decrease as the liquid becomes richer in the lower melting components. Quantitative treatment of such a model usually begins by defining effective solid-liquid distribution coefficients, $k_i$, for the components i. The distribution coefficients are often assumed to remain constant, and may or may not be assumed to be the same as the equilibrium distribution coefficients. Experimentally, it is usually found that attempts to grow pseudo-binary solid solutions such as Ga$_{1-x}$In$_x$As or Ga$_{1-x}$In$_x$Sb from a ternary liquid produce solids with a gradation in composition that conforms to a model of this first type.

The crystal growth experiments described herein more nearly followed a second type of model. In this model, the interface solid is in equilibrium only with a thin zone of liquid at the liquid-solid interface. The temperature at the liquid-solid interface is assumed to be constant, but lower than the bulk liquid temperature. The interface liquid exchanges matter with the bulk liquid on a time scale that is slow compared to the equilibration between solid and interface liquid. As the solid grows, the interface liquid becomes depleted in the elements that preferentially enter the solid, but they are continuously replenished by exchange with the bulk liquid. As the process continues, the solid composition remains uniform, and the interface liquid composition remains constant, but the composition of the bulk liquid gradually approaches that of the interface liquid. When the composition of the bulk liquid becomes the same as the interface liquid, the growth of solid stops unless the temperature decreases (in which case the composition of the solid will change), or the bulk liquid is replenished by adding the elements that have become depleted.

Figure 5D:
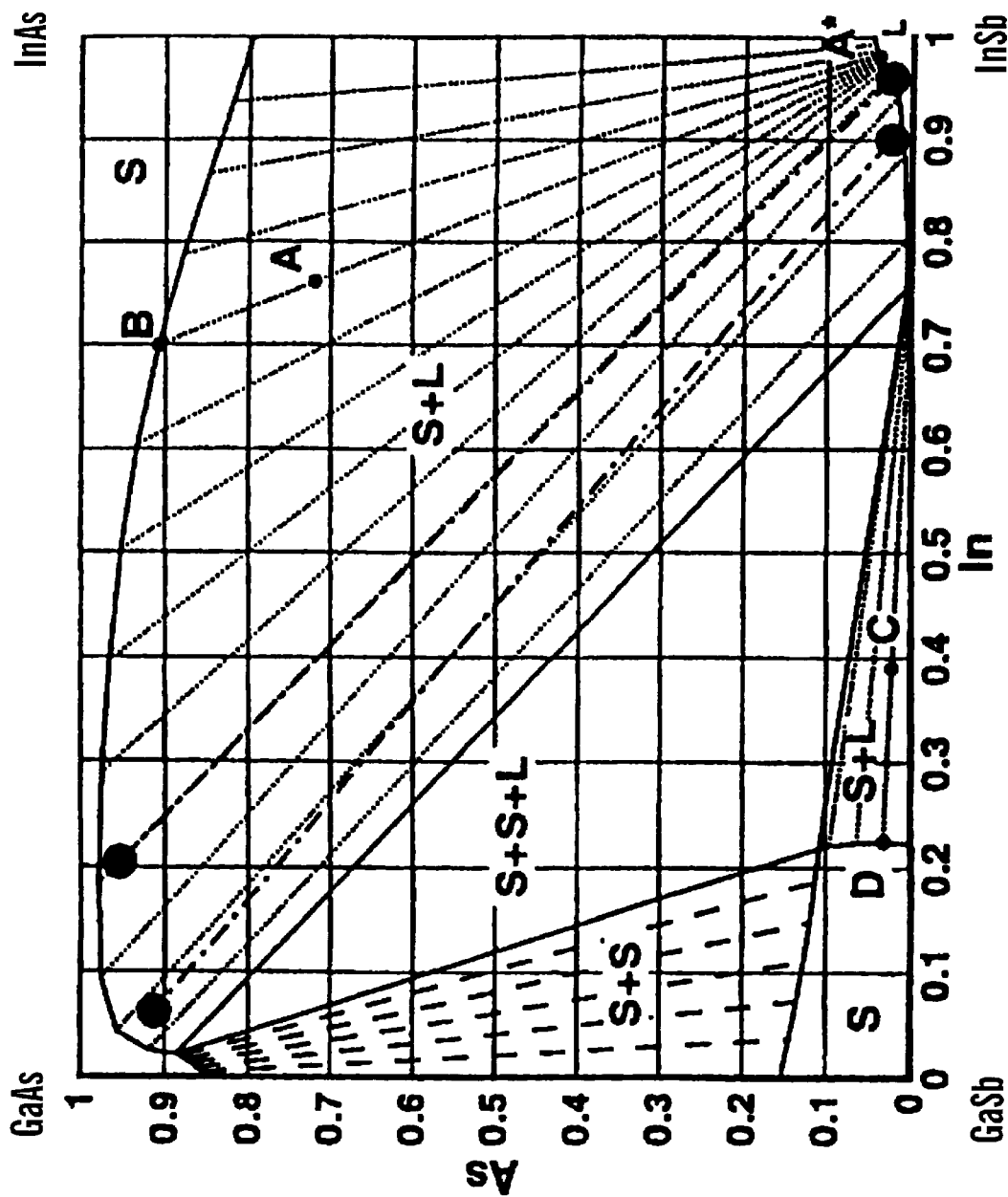

The second type of model can be represented by three points on an isothermal phase diagram for the growth temperature. In FIGS. 5A and 5D, point A represents an initial bulk liquid composition. Point B is the composition of the solid, and point A* is the composition of the interface liquid. As the growth continues, the solid composition remains at point B, and the interface liquid composition remains at point A*, but the bulk liquid composition moves along the tie line from point A toward point A*. The theoretical maximum fraction of the original liquid charge that can be solidified at constant temperature is equal to the ratio of the length of line segment AA* to that of segment BA*.

While the model predicts that yield can be maximized by starting with a liquid composition as close as possible to the desired solid composition, that increases the risk of nucleation within the bulk liquid. For example, a bulk liquid corresponding to point A1 on FIG. 5A has a calculated liquidus temperature of 950° C. Random nucleation could occur in the bulk if the bulk liquid temperature is any less than 50° C. above the interface temperature (900° C.) at the start of the experiment. While the model predicts that the same solid could be grown at a theoretical yield of 70% by starting with a bulk composition close to point A1', the calculated liquidus temperature for composition A1' is 1000° C. Hence, to increase the maximum yield of the uniform composition region in the crystal using the present approach, the temperature gradient in the melt needs to be increased.

It was theoretically predicted that alloy concentrations in the solid should remain constant, provided the growth temperature was constant, in spite of the fact that the segregation coefficients of individual elements were all much different than unity. FIG. 5A above demonstrated the growth of uniform Ga—In—As from a Ga—In—As—Sb melt. A similar concept can be applied for the growth of uniform Ga—In—Sb, In—As—Sb, and Ga—As—Sb from Ga—In—As—Sb by choosing appropriate melt compositions and growth temperatures. The results presented here on uniform ternary solids from quaternary melts are in accordance with the second type of model.

Example 4

Experimental Results. Charge Synthesis and Crystal Growth

The quaternary melts were synthesized by either (a) melting Ga, In, Sb and InAs or GaAs or (b) by mixing pre-synthesized binary compounds GaSb, InSb, GaAs and InAs. Synthesis was performed in silica crucibles by keeping the melt in a linear temperature gradient zone of the furnace to promote mixing through natural convection for 12–15 hours. The maximum temperature in the melt was approximately 50° C. above the liquidus temperature. The temperature at the bottom of the crucible where solidification (nucleation) initiates was monitored carefully and was decided based on the MTDATA simulations. The melt was encapsulated by boric oxide or alkali halide salt. Inert argon gas, up to 1.5 atmospheres, was used to pressure the melt to avoid volatilization of the group V components during synthesis. After synthesis, crystal growth was performed by the conventional vertical Bridgman method. The crucible lowering rate was in the range of 2–3 mm/hr. Typical temperature gradients of the furnace near the melt-solid interface used in this work ranged between 20–50° C./cm.

Example 5

Experimental Results. Growth of Ga$_{1-x}$In$_x$Sb

Figure 6:
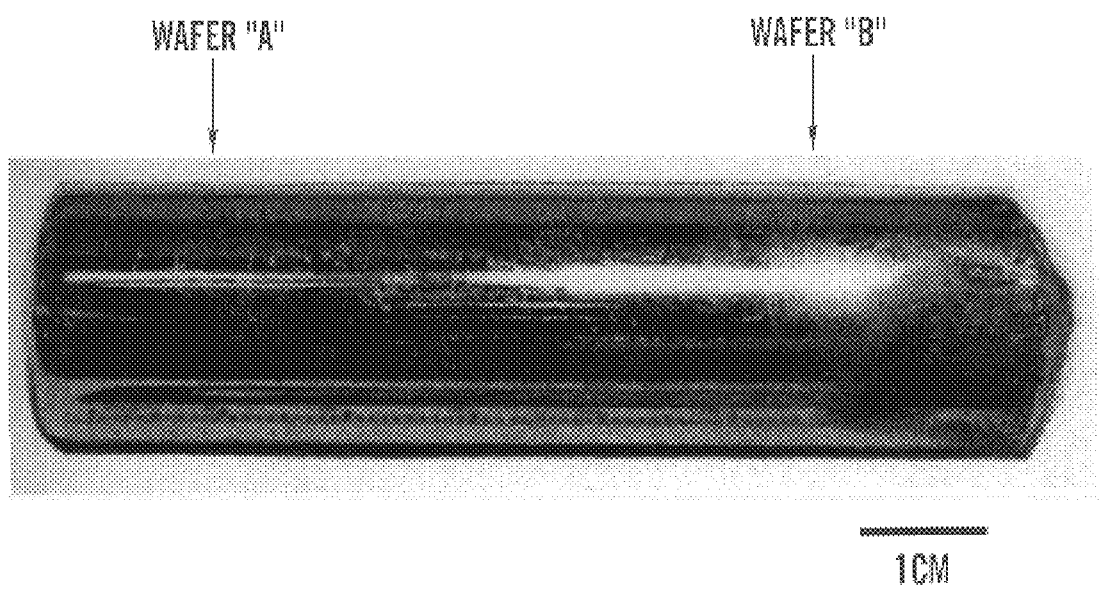
FIG. 6 is an image of a uniform $Ga_{0.88}In_{0.12}Sb$ polycrystal produced from a melt composition of 75 mol % Ga, 25 mol % In, 98 mol % Sb, and 2 mol % As at a growth temperature of about 630° C. in accordance with a method of the present invention.
Figure 7A:
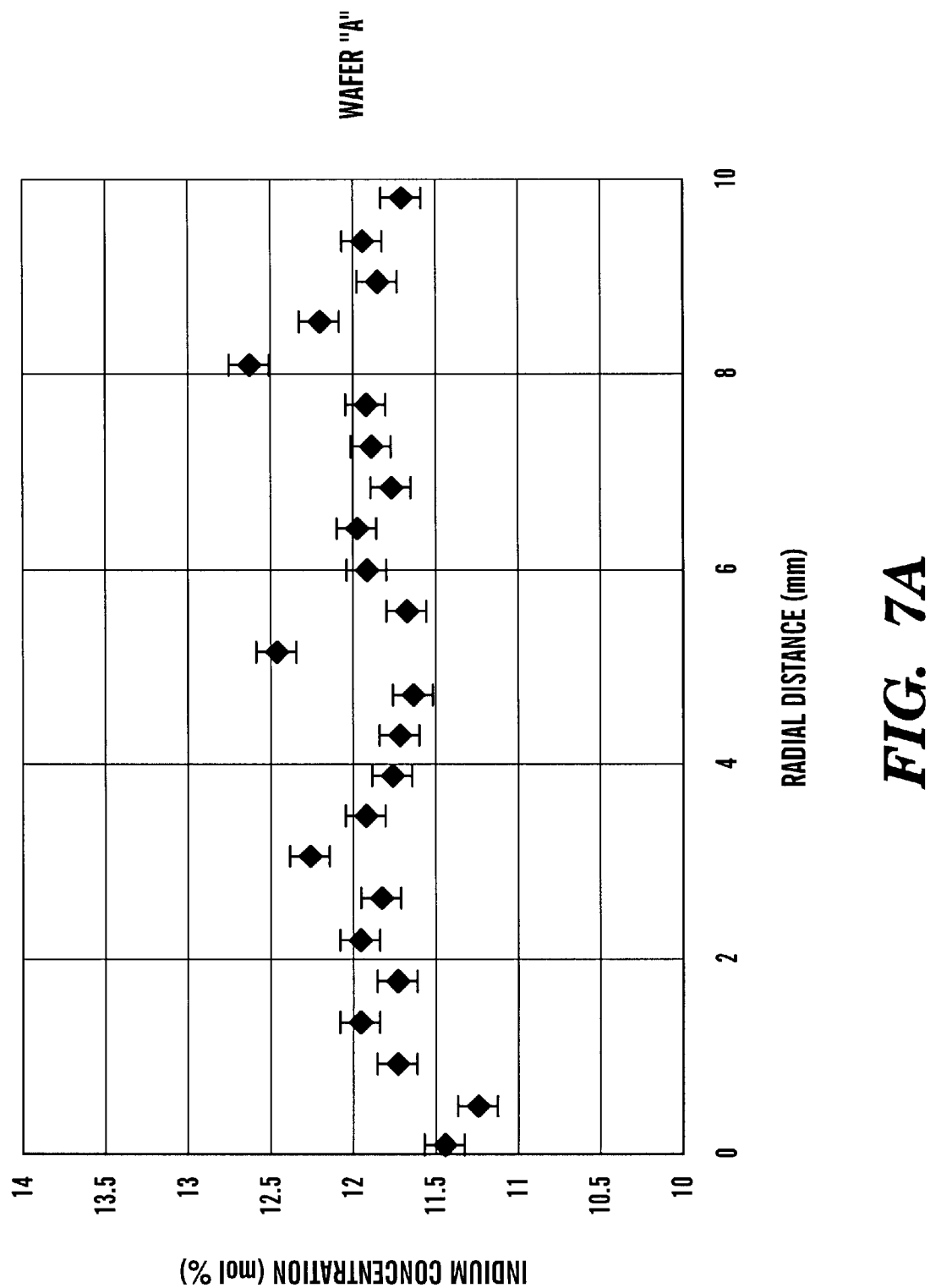
FIGS. 7A and 7B are graphs showing radial indium profiles for two wafers taken from a crystal produced in accordance with a method of the present invention.
Figure 7B:
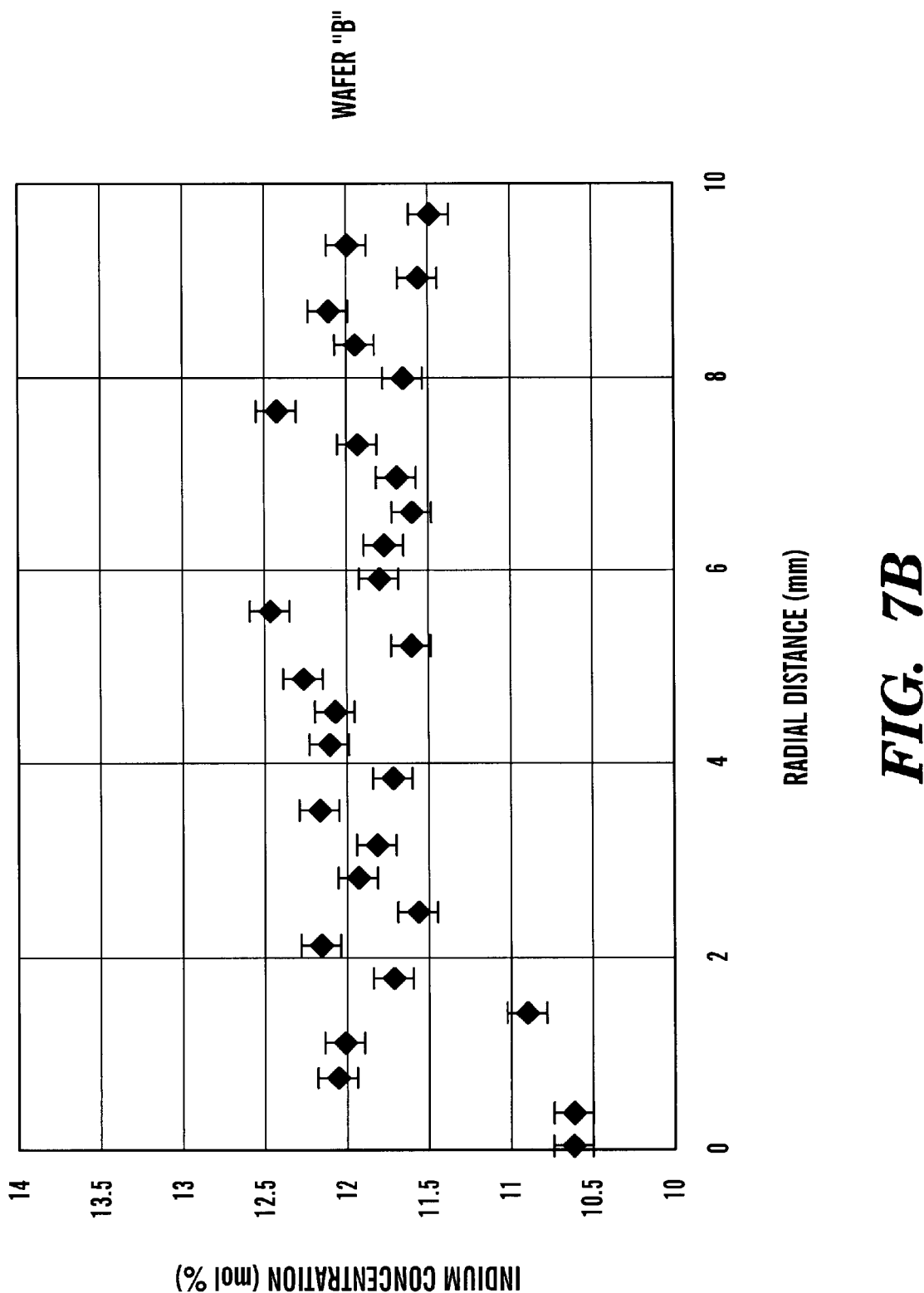
Figure 8A:
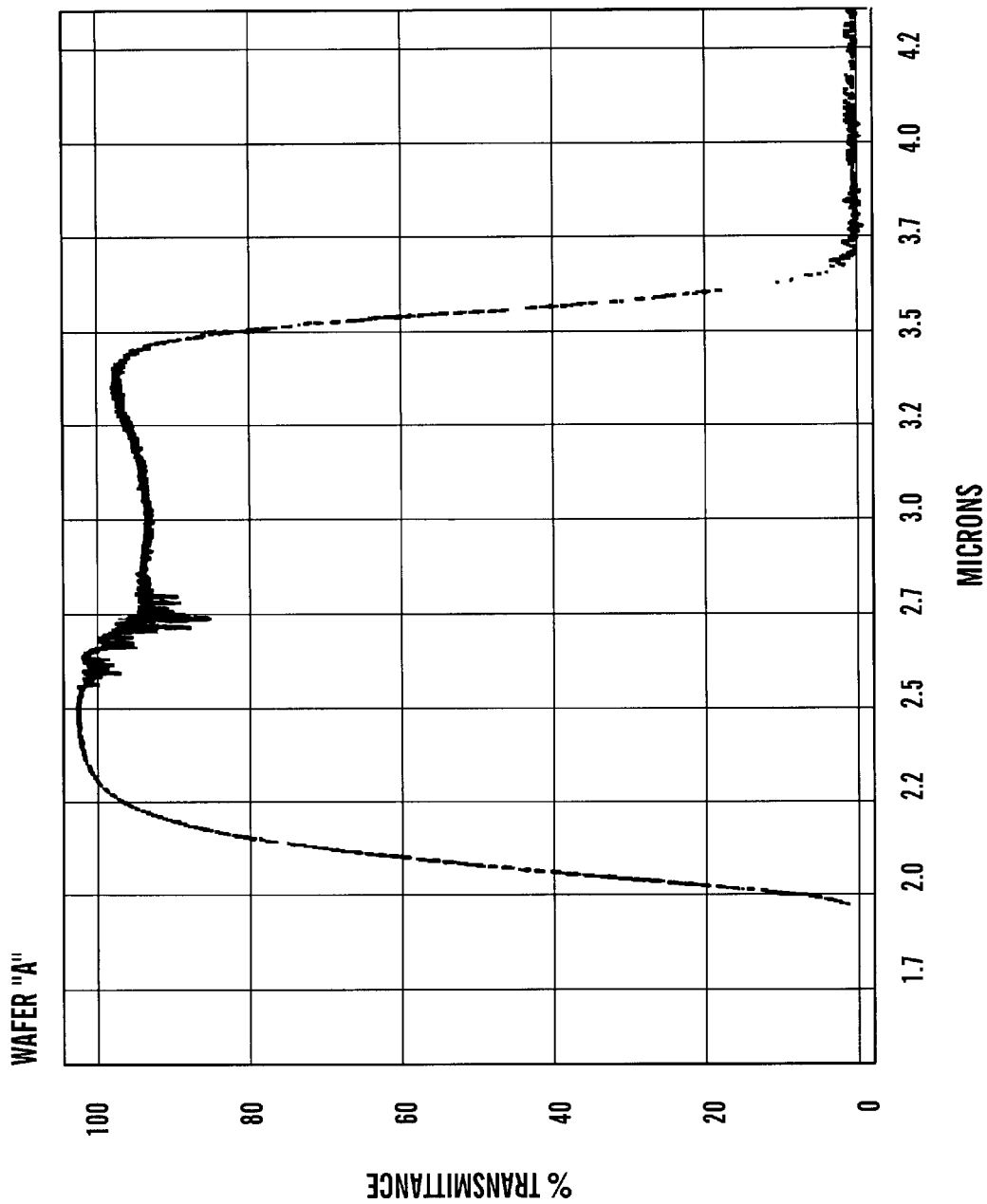
FIGS. 8A and 8B are room temperature Fourier transform infrared transmission spectra for two wafers taken from a crystal produced in accordance with a method of the present invention.
Figure 8B:
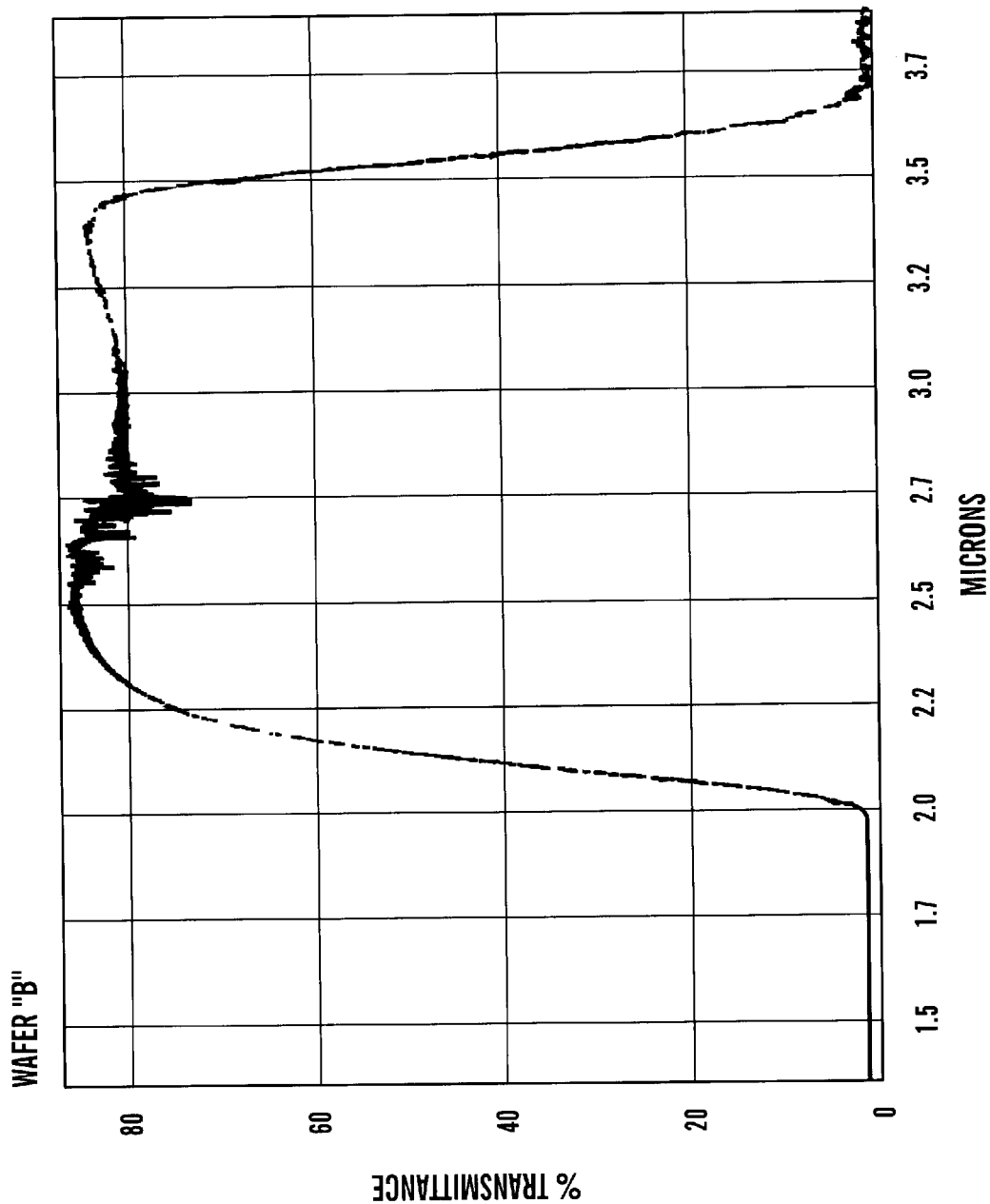

By using the above-described procedure, compositionally uniform polycrystalline Ga$_{1-x}$In$_x$Sb was produced from Ga—In—As—Sb melts. An image of the uniform Ga$_{0.88}$In$_{0.12}$Sb polycrystal produced from a melt composition of 75 mol % Ga, 25 mol % In, 98 mol % Sb, and 2 mol % As at a growth temperature was about 630° C. is shown in FIG. 6. Due to spatial compositional homogeneity, cracks usually seen in ternary boules are absent in this crystal. The elemental concentrations in the solid obtained in these crystals are close to the predicted values from MTDATA calculations (simulations performed at the respective growth temperatures with the experimental melt compositions). Using Electron Micro-probe X-ray Analysis ("EPMA"), the radial and axial indium concentrations in the grown crystals were evaluated. FIGS. 7A and 7B show the radial indium profile of two wafers "A" and "B" taken from two axial positions of the grown ingot. The radial position 0 mm represents the edge of the crystal and the position 10 mm corresponds to the center of the crystal. As FIGS. 7A and 7B clearly show, the axial as well as the radial indium concentration is very uniform and close to 12 mol %. The compositional homogeneity of the crystal is also evident from the Fourier Transform Infrared ("FTIR") Transmission plots of the two wafers, as shown in FIGS. 8A and 8B. The FTIR transmission spectrum for each wafer shows a band edge of about 0.6 eV.

Example 6

Experimental Results. Growth of $Ga_{1-x}In_xAs$

Figure 10:
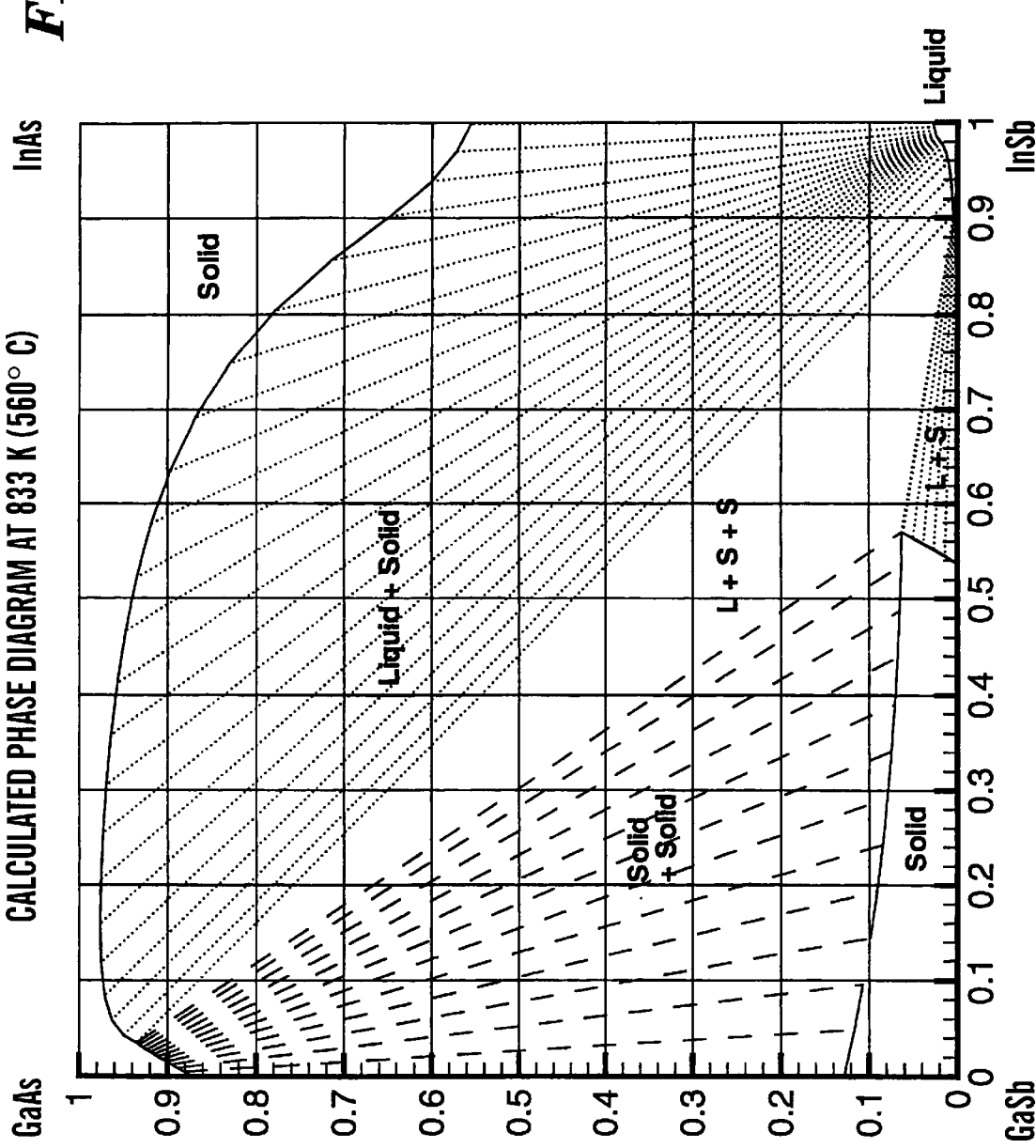
FIG. 10 is a graph showing the axial indium profile in the first to freeze 18 mm portion of a crystal produced in accordance with a method of the present invention.
Figure 9:
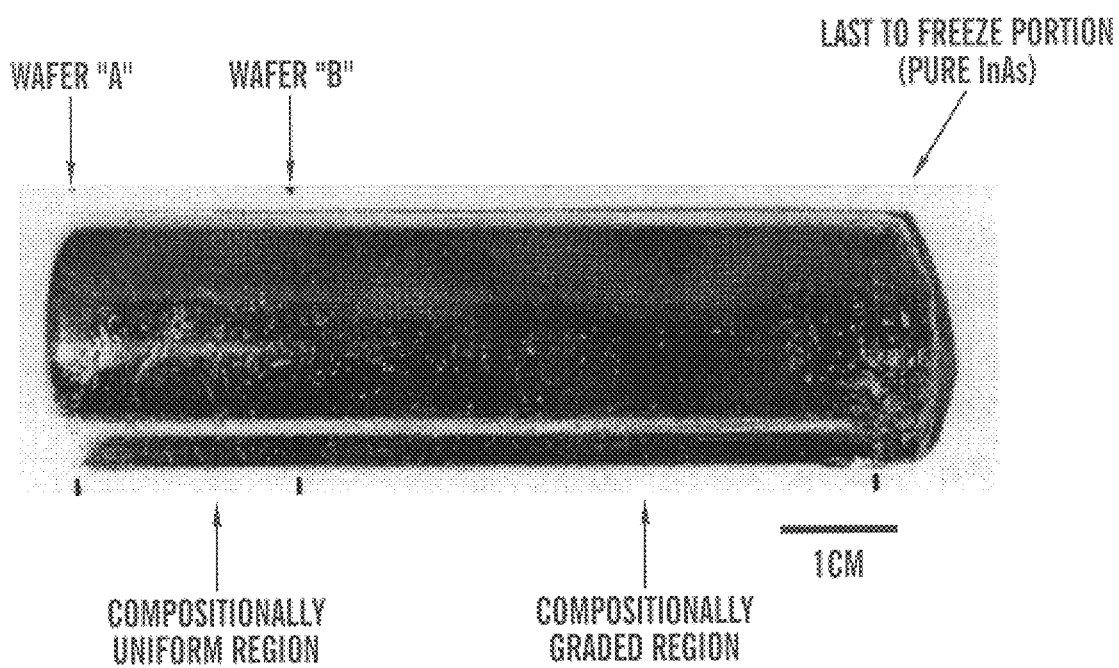
FIG. 9 is an image of a uniform $Ga_{0.2}In_{0.8}As$ polycrystal produced from a melt composition of 10 mol % Ga, 90 mol % In, 20 mol % Sb, and 80 mol % As at a growth temperature of about 900° C. in accordance with a method of the present invention.
Figure 10:
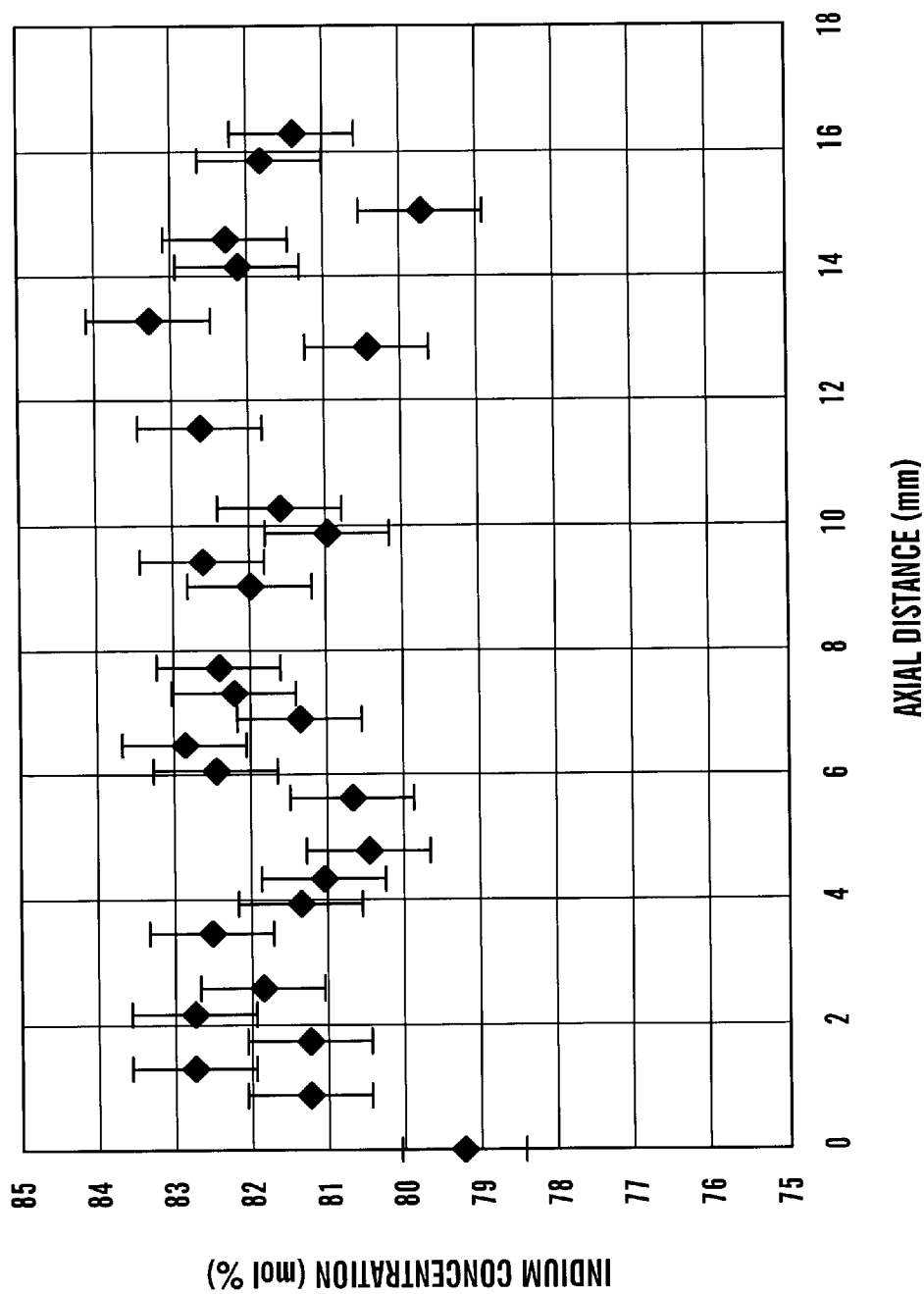
Figure 11A:
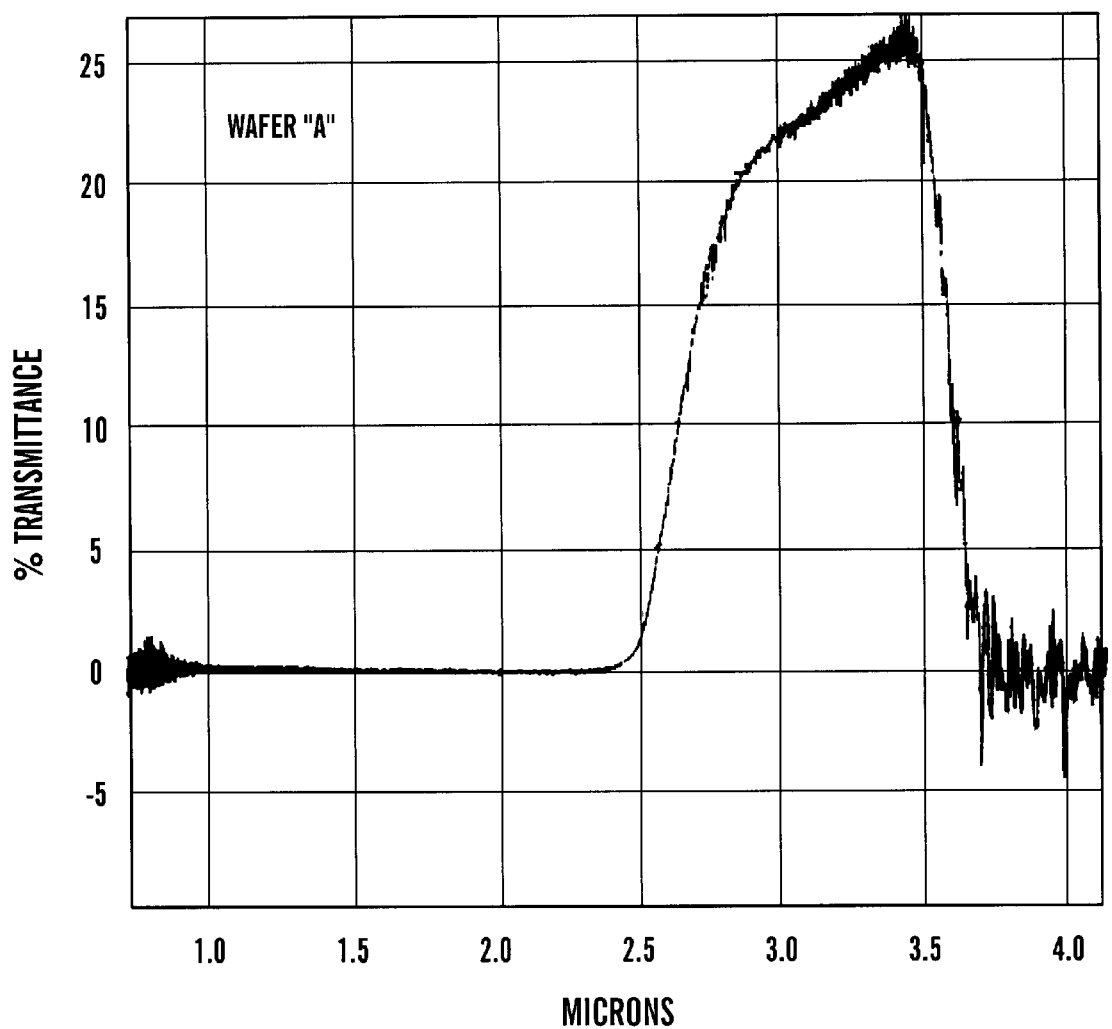
FIGS. 11A and 11B are room temperature Fourier transform infrared transmission spectra for two wafers taken from a crystal produced in accordance with a method of the present invention.
Figure 11B:
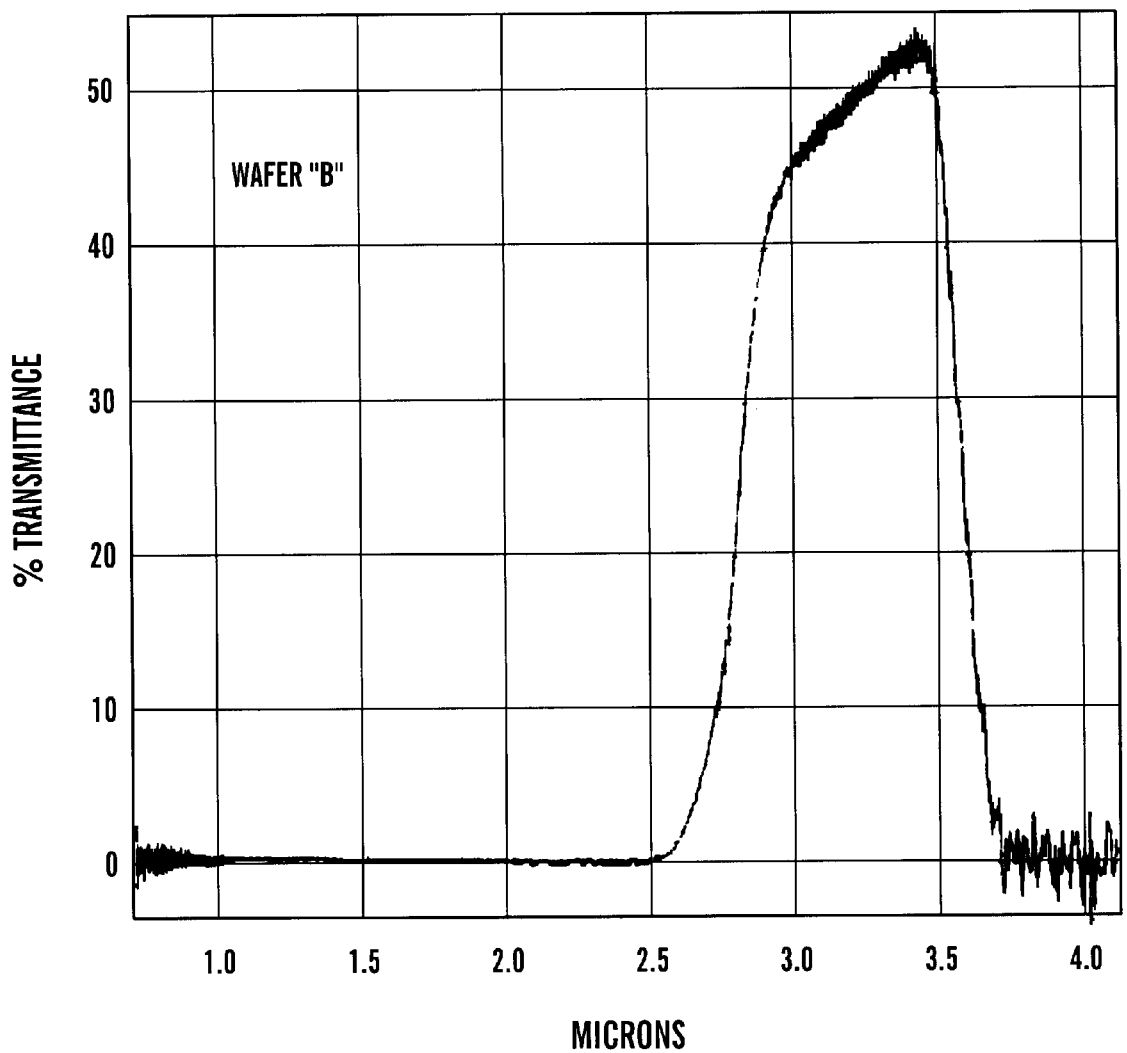

By using the procedure similar to that above, homogeneous polycrystalline $Ga_{1-x}In_xAs$ was produced from Ga—In—As—Sb melts. As in the materials prepared in Example 4, no cracks were observed due to spatial alloy homogeneity of the crystals. FIG. 9 shows an experimentally grown $Ga_{0.2}In_{0.8}As$ polycrystal at a growth temperature of about 900° C. from a melt (A1) which contained 10 mol % Ga, 90 mol % In, 20 mol % Sb, and 80 mol % As. From the MTDATA predictions in FIG. 5A, the solid composition (B1) should be close to 20 mol % Ga, 80 mol % In, negligible amount of Sb, and nearly 100% As. The total length of the uniform region of the crystal expected is about 40% of the total melt volume (proportional to the length of the tie line A1–A1* with respect to the length of B1–A1*). This was experimentally verified using the axial EPMA measurements for the first to freeze 18 mm of the crystal, as shown in FIG. 10. FIGS. 11A and 11B are room temperature FTIR transmission plots for wafers "A" and "B", respectively, of the crystal shown in FIG. 9. The transmission cut-off edge lies at the same point in the two wafers, indicating the axial compositional homogeneity in the crystal (in the first to freeze one-third portion). The band gap evaluated from the two plots is about 0.5 eV.

Example 7

Self Solute Feeding Method

Figure 12:
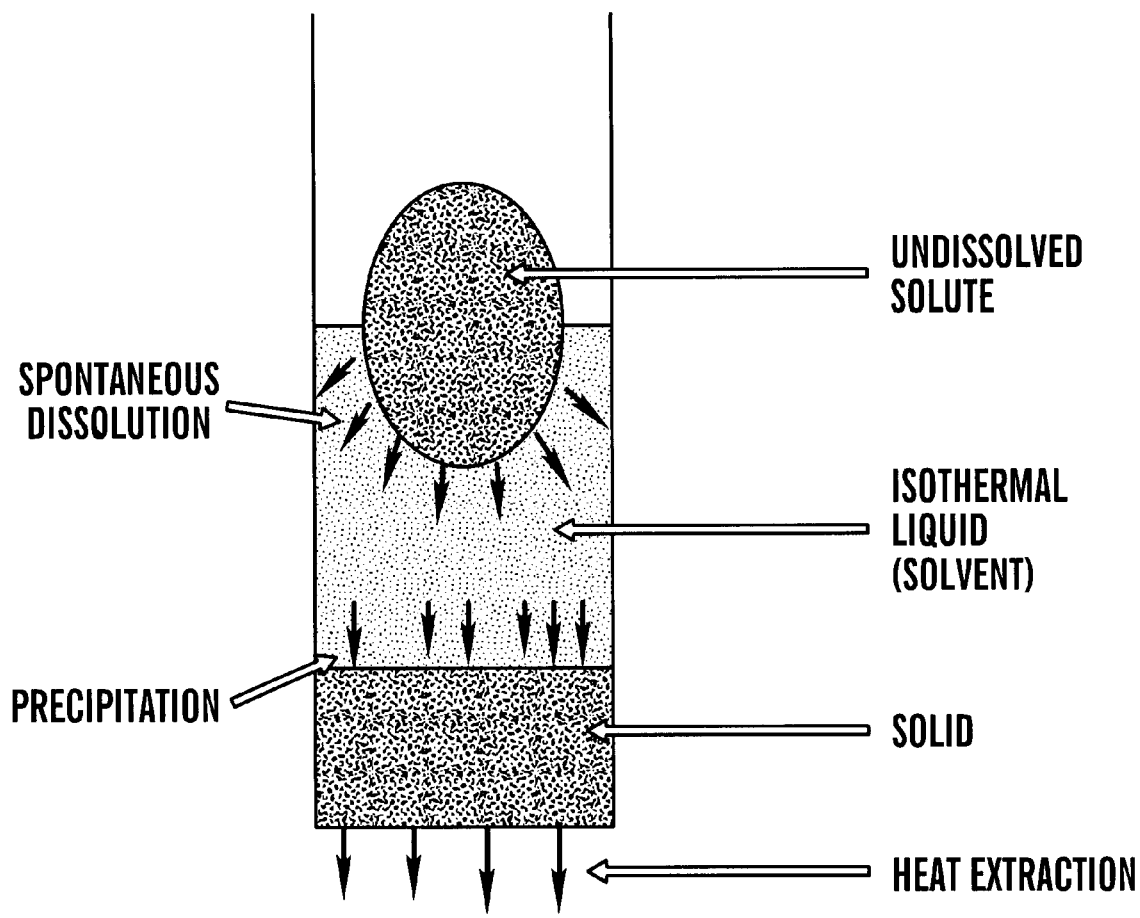
FIG. 12 is a schematic diagram illustrating a method of the present invention.
Figure 13:
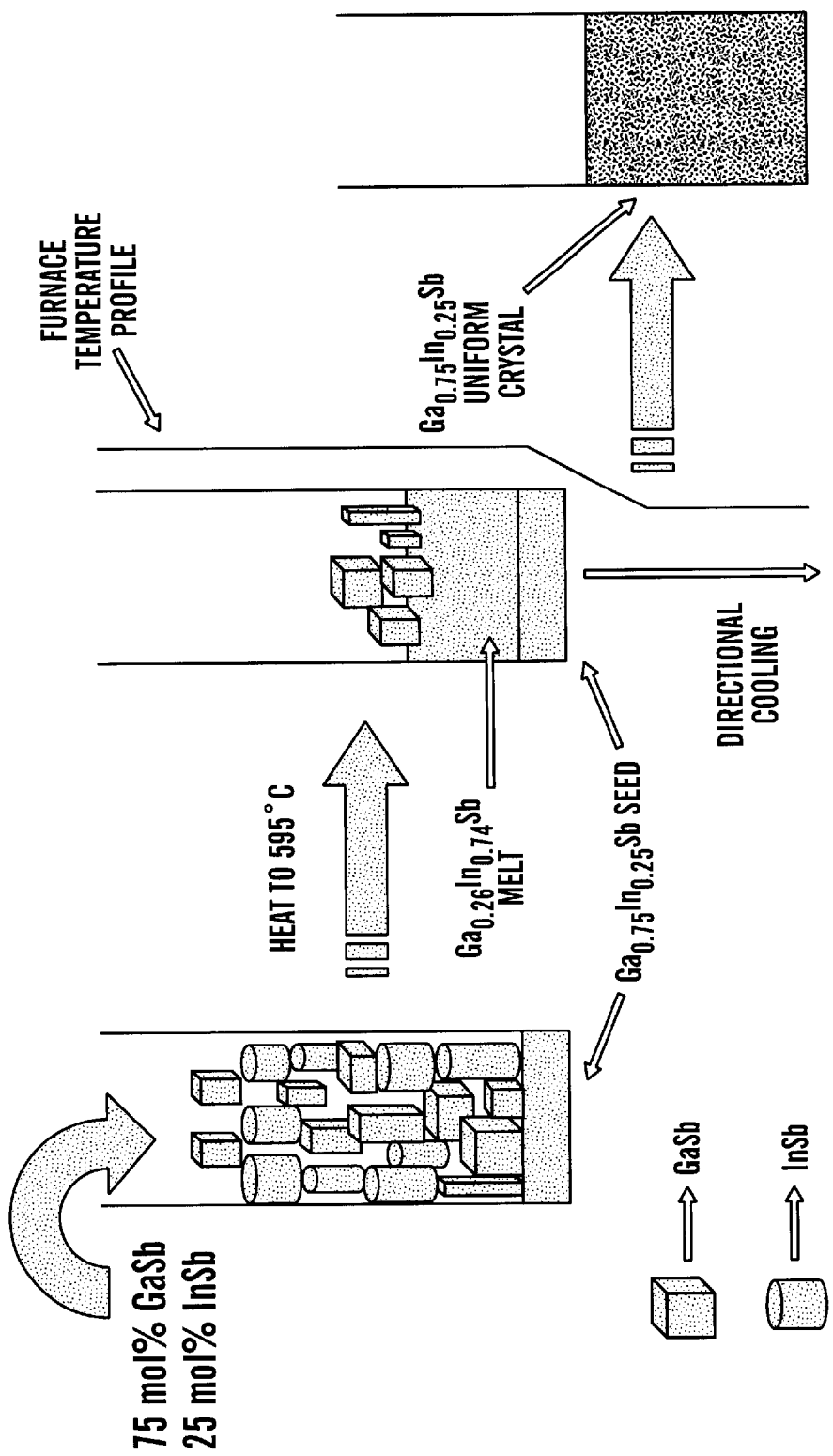
FIG. 13 is a flow diagram illustrating a method of the present invention for a Ga—In—Sb system.

The self solute feeding method is illustrated in the schematic diagram shown in FIG. 12. The process flow for growing homogeneous $Ga_{0.75}In_{0.25}Sb$ is shown in FIG. 13. The growth experiment is started with the mole fraction of GaSb and InSb exactly as desired in the final crystal. The temperature of the furnace is heated to the solidus temperature for the desired composition, and then the crucible is directionally cooled to grow the crystal. The melt composition is always the liquidus composition, and care should be taken to keep the melt isothermal. In this process, the entire charge is not molten to start with. Only a fraction of the charge is in liquid phase, depending on the temperature. As growth proceeds, the liquid becomes depleted in the one of the binary components, which is then replenished from the undissolved solute. In the case of GaInSb growth, the solvent is Ga—In—Sb pseudo-binary liquid and the undissolved solute is GaSb.

Figure 14:
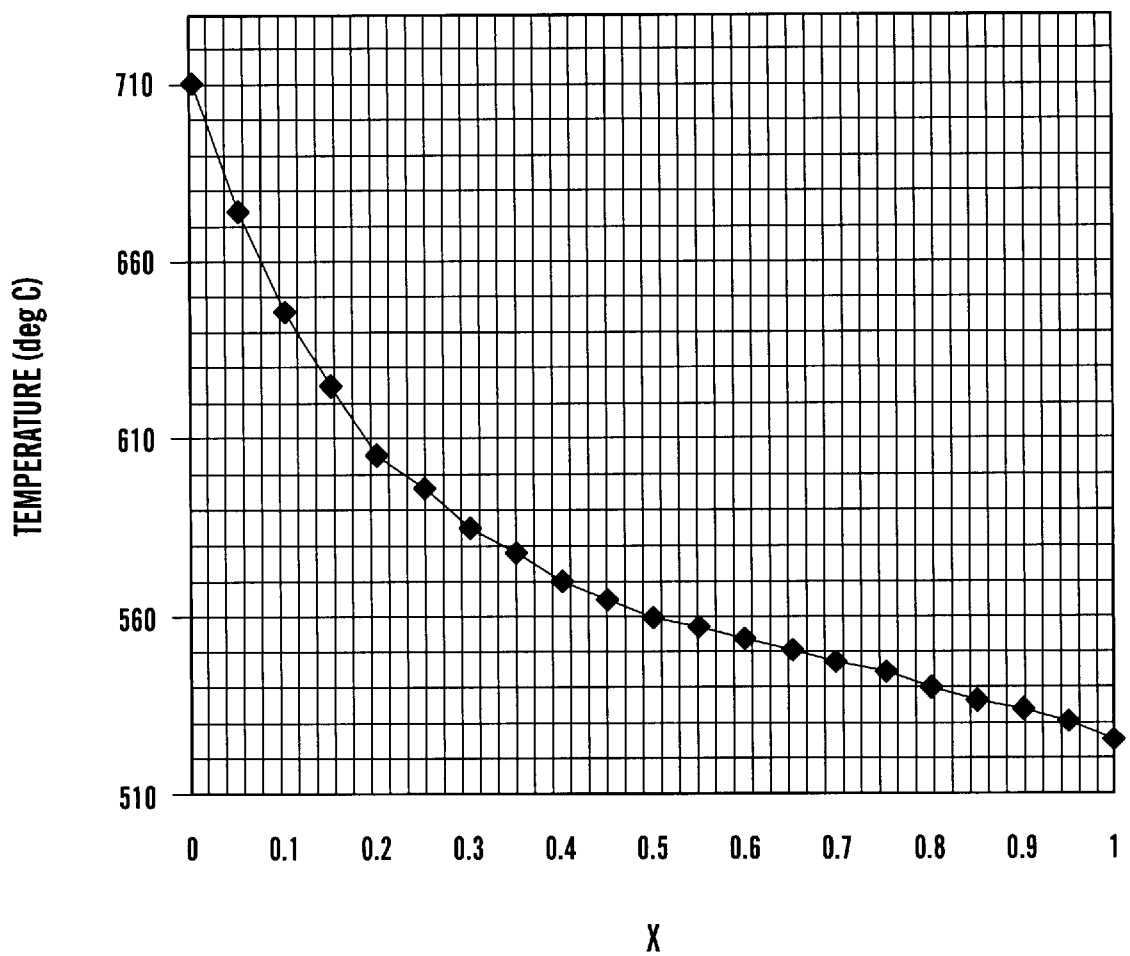
FIG. 14 is a graph showing growth temperature for a Ga—In—Sb system as a function of alloy composition.
Figure 15A:
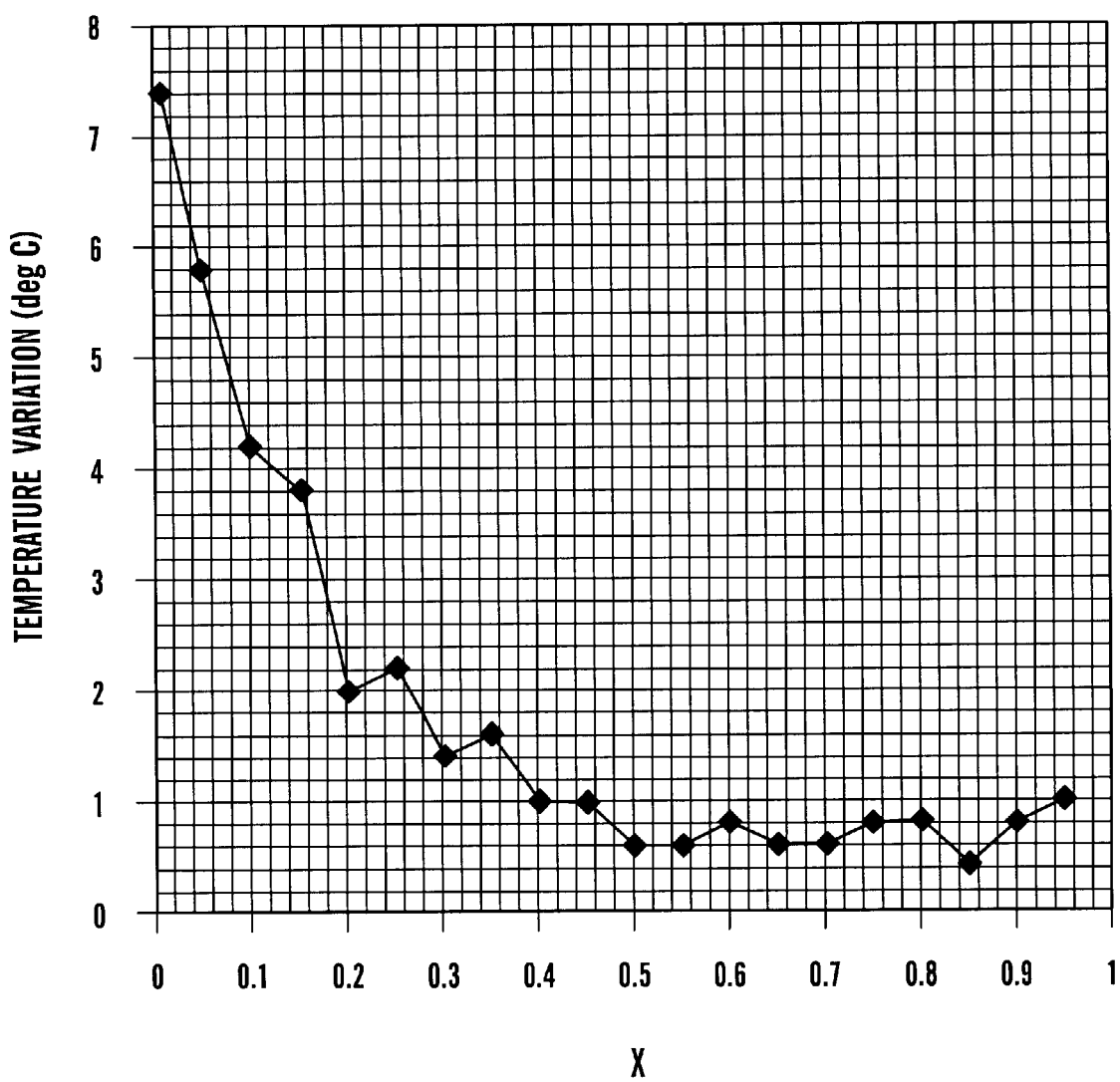
FIGS. 15A and 15B are graphs which show the preferred maximum temperature variation as a function of alloy composition during the growth of Ga—In—Sb and Ga—In—As, respectively, in a method of the present invention.
Figure 15B:
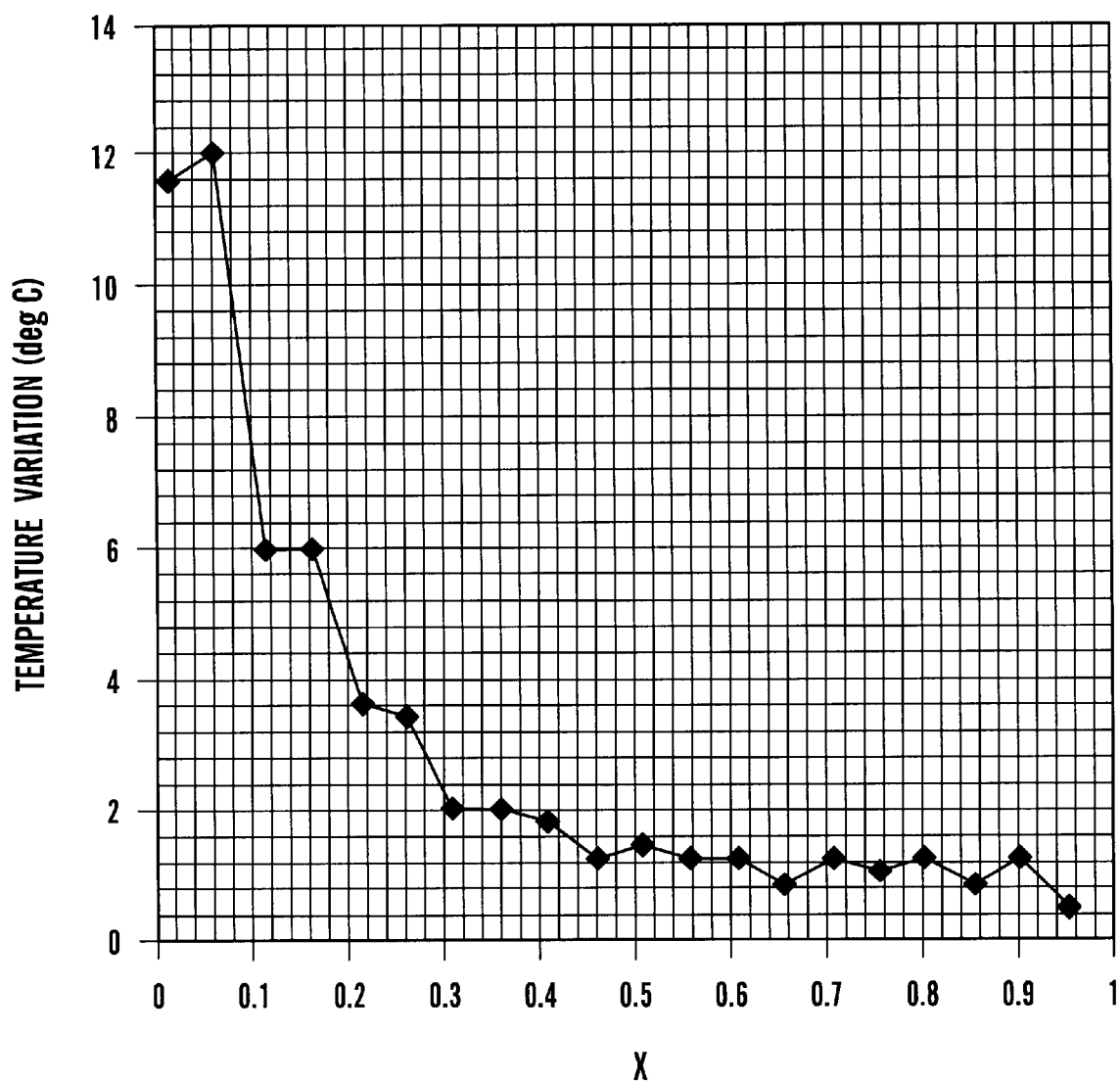

FIG. 14 shows the growth temperature for Ga—In—Sb as a function of alloy composition. The solid line is basically the solidus curve for the pseudo-binary system. Unlike in conventional melt growth, there is no need to monitor the liquid composition in the self solute feeding technique during growth. The only parameter which needs to be controlled is the growth temperature. The melt should be isothermal, since the dissolution rate and, hence, the solidifying crystal depend strongly on the temperature. FIGS. 15A and 15B, respectively, show the preferred maximum temperature variation as a function of alloy composition during the growth of Ga—In—Sb and Ga—In—As. For most of the composition range, the temperature should be controlled within 1–2° C. If the temperature fluctuation exceeds the preferred range, the crystal composition will vary. For device application on lattice matched substrates, the composition of the wafer should be controlled within 0.5 mol %. Accordingly, the temperature controllability should be within 2° C.

Since the self solute feeding technique requires a near isothermal melt, the driving force for solute transport (and growth) is primarily diffusion controlled. This can drastically reduce the growth rate of the alloys. Growth rates in the diffusion controlled regime is typically of the order of 0.1 mm/hr. To enhance the growth rate, four different growth configurations were developed. These are illustrated in FIGS. 16A, 16B, 16C, and 16D with the Ga—In—Sb system.

In the bottom seeding configuration (FIG. 16A), the driving force for solute transport is diffusion alone (for isothermal melts). A small temperature gradient of the order of 2–5° C./cm will generate a weak convection and thus enhance the growth rate. However, even with the enhanced solute transport rate, experiments have shown that the growth rate for inclusion free single crystals is around 1 mm/hr as seen (with a thermal gradient of about 5° C./cm). Crystals grown with rates below 1 mm/hr were single crystals with no inclusions, whereas those grown with rates above 1 mm/hr had some inclusions.

Figure 16B:
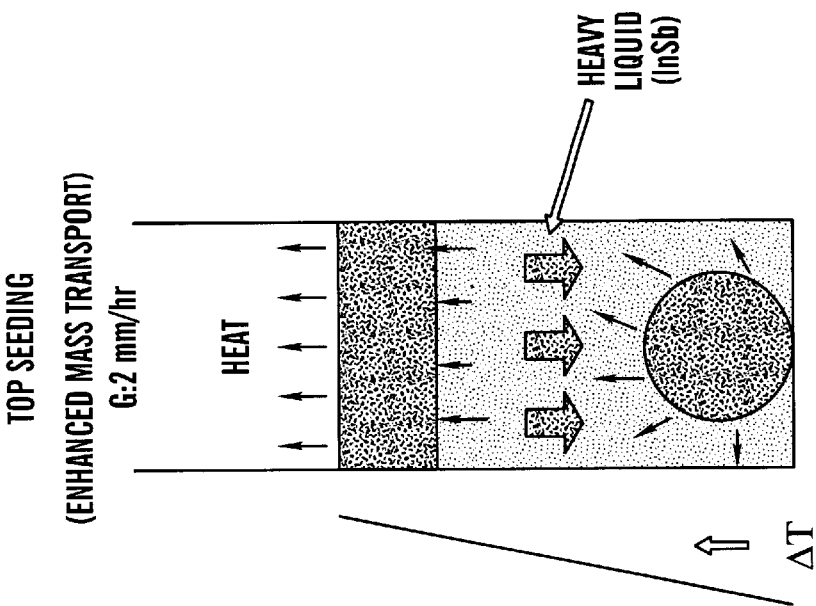
FIGS. 16A–16D are schematic diagrams illustrating four different experimental configurations for enhancing growth rates in a method according to the present invention.
Figure 16A:
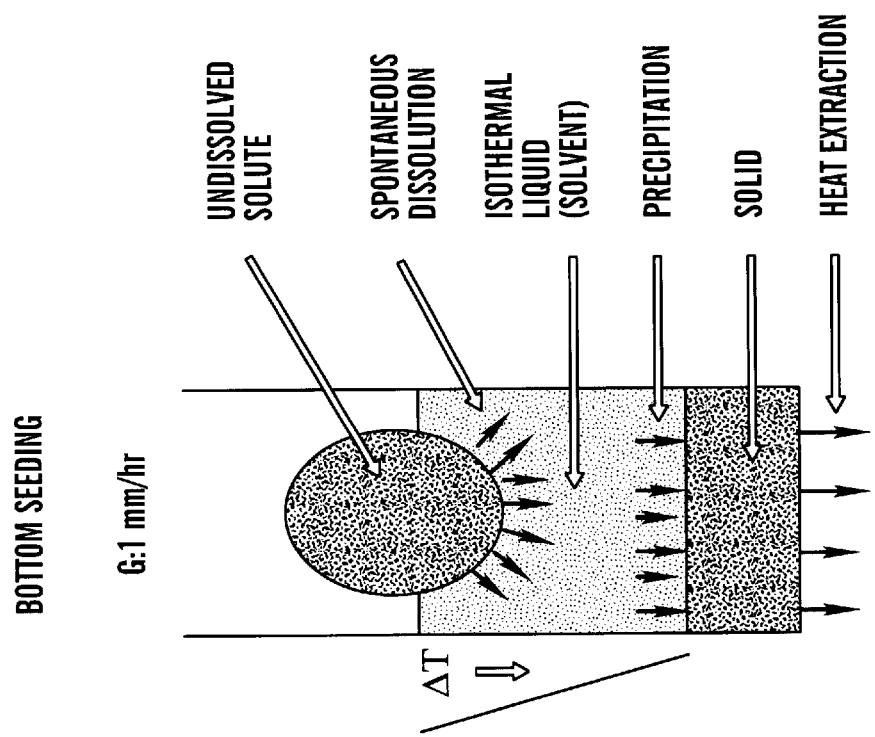
Figure 16D:
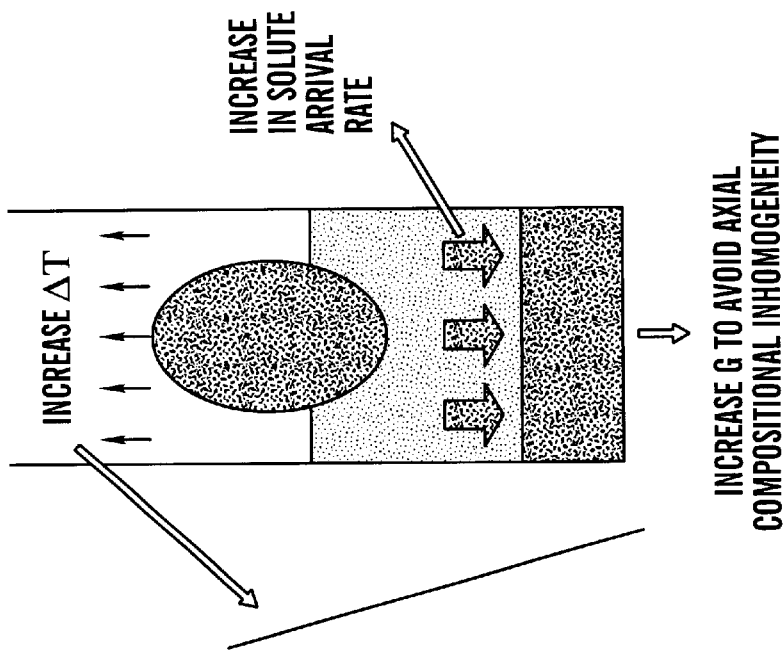

To increase the solute transport, the top seeding approach was then developed. As illustrated in FIG. 16B, the solute (GaSb) is placed at the bottom of the crucible, which enhances the solute transport due to density difference of GaSb and InSb. During the growth of GaInSb, InSb is rejected at the solid-liquid interface (which is denser compared to rest of the GaInSb melt) and hence settles to the bottom of the crucible and helps in enhancing dissolution of the GaSb solute. Moreover, the solute, being less dense, rises to the growth interface rapidly increasing the growth rate. Growth rates up to 2 mm/hr for inclusion free crystals with a thermal gradient of 5° C./cm could be grown with the top seeding approach.

Figure 16C:
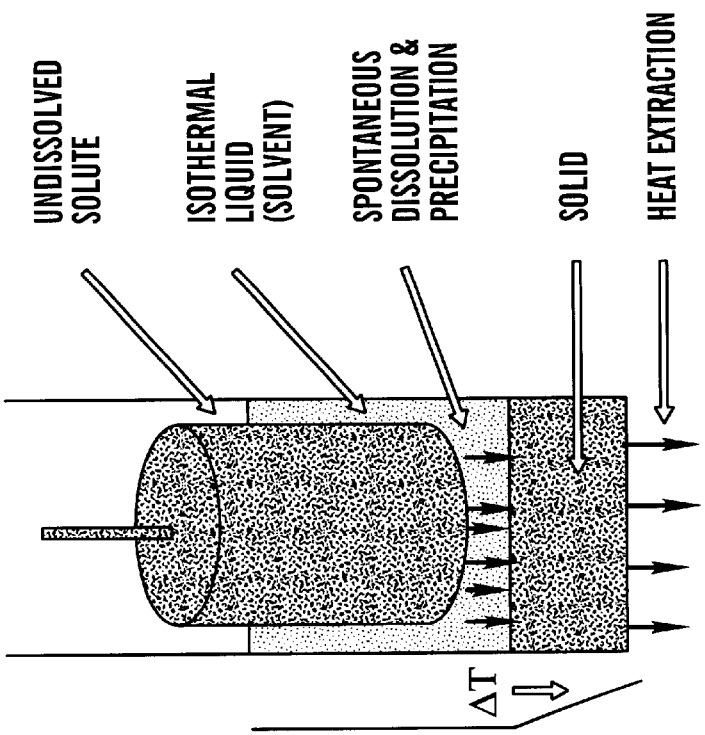
Figure 17C:
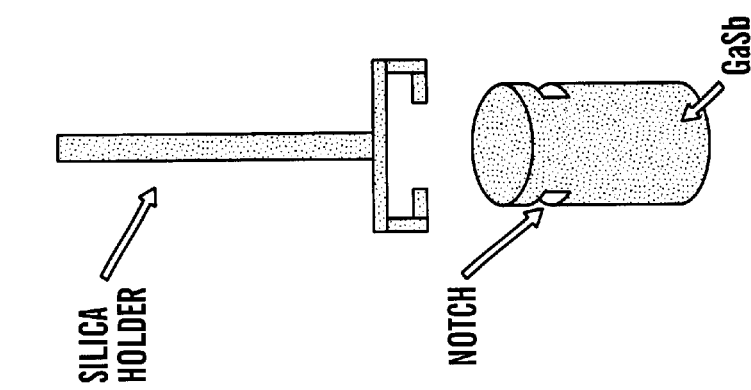
FIGS. 17A–17C are schematic diagrams illustrating three different solute holders that can be used in the practice of a method according to the present invention.
Figure 17B:
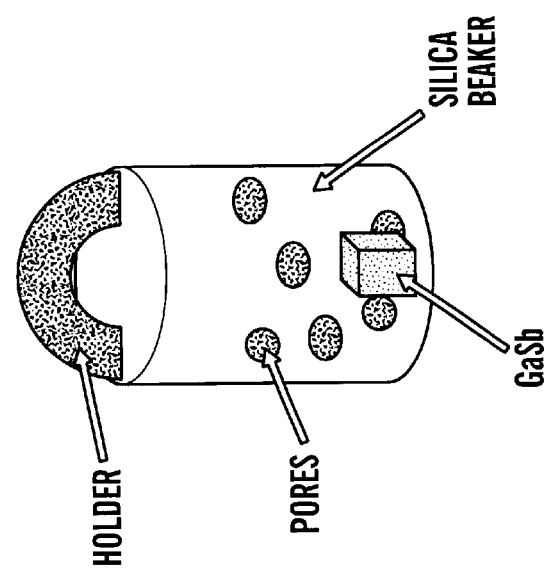
Figure 17A:
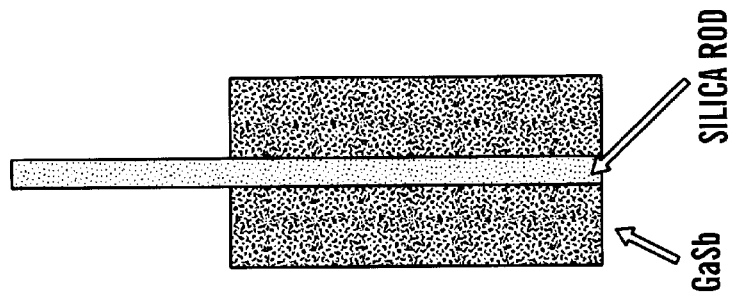

The third approach, illustrated in FIG. 16C, used to increase growth rate involved decreasing the distance between the solute and the growth interface. This reduces the diffusion distance of the solute and, therefore, the growth rates can be increased. With this configuration, growth rates up to 2.5 mm/hr for inclusion free crystal were achieved (with a 2 mm separation distance between the solute and solid-liquid interface). Various solute holder designs are shown in FIGS. 17A, 17B, and 17C. The candy stick design (shown in FIG. 17A) involves freezing a polycrystalline GaSb ingot on to a silica rod and use the rod/GaSb ingot for the GaInSb growth experiment. The rod is positioned such that the GaSb ingot is held within 2 mm from the growth interface. The porous silica basket (illustrated in FIG. 17B) was used by placing a GaSb ingot therein and hanging the basket in the GaInSb melt. The bent clip configuration (illustrated in FIG. 17C) was used by grooving a polycrystalline GaSb ingot and holding the ingot from the top using a silica holder. Of these designs, the porous basket is the most convenient one to use.

The fourth approach (illustrated in FIG. 16D) for increasing growth rate involved increasing the thermal gradient to increase the dissolution rate while simultaneously withdrawing the crucible at the rate at which the solute arrives the solid-liquid interface. With a temperature gradient of 30° C./cm, growth rate of 1.5 mm/hr for inclusion free crystals could be attained.

Example 8

Doping and the Self Solute Feeding Method

Figure 18:
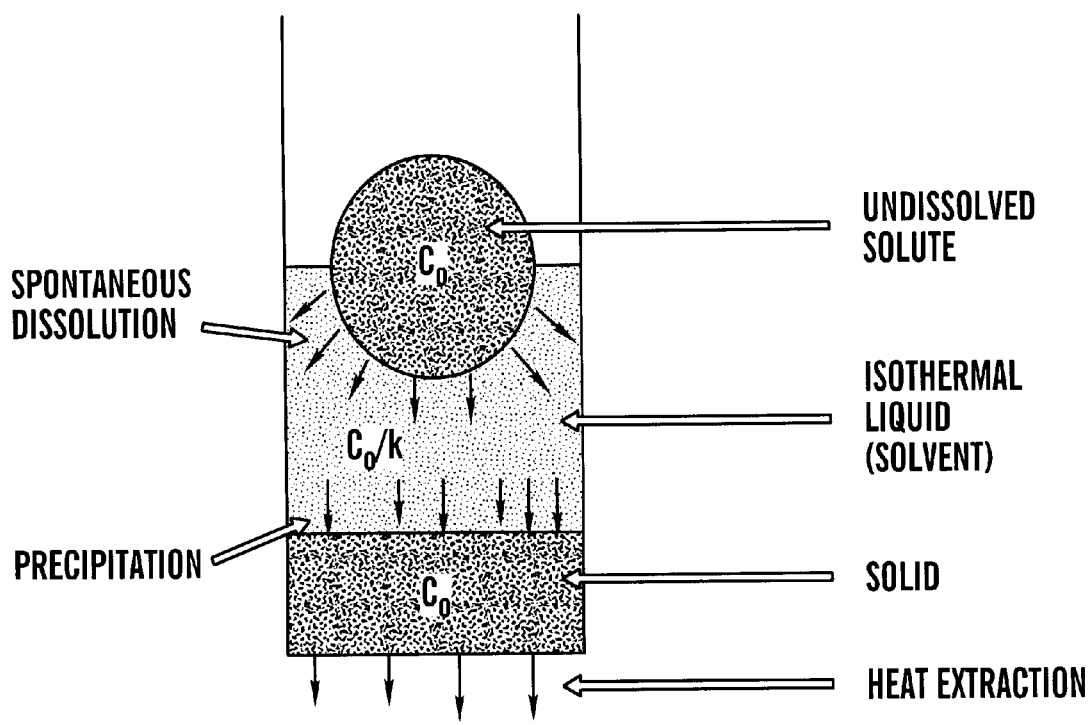
FIG. 18 is a schematic diagram illustrating the use of a method of the present invention for uniform doping of mixed alloys.

The self solute feeding technique can also be used to control doping during the alloy growth by appropriately choosing the doping level of the solute (GaSb) and the solvent (InSb). In preliminary experiments, an anomalous tellurium distribution along the axial direction of the boules was observed. This is believed to be due to the fact that the boules in these experiments were grown along <111>B. Along <111>B, the segregation coefficient of Te in InSb is greater than unity, whereas in GaSb it is less close to 0.3. To solve this problem, the solute was doped to the same doping level as required in the GaInSb crystal and the InSb slightly higher than $C_o/k$, where k is the segregation coefficient of Te in GaInSb and $C_0$ is the level of doping necessary in the crystal. By using this approach, uniformly doped GaInSb: Te crystals were produced. FIG. 18 shows is a schematic diagram showing the use of the solute feeding method for uniform doping of GaInSb.

Example 9

Quaternary Alloys Using the Self Solute Feeding Method

Figure 19:
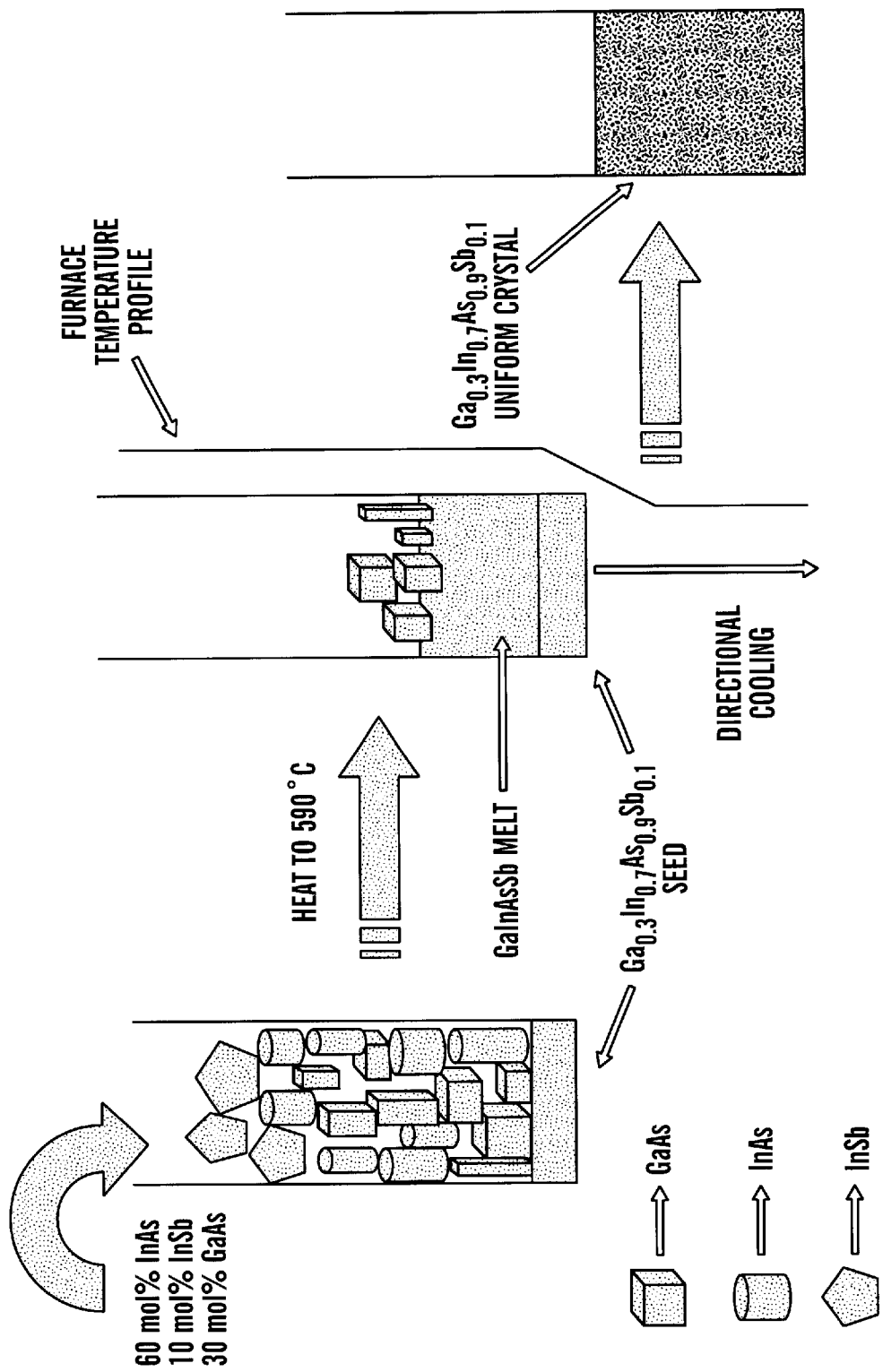
FIG. 19 is a flow diagram illustrating a method of the present invention for a Ga—In—As—Sb system.

The self solute feeding technique is universal and can be used for growth of homogeneous multi-component alloy systems. It is important to note that, in spite of individual segregation coefficients of the elements and compounds in a mixed alloy melt, the crystal composition will always be uniform. The only parameter that needs to be known for any alloy system is the growth temperature, which can be obtained from the solidus temperature of the desired alloy. FIG. 19 shows the process flow for growing homogeneous $Ga_{0.3}In_{0.7}As_{0.9}Sb_{0.1}$ crystals using the self solute feeding method.

Example 10

Single Crystal Growth with Binary Seeds

Figure 20:
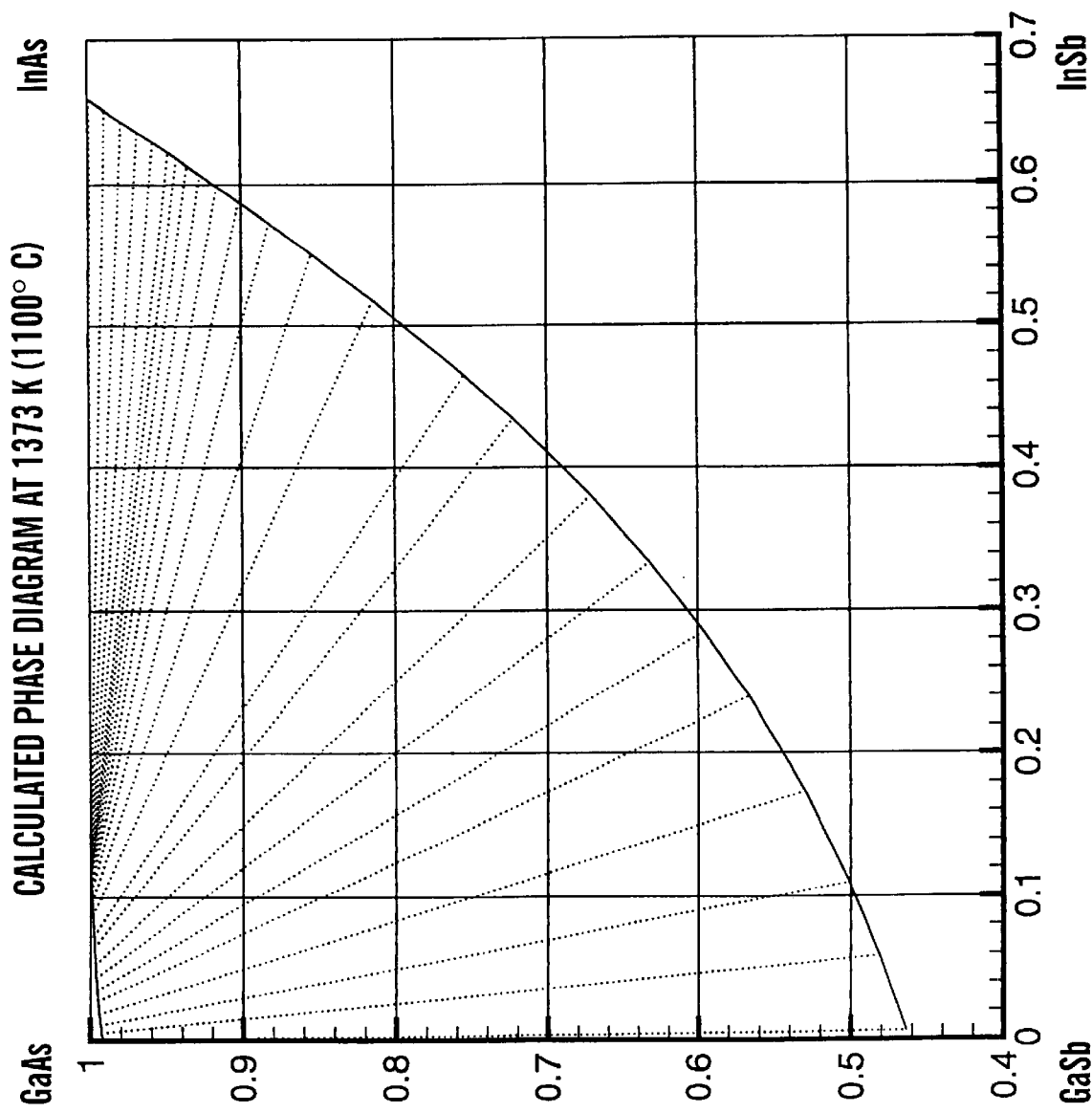
FIG. 20 is a Ga—In—As—Sb phase diagram at a temperature corresponding to the melting point of InAs showing tie lines and isotherms representing boundaries of a miscibility gap which can be used in the practice of a method of the present invention.
Figure 2P:
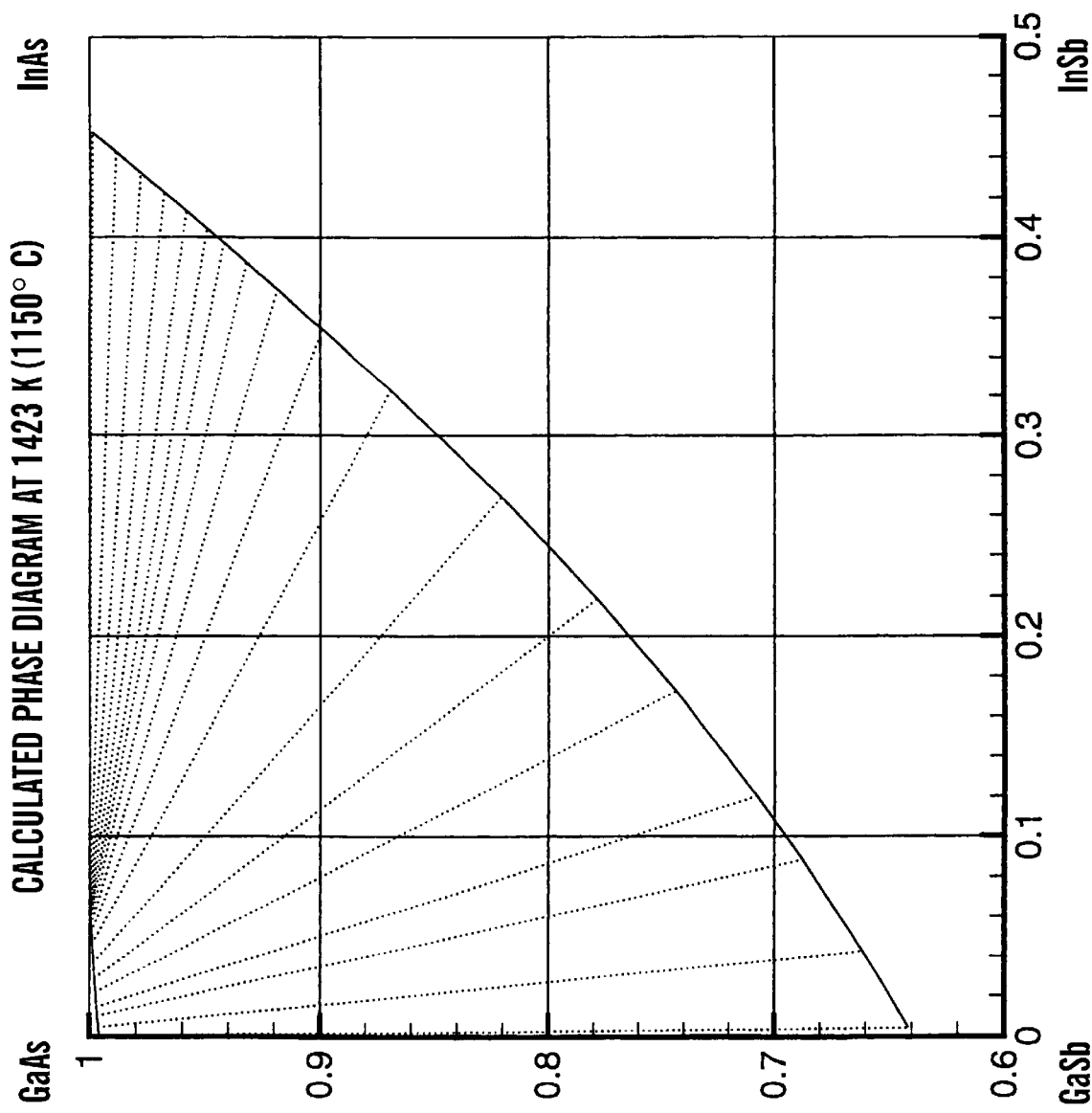
Figure 2Q:
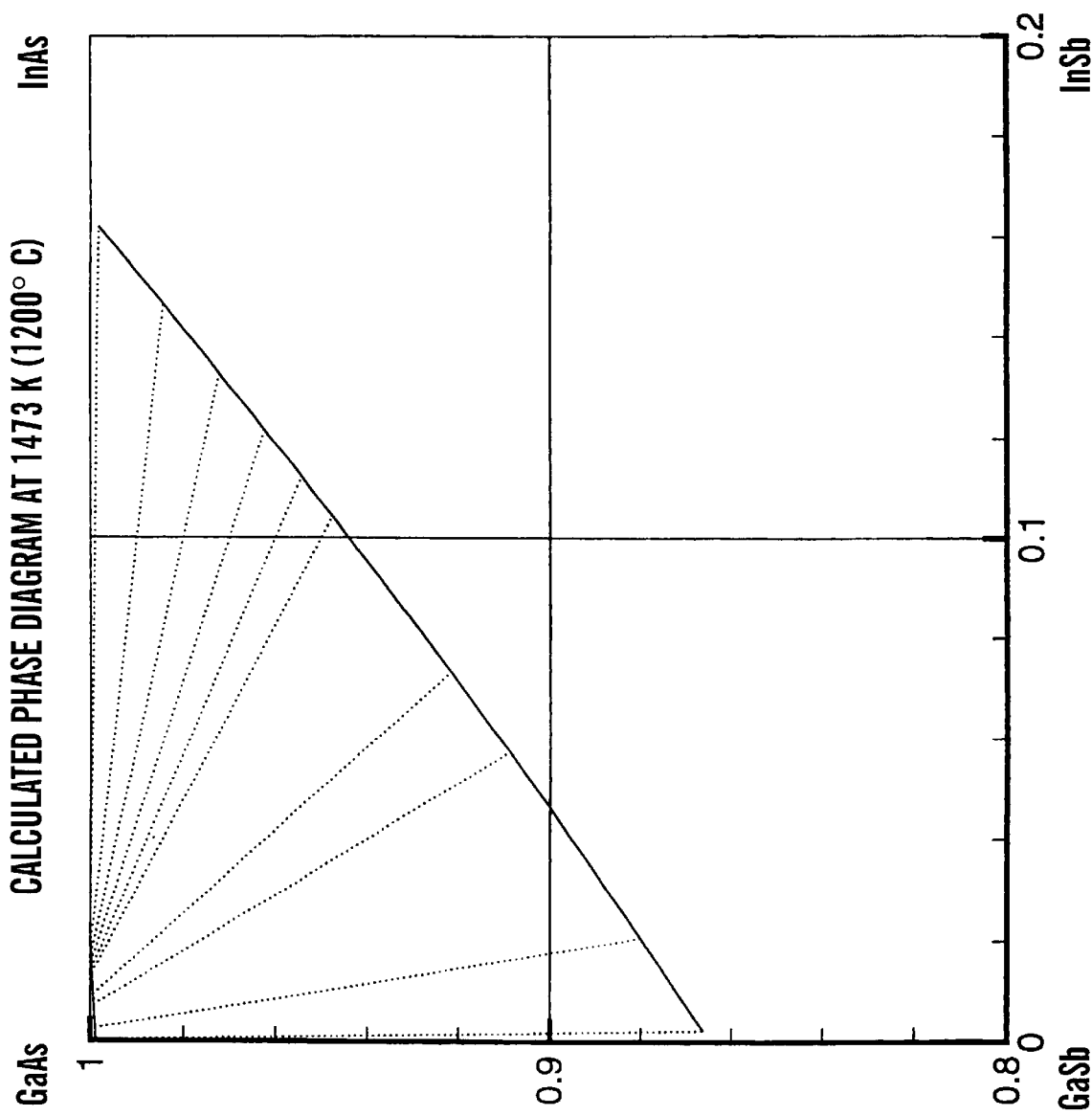

Single crystals of Ga—In—As—Sb quaternary alloys and Ga—In—As, Ga—In—Sb, Ga—As—Sb, and In—As—Sb ternary compounds can be grown employing binary seeds. To demonstrate this technique, consider the growth of GaInAs on an InAs seed. During experimentation, it is advantageous to re-melt the seed slightly (prior to growth) to relieve thermal stresses generated due to the contact of the seed with the melt. The re-melting of the seed occurs at the melting temperature of the binary seed. In the case of an InAs seed, it is 942° C. This in turn sets the growth temperature to 942° C. From the MTDATA simulation at 942° C. (shown in FIG. 20), if the melt (A1) contains 5 mol % Ga, 95 mol % In, 5 mol % Sb, and 95 mol % As, a solid of $Ga_{0.12}In_{0.88}As$ (Crystal B1) will be obtained. Similarly, a melt (A2) with 10 mol % Ga, 90 mol % In, 10 mol % Sb, and 90 mol % As at 942° C. will give a solid of $Ga_{0.22}In_{0.78}As$ (Crystal B2). The same strategy can be employed to grow quaternary and ternary materials on GaSb seed. Ternary single crystals grown in steps from the binary seeds can be used in subsequent experiments to monitor the growth (or seeding) temperature by the seed re-melt process.

Although the invention has been described in detail for the purpose of illustration, it is understood that such detail is solely for that purpose, and variations can be made therein by those skilled in the art without departing from the spirit and scope of the invention which is defined by the following claims.

What is claimed:

1. A method for preparing a homogeneous ternary or quaternary alloy from a ternary or quaternary melt, said ternary or quaternary alloy having a solidus temperature, said method comprising:

providing ternary or quaternary melt having a ternary or quaternary melt composition which comprises at least three or four melt elements, wherein the ternary or quaternary melt is in solution equilibrium with a solid binary material, said solid binary material having a melting temperature greater than that of the ternary or quaternary alloy's solidus temperature and comprising two of the at least three or four melt elements;

heating the ternary or quaternary melt to the ternary or quaternary alloy's solidus temperature;

agitating the ternary or quaternary melt mechanically under conditions effective to maintain a solution equilibrium between the solid binary material and the ternary or quaternary melt; and directionally cooling the ternary or quaternary melt to grow the ternary or quaternary alloy, whereby the ternary or quaternary melt becomes depleted in the solid binary material's two elements and whereby a portion of the solid binary material dissolves into the ternary or quaternary melt to replenish the depleted two elements.

2. A method according to claim 1, wherein the solid binary material has a density less than that of the ternary or quaternary melt.

3. A method according to claim 1, wherein the ternary or quaternary melt is in contact with a seed crystal and wherein said directional cooling is carried out in a region where the ternary or quaternary melt contacts the seed crystal.

4. A method according to claim 1, wherein the ternary or quaternary melt is a ternary melt which comprises two Group III elements and one Group V element or wherein the ternary or quaternary melt is a ternary melt which comprises two Group V elements and one Group III element.

5. A method according to claim 1, wherein the ternary or quaternary melt is a ternary melt which comprises two Group II elements and one Group VI element or wherein the ternary or quaternary melt is a ternary melt which comprises two Group VI elements and one Group II element.

6. A method according to claim 1, wherein the ternary or quaternary melt is a quaternary melt which comprises two Group III elements and two Group V elements.

7. A method according to claim 1, wherein the ternary or quaternary melt is a quaternary melt which comprises two Group II elements and two Group VI elements.

* * * * *

UNITED STATES PATENT AND TRADEMARK OFFICE
CERTIFICATE OF CORRECTION

PATENT NO.    : 6,613,162 B1
DATED         : September 2, 2003
INVENTOR(S)   : Dutta It is certified that error appears in the above-identified patent and that said Letters Patent is hereby corrected as shown below:

<u>Title page,</u>
Item [12], change "Dutta et al." to -- Dutta --; and
Item [75], Inventor, delete "Thomas R. Miller", Schenectady, NY (US)".

Signed and Sealed this

Twenty-third Day of December, 2003

JAMES E. ROGAN
*Director of the United States Patent and Trademark Office*